United States Patent
Misaki

(10) Patent No.: US 11,145,688 B2
(45) Date of Patent: Oct. 12, 2021

(54) ACTIVE MATRIX SUBSTRATE AND METHOD FOR MANUFACTURING SAME

(71) Applicant: Sharp Kabushiki Kaisha, Sakai (JP)

(72) Inventor: Katsunori Misaki, Yonago (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 87 days.

(21) Appl. No.: 16/625,920

(22) PCT Filed: Jun. 26, 2018

(86) PCT No.: PCT/JP2018/024236
§ 371 (c)(1),
(2) Date: Dec. 23, 2019

(87) PCT Pub. No.: WO2019/004226
PCT Pub. Date: Jan. 3, 2019

(65) Prior Publication Data
US 2020/0176505 A1 Jun. 4, 2020

(30) Foreign Application Priority Data
Jun. 28, 2017 (JP) .............................. JP2017-126429

(51) Int. Cl.
*H01L 27/146* (2006.01)
(52) U.S. Cl.
CPC .... *H01L 27/14658* (2013.01); *H01L 27/1462* (2013.01); *H01L 27/14632* (2013.01); *H01L 27/14634* (2013.01); *H01L 27/14636* (2013.01); *H01L 27/14687* (2013.01)

(58) Field of Classification Search
CPC ........... H01L 27/14658; H01L 27/1462; H01L 27/14632; H01L 27/14634; H01L 27/14636; H01L 27/14687; H01L 27/14612; H01L 27/14692; H01L 27/14663; H01L 29/786; G09F 9/00; G09F 9/30
See application file for complete search history.

(56) References Cited

FOREIGN PATENT DOCUMENTS

JP        2010-210713 A    9/2010

*Primary Examiner* — David A Zarneke
(74) *Attorney, Agent, or Firm* — Keating & Bennett, LLP

(57) ABSTRACT

An active matrix substrate having a pixel region includes a terminal part, a guard ring, and a connection part that connects the terminal part and the guard ring to each other. The pixel region, the terminal part, and the guard ring each include a first conductive layer in which a first metal film and second metal films that are lower in resistance than the first metal film are stacked, a first protective layer disposed to overlap at least a part of the first conductive layer, and a second protective layer disposed over the first protective layer. The pixel region includes a second conductive layer provided at a higher level than the first protective layer. The connection part includes the first metal film and the second protective layer disposed over the first metal film. Ends of the first conductive layer in the terminal part and the guard ring that face the connection part are located on the inside of ends of the first protective layer that face the connection part. The second conductive layer and the second metal films contain materials that are etchable with an identical etchant.

3 Claims, 64 Drawing Sheets

(A–A CROSS-SECTION)

(A—A CROSS-SECTION)

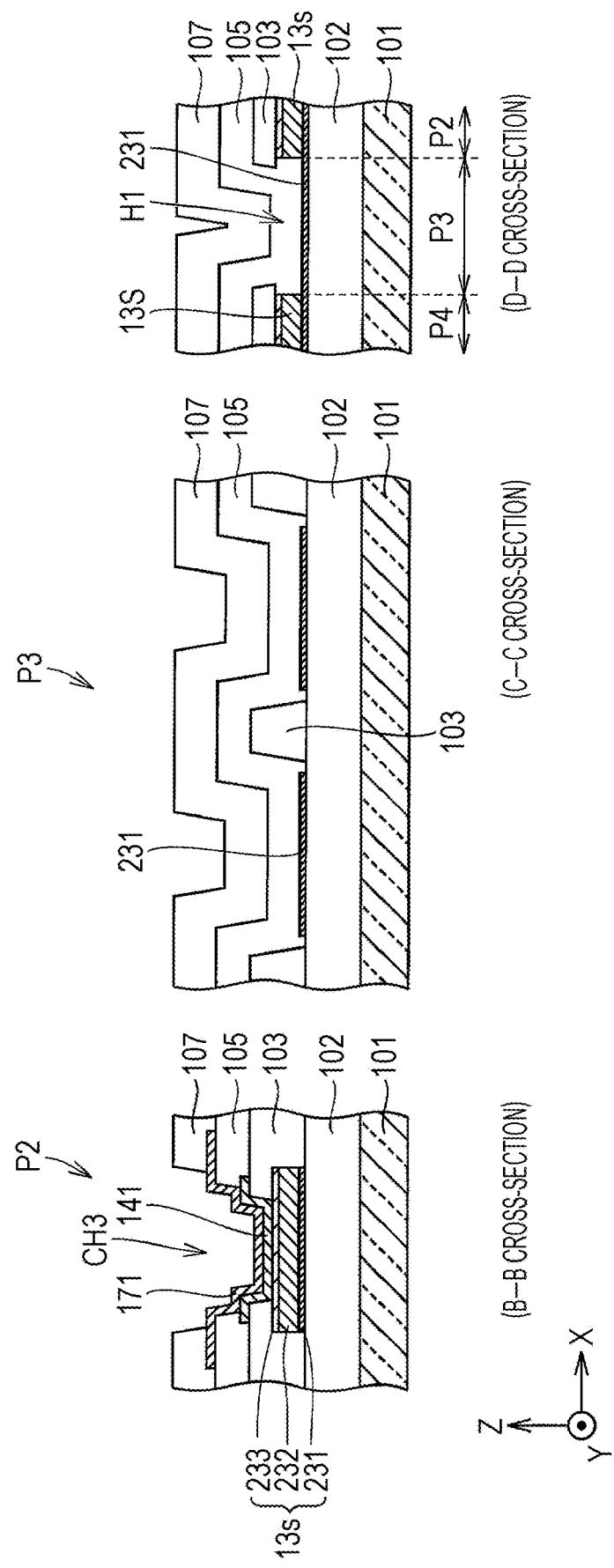

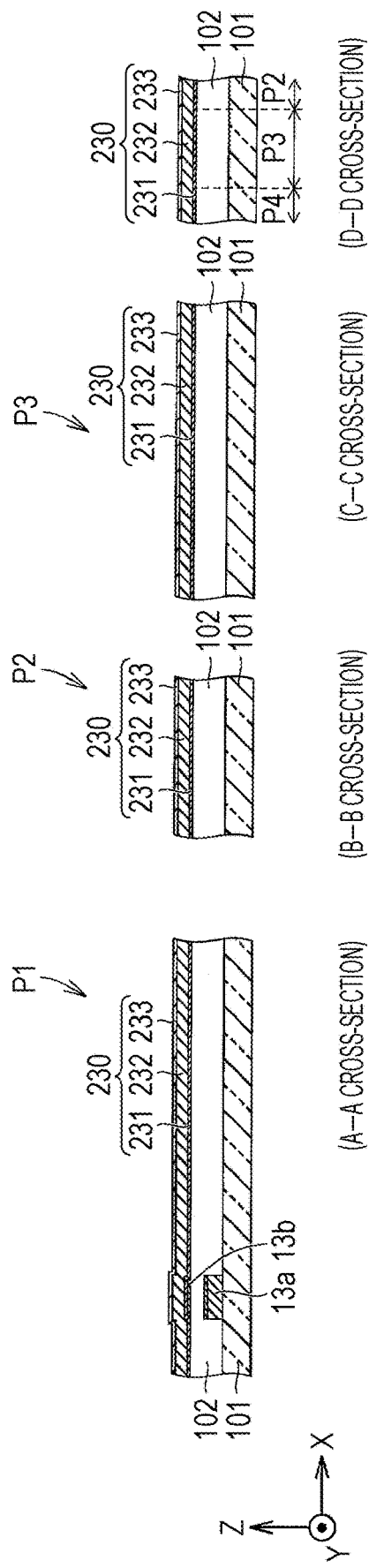

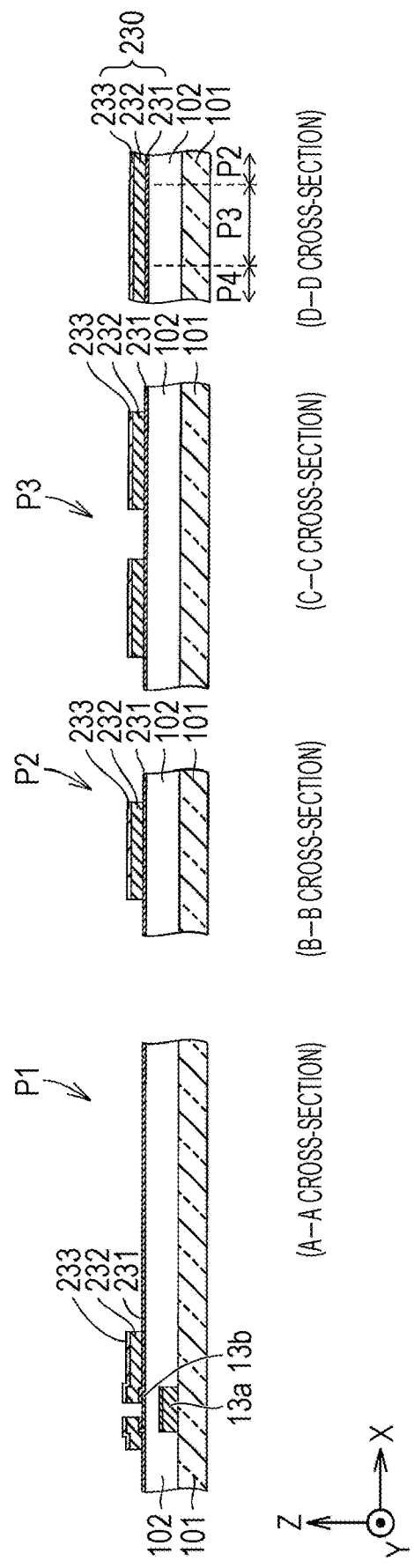

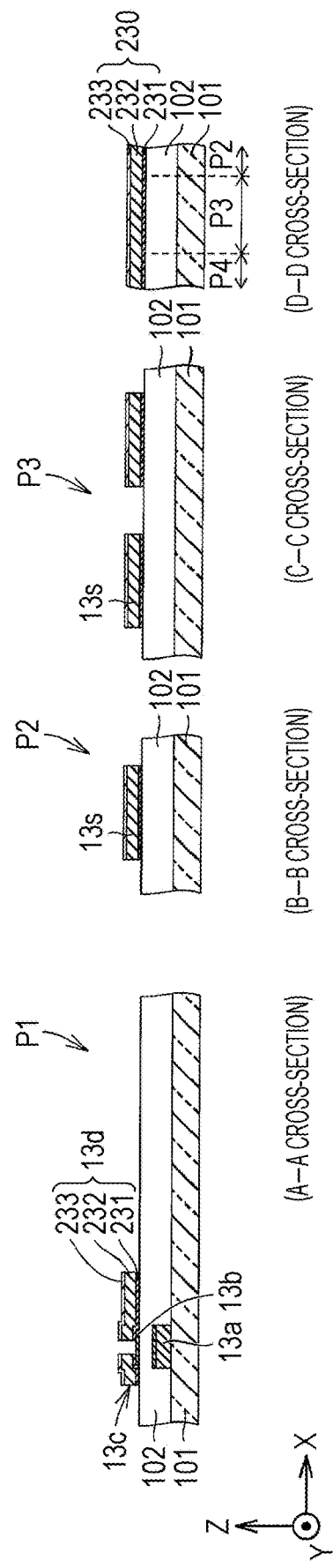

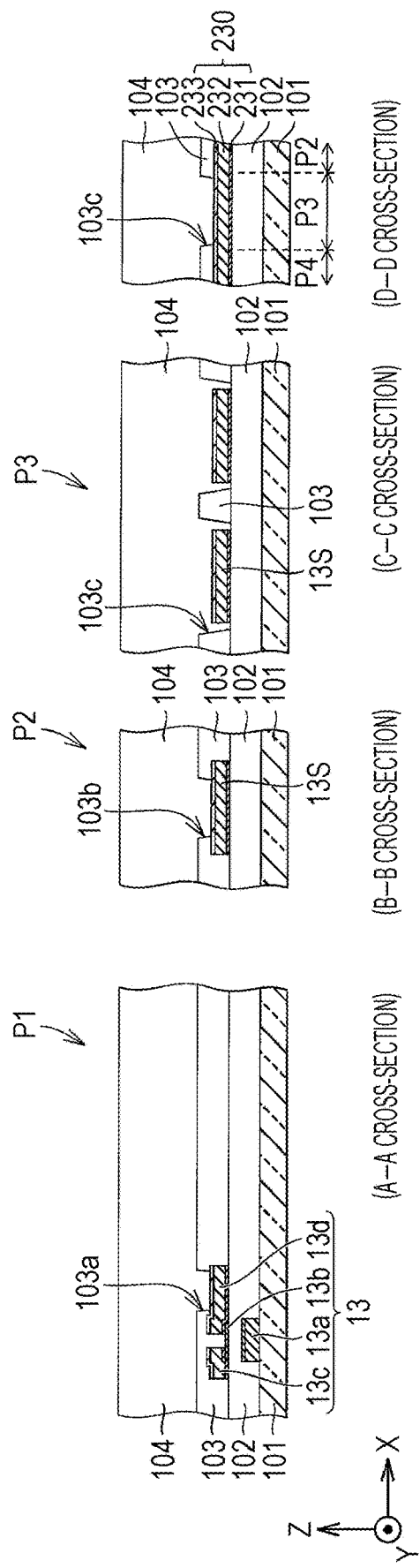

FIG. 5K
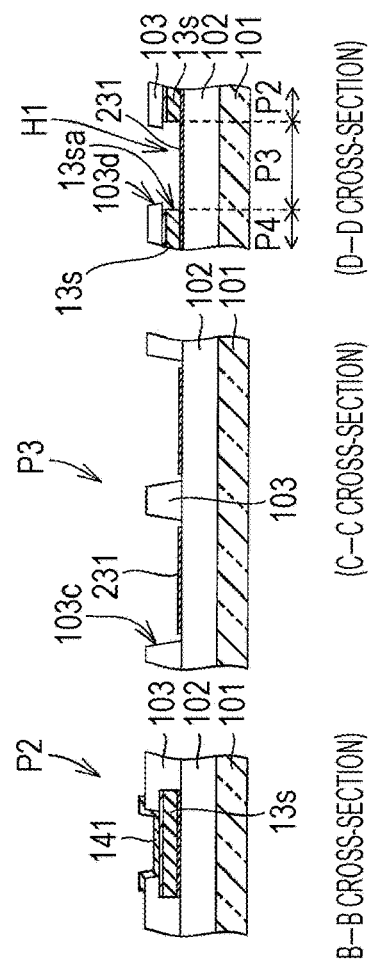
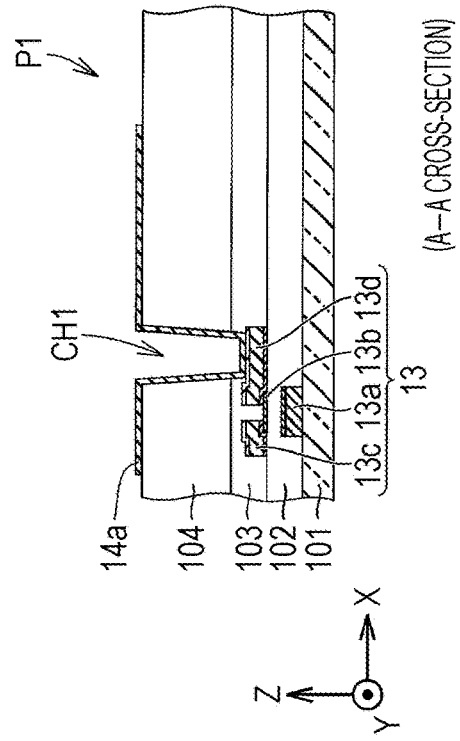

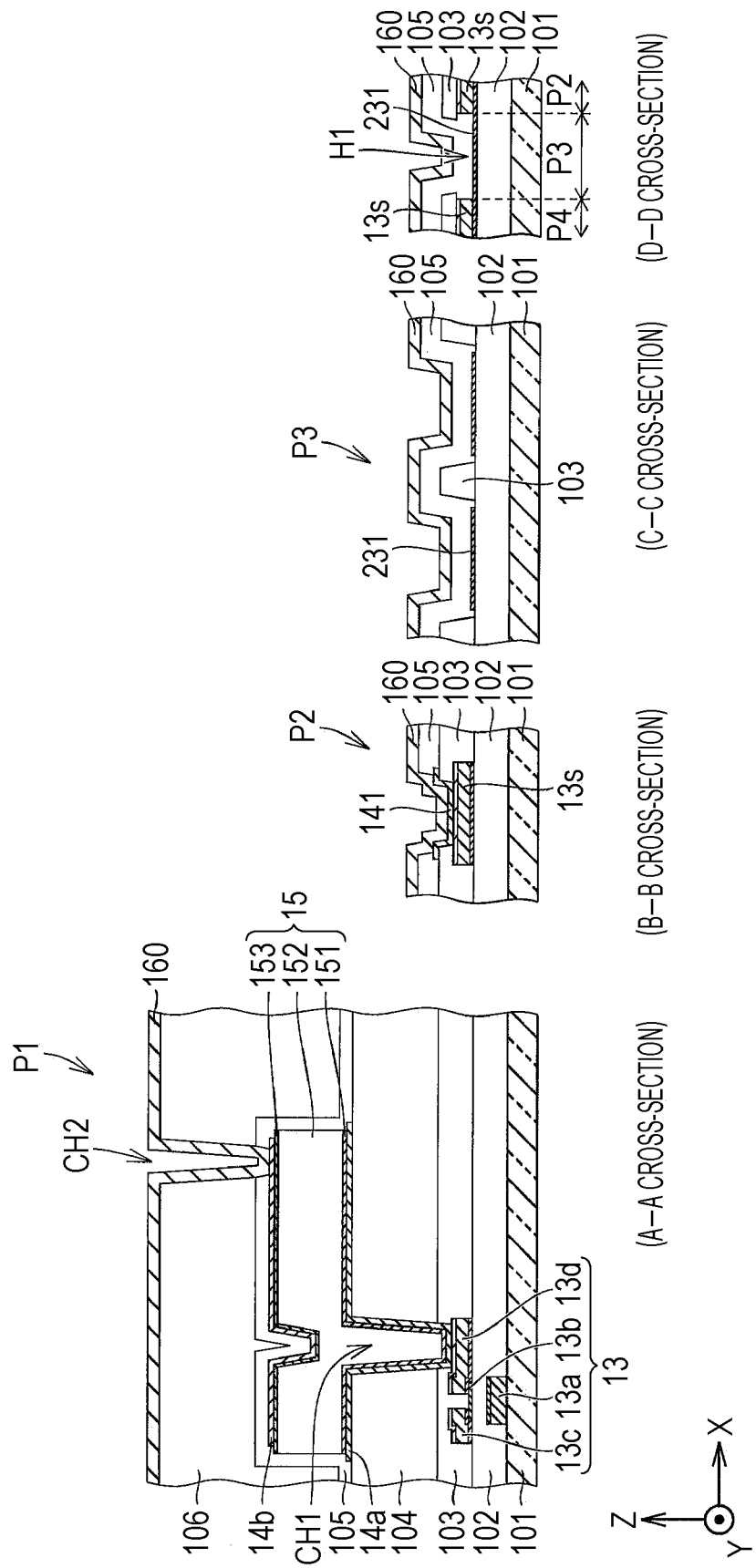

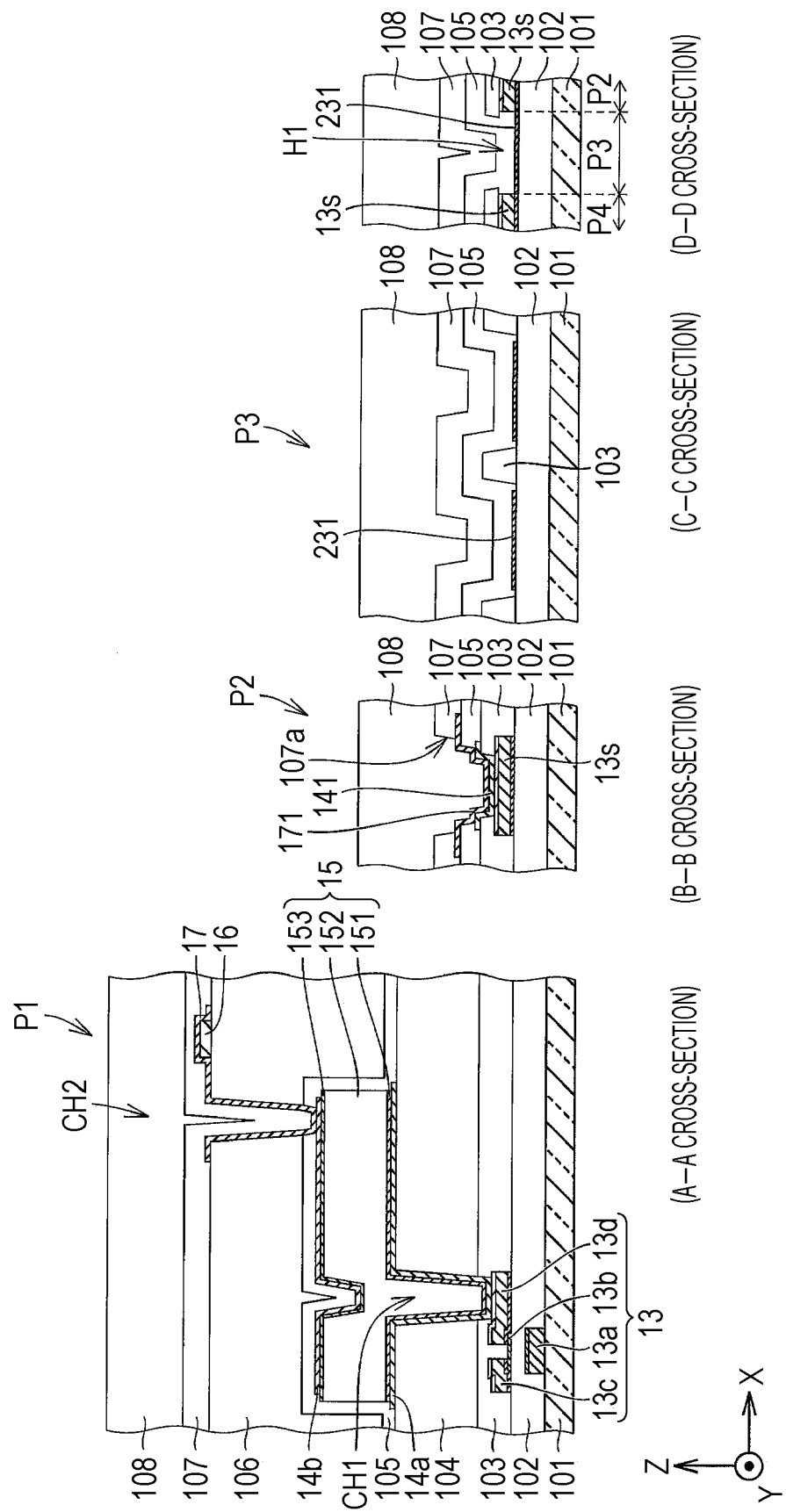

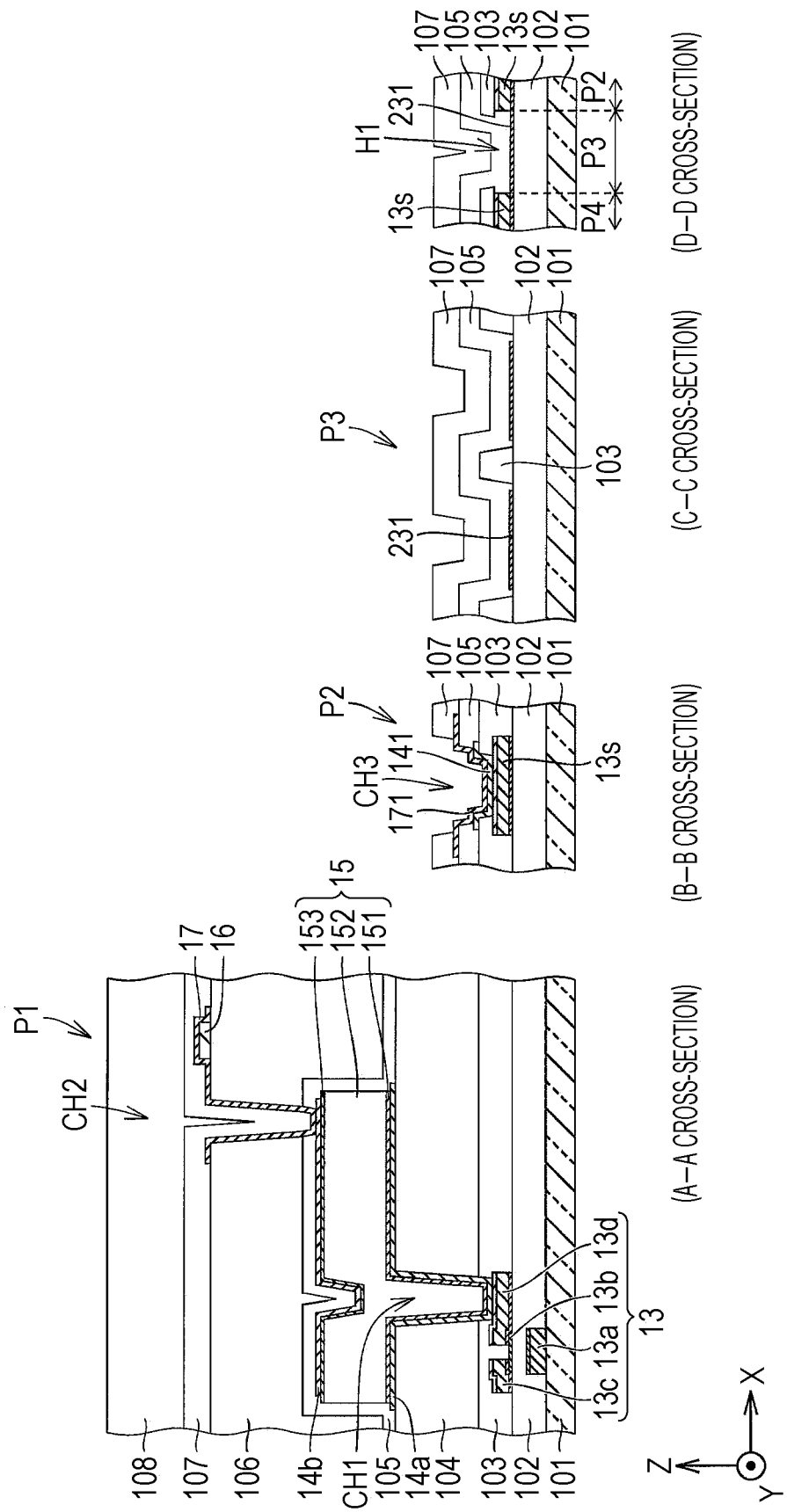

FIG. 6
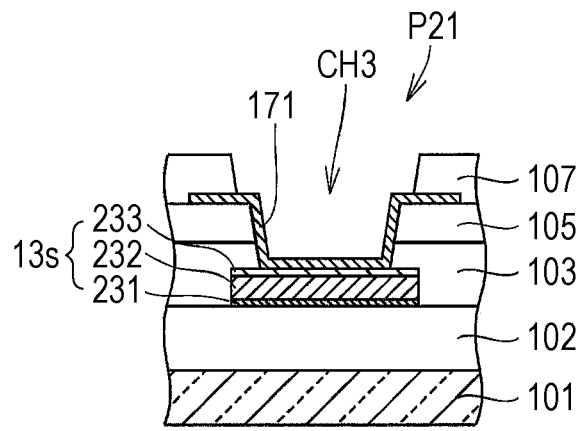
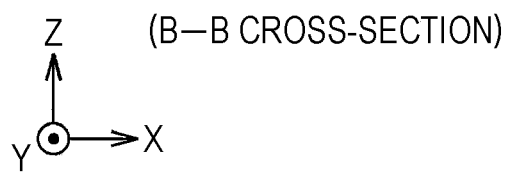
(B—B CROSS-SECTION)
FIG. 7A
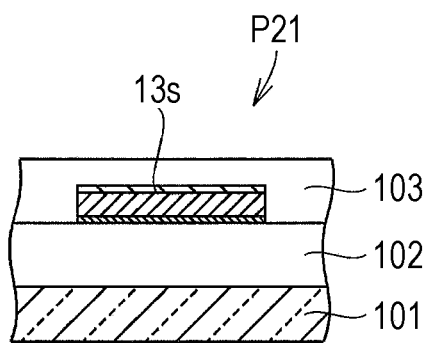
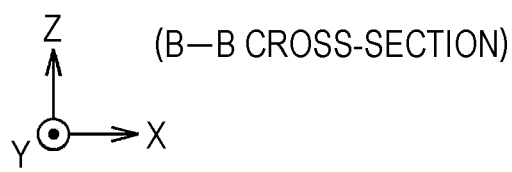
(B—B CROSS-SECTION)

FIG. 7B
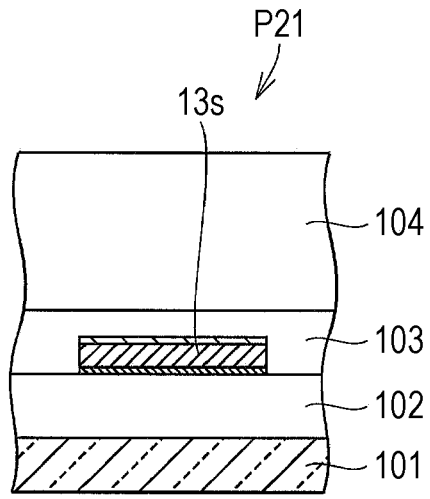
(B—B CROSS-SECTION)
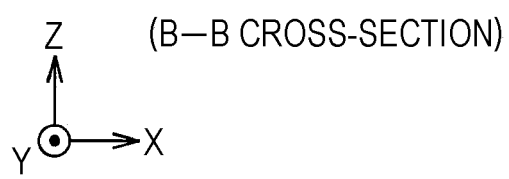
FIG. 7C
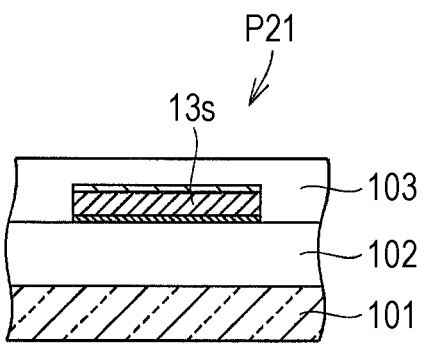
(B—B CROSS-SECTION)
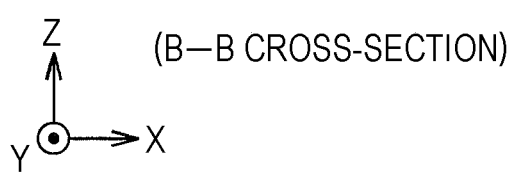

FIG. 7D
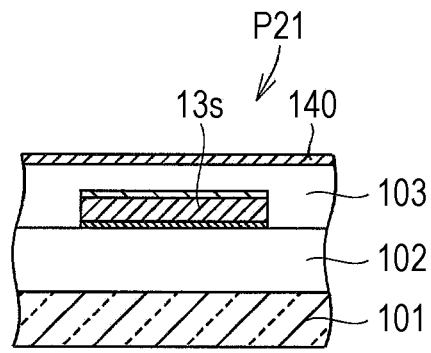
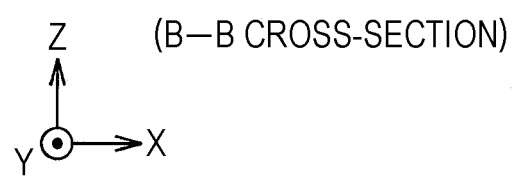
FIG. 7E
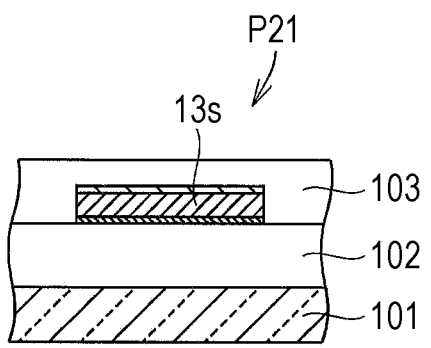
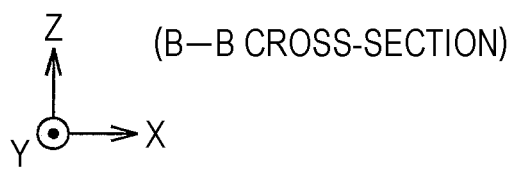

FIG. 7F
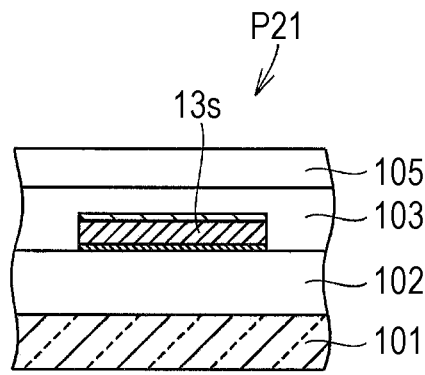
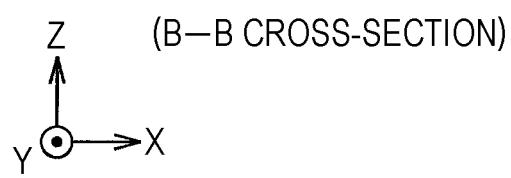
FIG. 7G
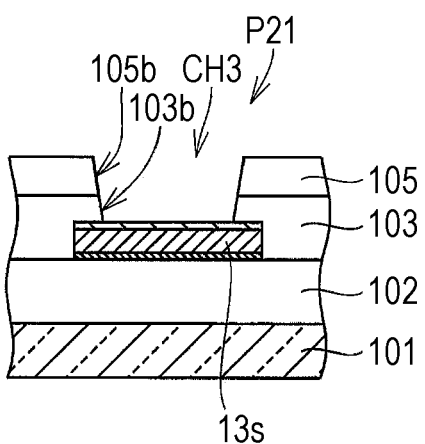
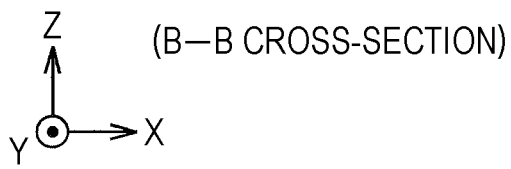

(C–C CROSS-SECTION)   (D–D CROSS-SECTION)

(C–C CROSS-SECTION)   (D–D CROSS-SECTION)

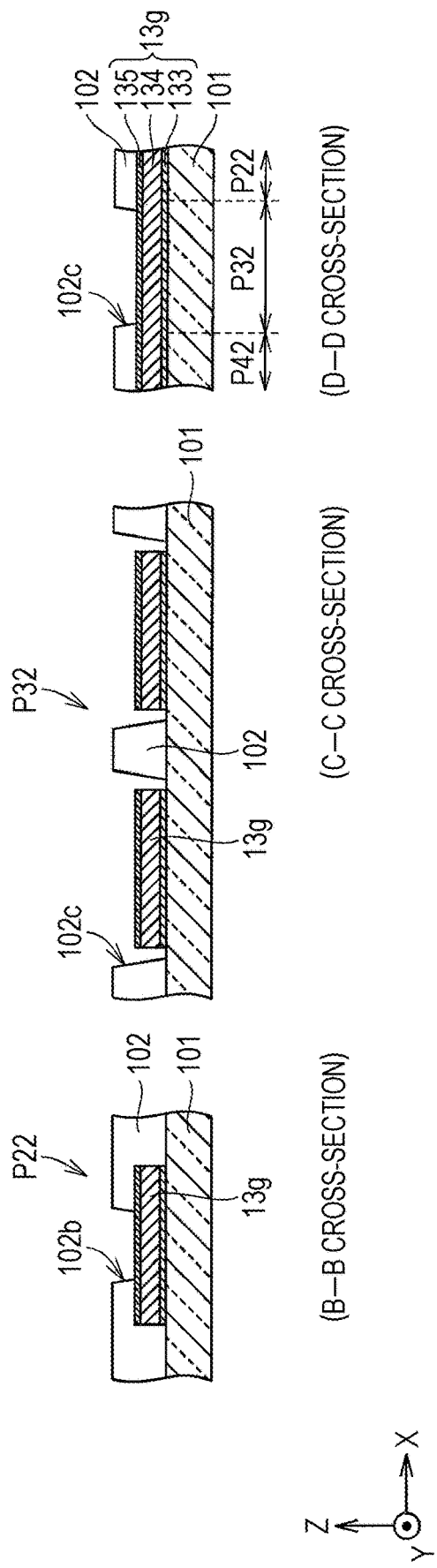

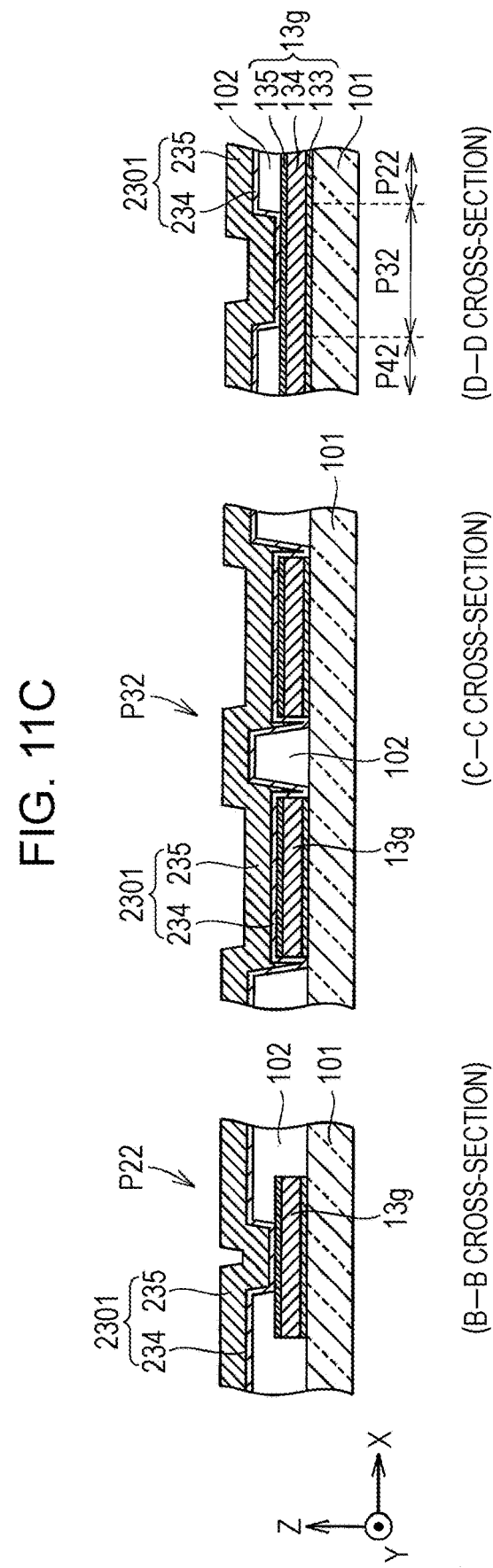

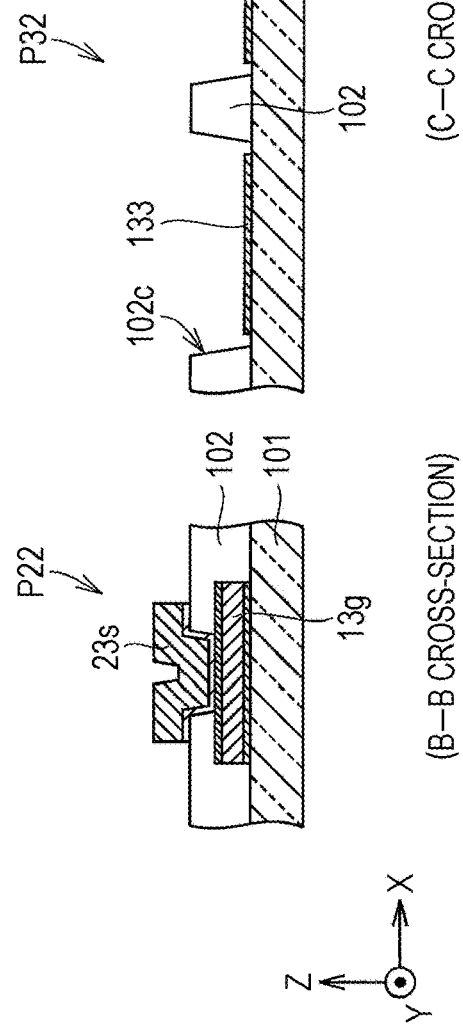
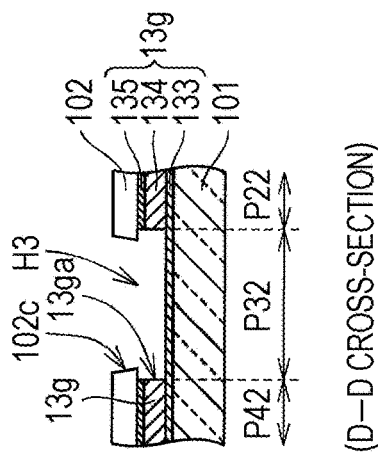
FIG. 11D

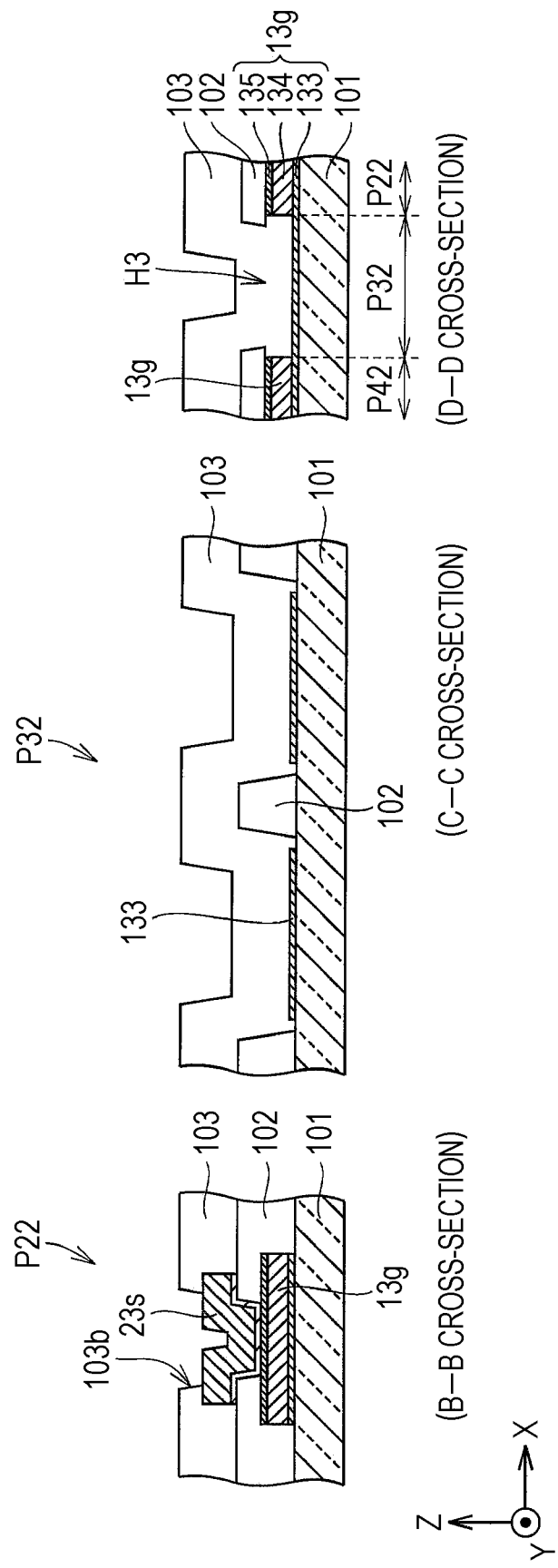

(B—B CROSS-SECTION)

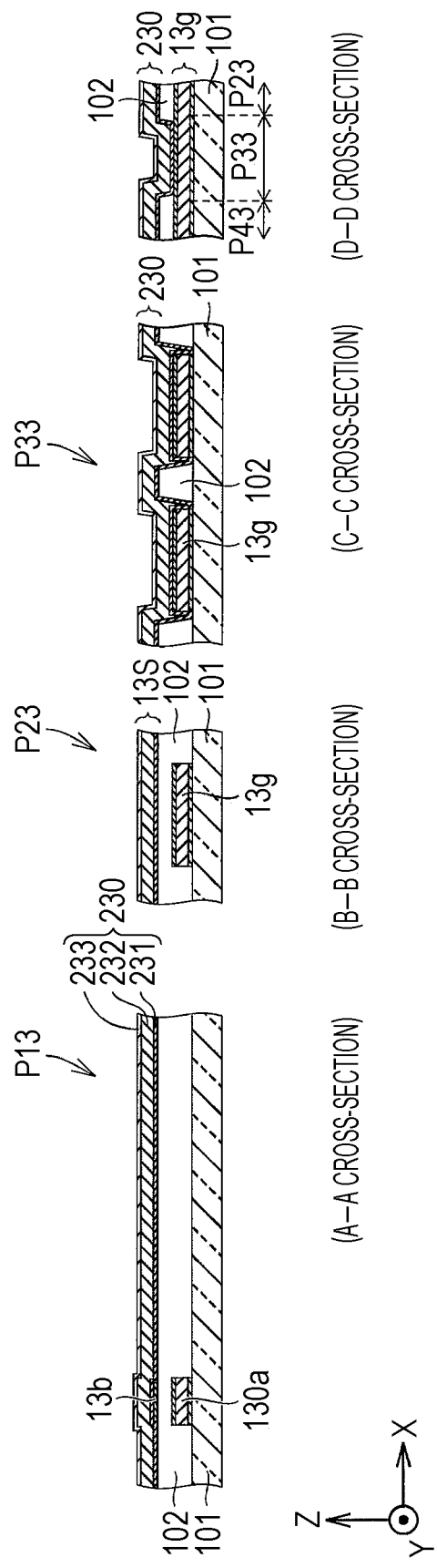

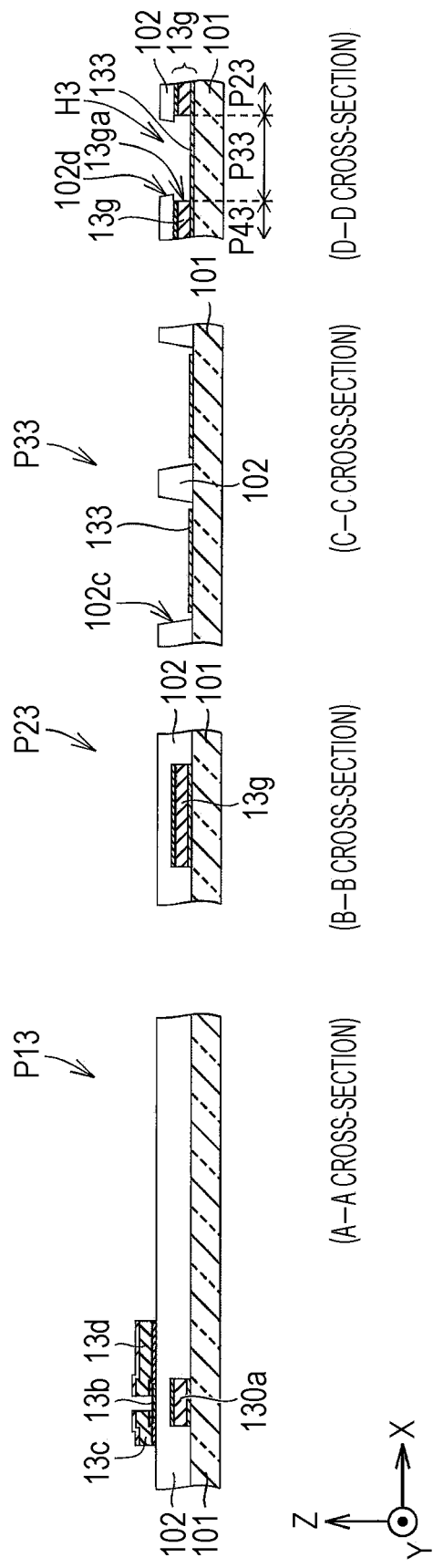

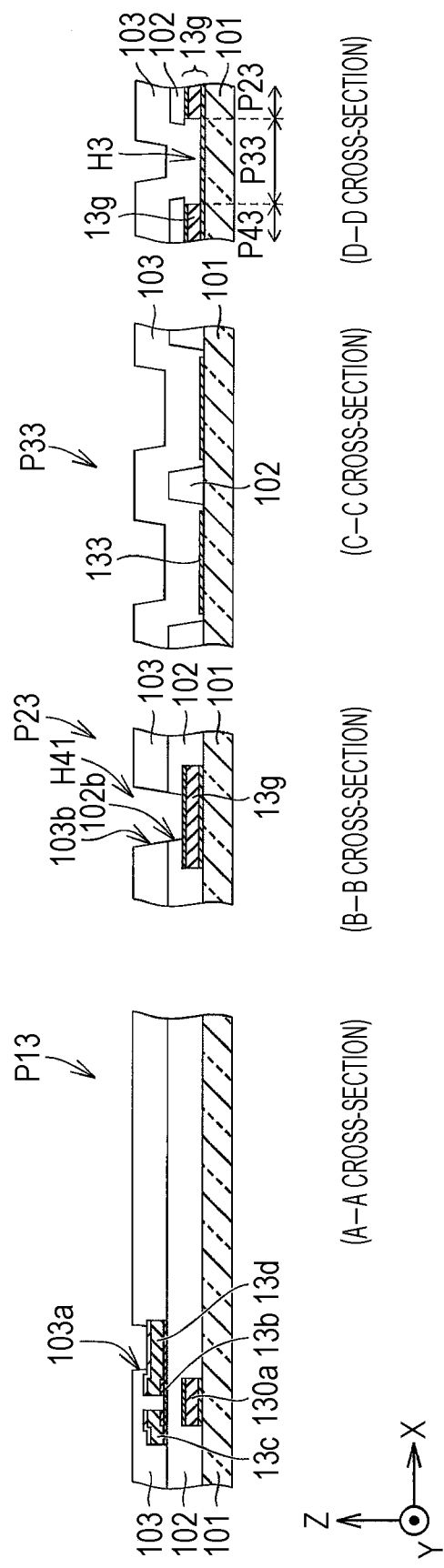

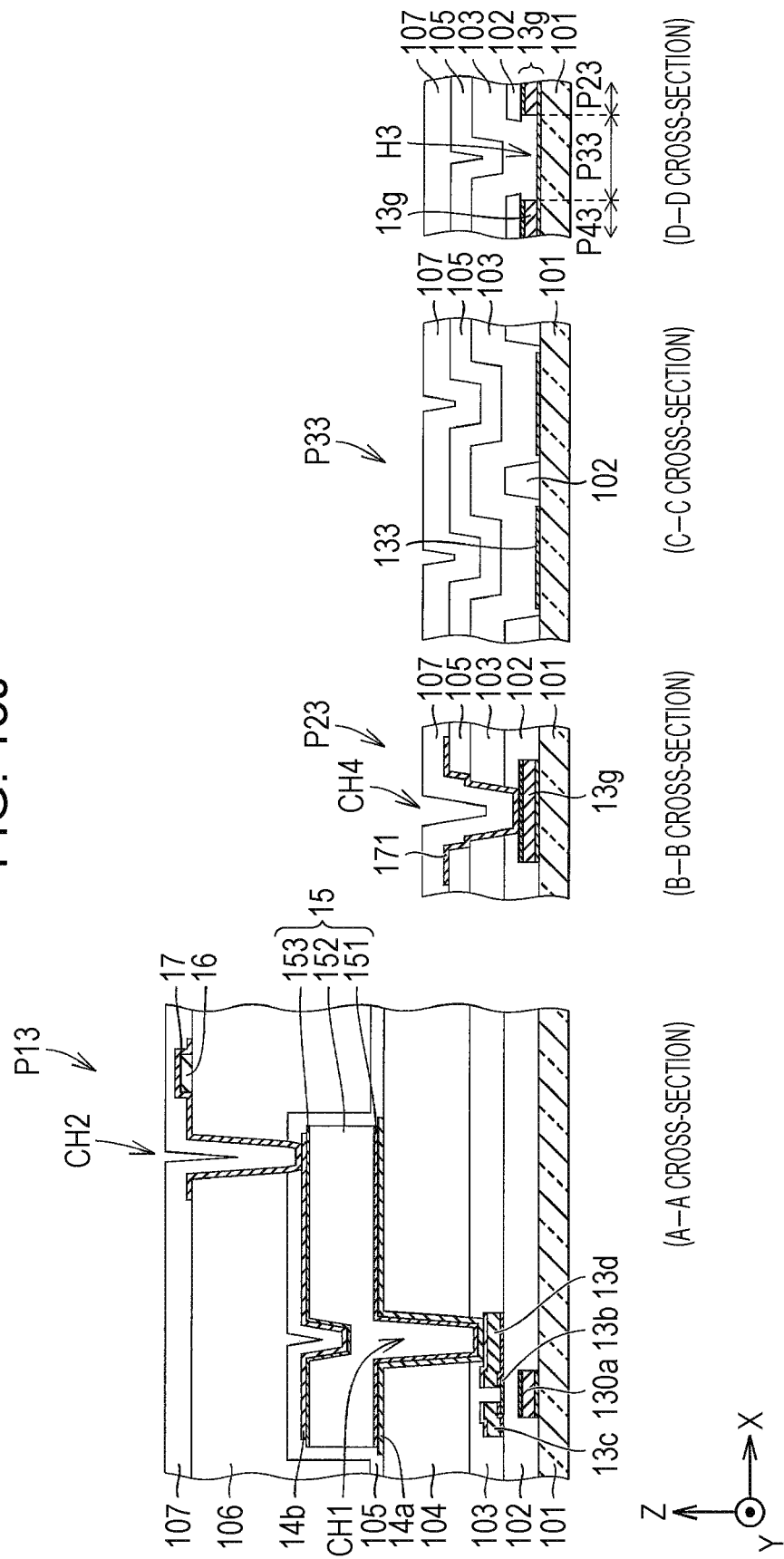

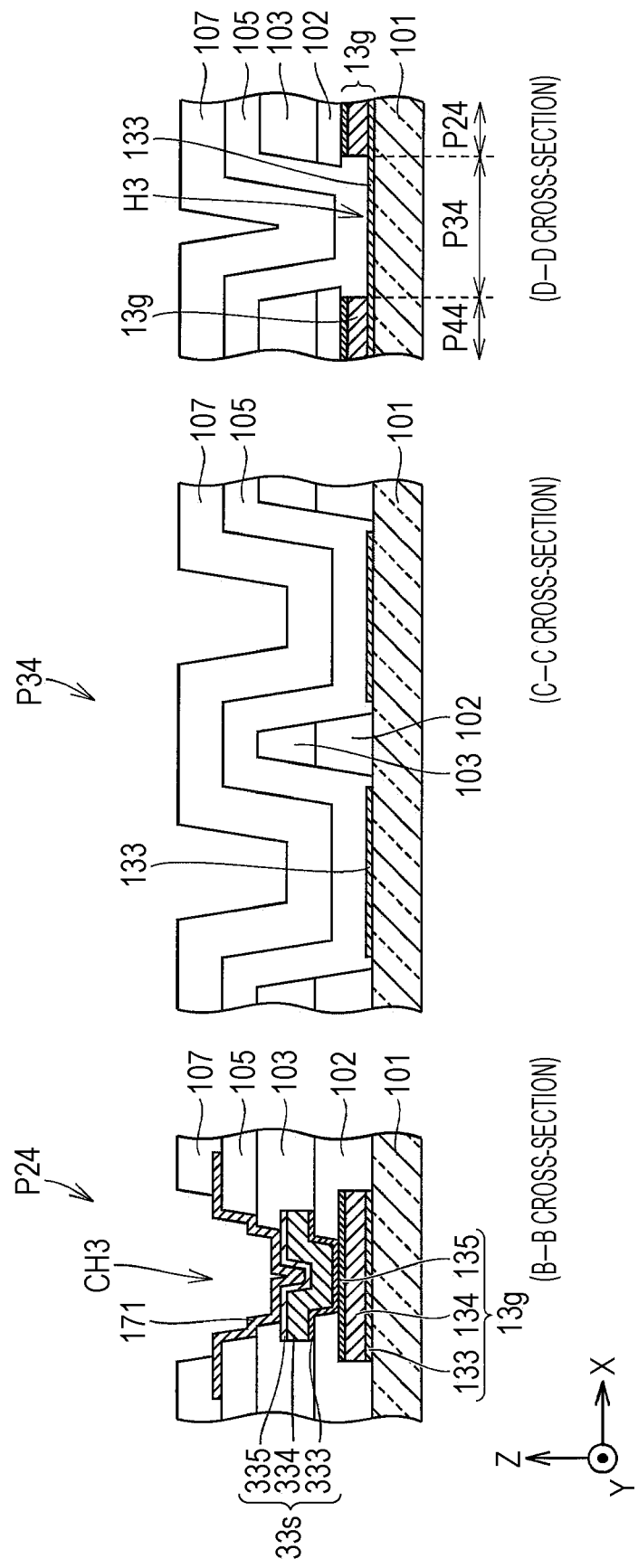

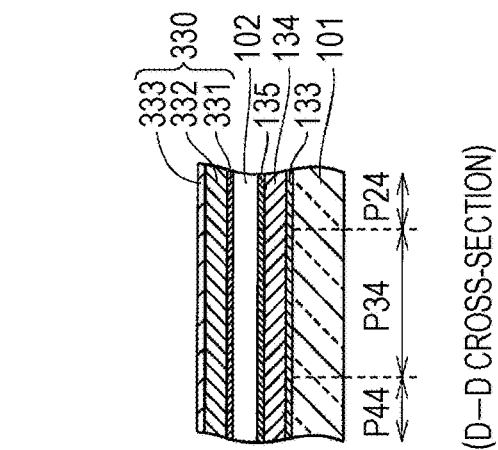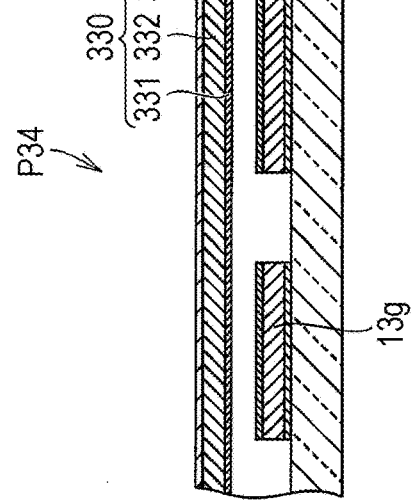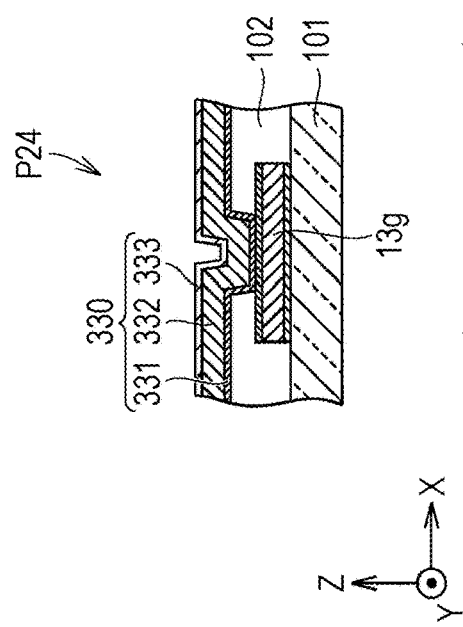
FIG. 15B

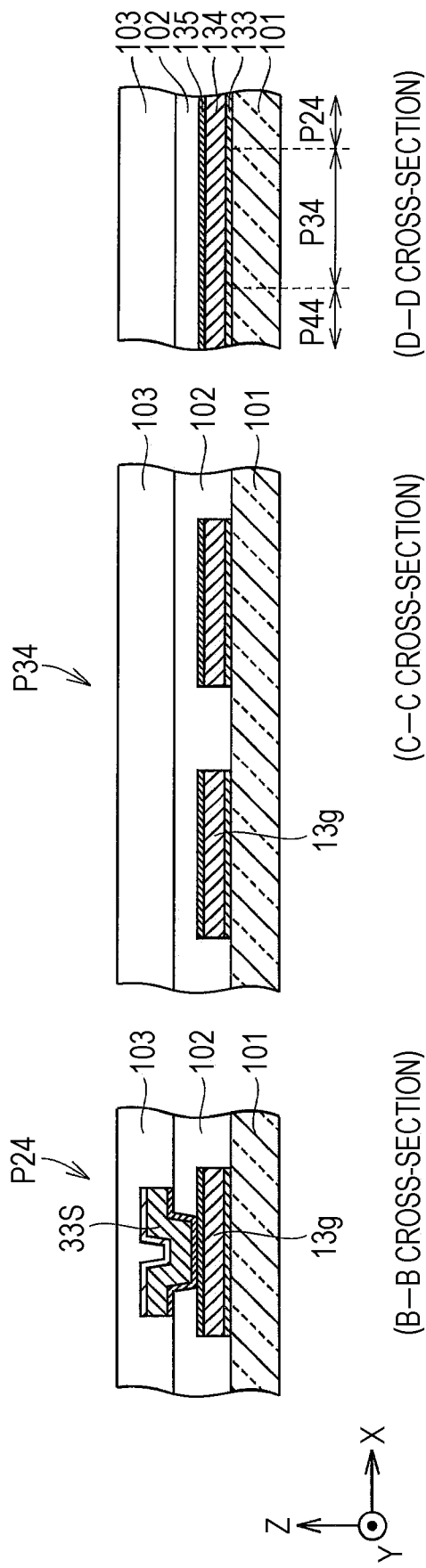

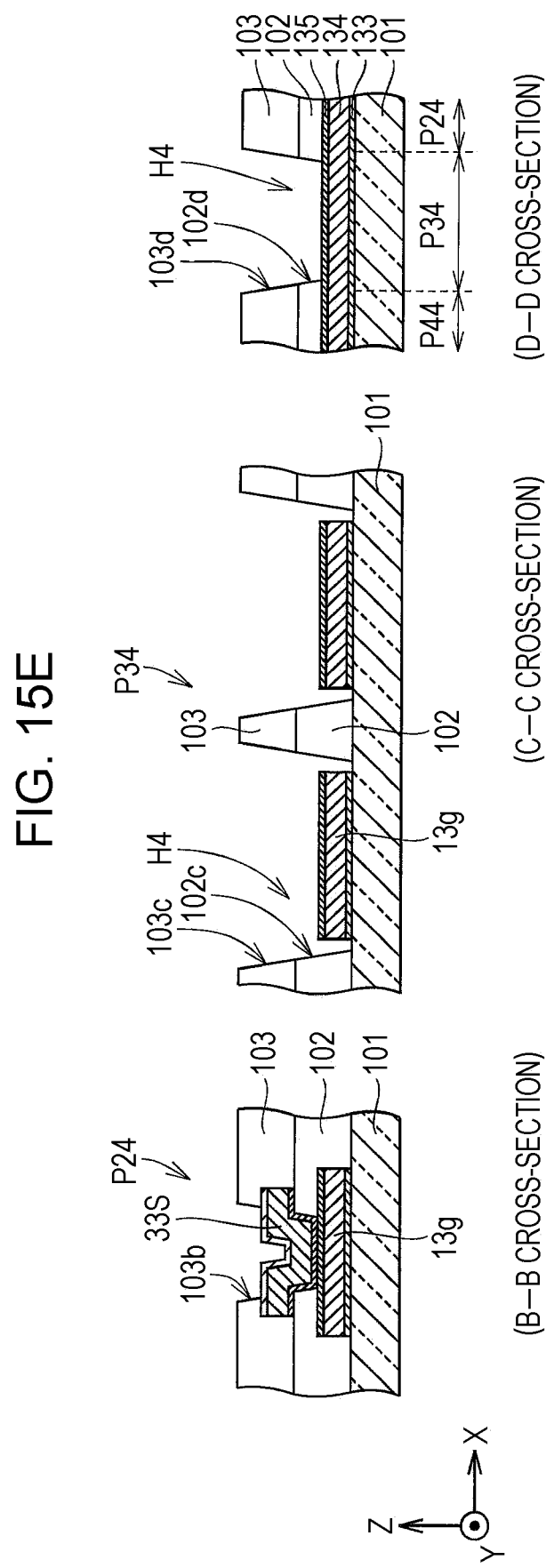

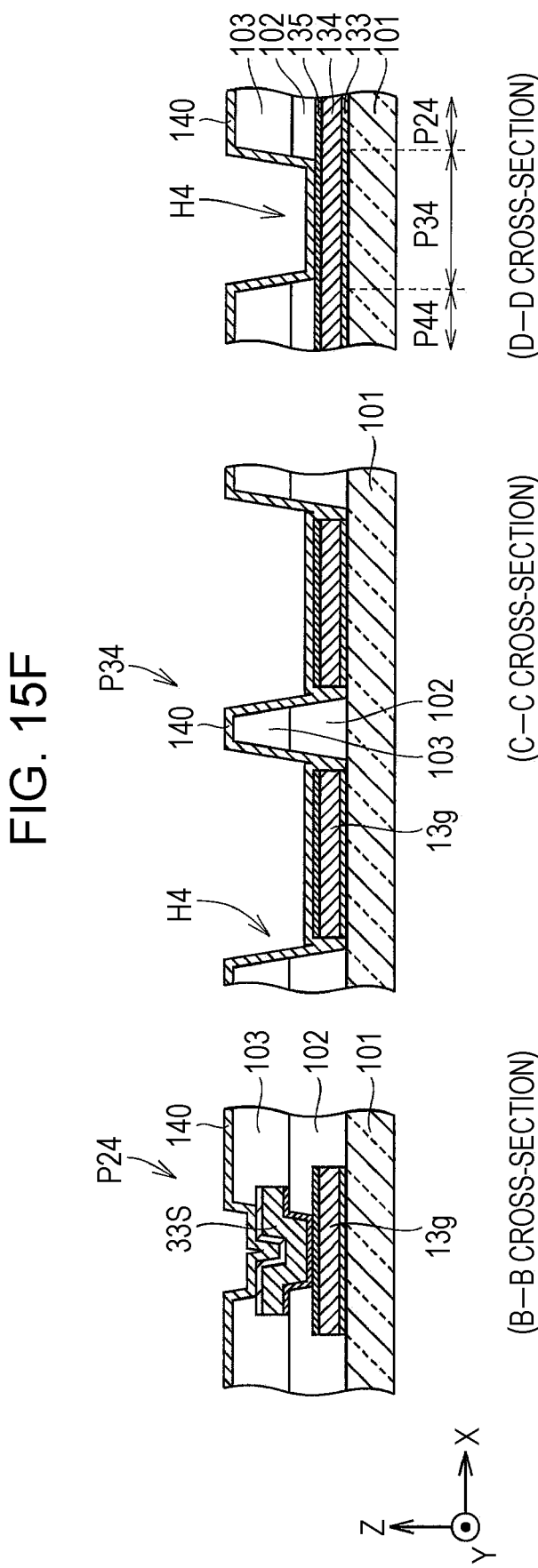

ACTIVE MATRIX SUBSTRATE AND METHOD FOR MANUFACTURING SAME

TECHNICAL FIELD

The present invention relates to an active matrix substrate and a method for manufacturing the same.

BACKGROUND ART

Japanese Unexamined Patent Application Publication No. 2010-210713 discloses an active matrix substrate having an input terminal and a short ring connected to the input terminal. This active matrix substrate is configured such that when a connection portion between the input terminal and the short ring is divided after the active matrix substrate has been manufactured, a metal film provided in a location of division does not corrode.

Specifically, this active matrix substrate has a titanium (Ti) layer connectedly formed between the input terminal and the short ring. Over the titanium (Ti) layer, a copper (Cu) layer is formed, excluding a division portion. In Japanese Unexamined Patent Application Publication No. 2010-210713, only the copper (Cu) layer in the division portion is removed with a laser or the like after the copper (Cu) layer has been formed entirely over the titanium (Ti) layer.

Since a low-resistance metal film such as that of copper (Cu) is comparatively soft, the metal film may extend at the time of division and get short-circuited with another wire that is adjacent to the metal film. Therefore, by forming the active matrix substrate so that a low-resistance metal film such as that of copper (Cu) which is lower in resistance than titanium (Ti) does not remain in the location of division, corrosion of the low-resistance metal film at the time of division and a short circuit with another wire can be prevented. Meanwhile, since a step of removing only the low-resistance metal film in the location of division is needed, the number of steps of manufacturing the active matrix substrate increases.

The invention disclosed below provides a technology that makes it possible to prevent a short circuit or the like at the time of division of an active matrix substrate while reducing the number of manufacturing steps.

SUMMARY OF INVENTION

An active matrix substrate of the present invention that solves the foregoing problems is an active matrix substrate having a pixel region, the active matrix substrate including: a terminal part connected to the pixel region; a guard ring provided around the terminal part; and a connection part that connect the terminal part and the guard ring to each other, wherein the pixel region, the terminal part, and the guard ring each include a first conductive layer in which at least a first metal film and a second metal film that is lower in resistance than the first metal film are stacked, a first protective layer disposed to overlap at least a part of the first conductive layer, and a second protective layer disposed over the first protective layer, the pixel region further include a second conductive layer provided at a higher level than the first protective layer, the connection part includes the first metal film, and the second protective layer disposed over the first metal film, ends of the first conductive layer in the terminal part and the guard ring that face the connection part are located on an inside of ends of the first protective layer that face the connection part, and the second conductive layer and the second metal film contain materials that are etchable with an identical etchant.

The present invention makes it possible to prevent a short circuit or the like at the time of division of an active matrix substrate while reducing the number of manufacturing steps.

BRIEF DESCRIPTION OF DRAWINGS

FIG. 4B illustrates a cross-sectional view of a terminal part P2 as taken along line B-B and cross-sectional views of a connection part P3 as taken along line C-C and line D-D.

FIG. 5C illustrates cross-sectional views of a step of forming a laminated film that is to serve as source and drain electrodes shown in FIG. 4A.

FIG. 5D illustrates cross-sectional views of a step of patterning the laminated film shown in FIG. 5C.

FIG. 5E illustrates cross-sectional view of a step of patterning a metal film 231 of the laminated film shown in FIG. 5C that remained in the step of FIG. 5D.

FIG. 5H illustrates cross-sectional views of a step of forming a second insulating film shown in FIG. 4A.

FIG. 5K illustrates cross-sectional views of a step of patterning the metal film, shown in FIG. 5J, that is to serve as the lower electrode.

FIG. 5O illustrates cross-sectional views of a step of forming a third insulating film shown in FIG. 4A.

FIG. 5S illustrates cross-sectional views showing a step of forming a metal film that is to serve as a bias wire shown in FIG. 4A.

FIG. 5Y illustrates cross-sectional views of a step of forming a sixth insulating film shown in FIG. 4A.

FIG. 5Z illustrates cross-sectional views of a step of patterning the sixth insulating film shown in FIG. 5Z.

FIG. 6 is a cross-sectional view of a terminal part according to a second embodiment.

FIG. 7A is a diagram explaining a step of fabricating the terminal part shown in FIG. 6 and a cross-sectional view showing a state that follows patterning of a first insulating film.

FIG. 7B is a cross-sectional view showing a state in which a second insulating film has been formed.

FIG. 7C is a cross-sectional view showing a state in which the second insulating film shown in FIG. 7B has been removed.

FIG. 7D is a cross-sectional view showing a state in which a metal film that is to serve as a lower electrode has been formed.

FIG. 7E is a cross-sectional view showing a state in which the metal film, shown in FIG. 7D, that is to serve as the lower electrode has been removed.

FIG. 7F is a cross-sectional view showing a state in which a third insulating film has been formed.

FIG. 7G is a cross-sectional view showing a state in which a contact hole CH3 has been formed.

FIG. 11B illustrates cross-sectional views showing a state in which the gate insulating film shown in FIG. 11A has been patterned.

FIG. 11C illustrates cross-sectional views showing a state in which a laminated film that is to serve as a source electrode and a drain electrode has been formed.

FIG. 11D illustrates cross-sectional views showing a state in which the laminated film shown in FIG. 11C has been patterned.

FIG. 11E illustrates cross-sectional views showing a metal film to that is serve as a lower electrode has been patterned.

FIG. 13A illustrates diagrams explaining a step of fabricating a pixel part, a terminal part, a connection part, and a guard ring part according to Modification 1 of the third embodiment and cross-sectional views showing a state in which a laminated film 230 that is to serve as a source electrode and a drain electrode has been formed.

FIG. 13C illustrates cross-sectional views showing a state in which the lowermost metal film of the laminated film that remained in FIG. 13B has been etched.

FIG. 13E illustrates cross-sectional views showing a state in which the first insulating film shown in FIG. 13D has been patterned.

FIG. 13J illustrates cross-sectional views showing a state in which a fifth insulating film has been formed.

FIG. 14 illustrates cross-sectional views of a terminal part, a connection part, and a guard ring part according to a fourth embodiment.

FIG. 15B illustrates cross-sectional views showing a state in which a laminated film that is to serve as a source electrode and a drain electrode has been formed.

FIG. 15D illustrates cross-sectional views showing a state in which a first insulating film has been formed.

FIG. 15E illustrates cross-sectional views showing a state in which the first insulating film shown in FIG. 15D has been patterned.

FIG. 15F illustrates cross-sectional views showing a state in which a metal film that is to serve as a lower electrode has been formed.

DESCRIPTION OF EMBODIMENTS

Figure 1:
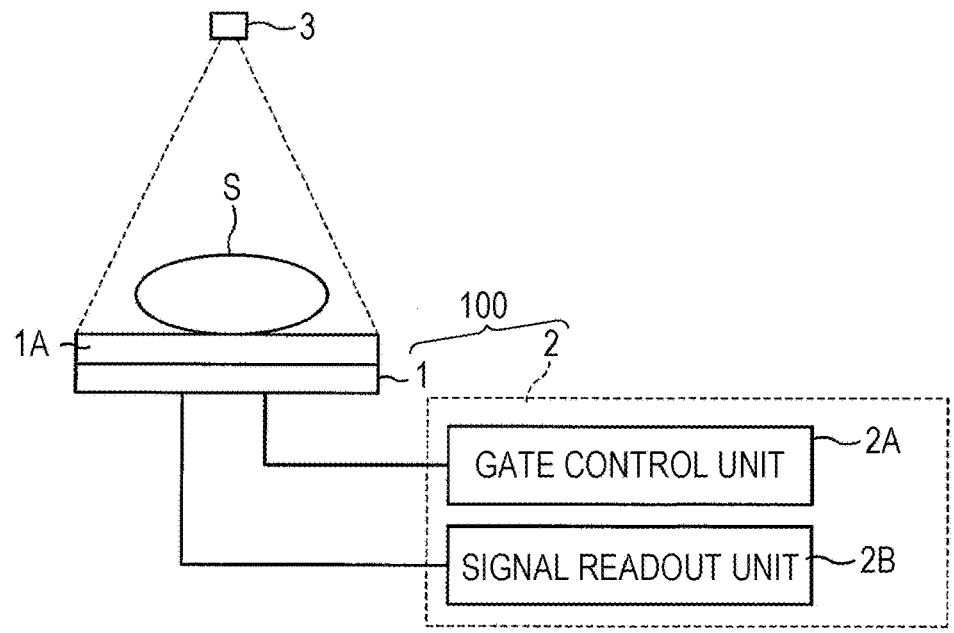
FIG. 1 is a schematic view showing an X-ray imaging apparatus according to a first embodiment.

An active matrix substrate according to one embodiment of the present invention is an active matrix substrate having a pixel region, the active matrix substrate including: a terminal part connected to the pixel region; a guard ring provided around the terminal part; and a connection part that connect the terminal part and the guard ring to each other, wherein the pixel region, the terminal part, and the guard ring each include a first conductive layer in which at least a first metal film and a second metal film that is lower in resistance than the first metal film are stacked, a first protective layer disposed to overlap at least a part of the first conductive layer, and a second protective layer disposed over the first protective layer, the pixel region further include a second conductive layer provided at a higher level than the first protective layer, the connection part includes the first metal film, and the second protective layer disposed over the first metal film, ends of the first conductive layer in the terminal part and the guard ring that face the connection part are located on an inside of ends of the first protective layer that face the connection part, and the second conductive layer and the second metal film contain materials that are etchable with an identical etchant (first configuration).

According to the first configuration, only the first metal film is formed as a conductive layer of the connection part, and the first protective layer is provided over the first metal film. This makes it harder for a short circuit or the like to take place at the time of division than in a case where the second metal film and the first metal film are provided.

Further, the second conductive layer and the second metal film contain materials that are etchable with an identical etchant. This makes it possible to etch the second meal film in the connection part by performing wet etching in forming the second conductive layer after having formed the first conductive layer in the terminal part, the connection part, and the guard ring part and formed the first protective layer in the terminal part and the guard ring part. Since the wet etching is isotropic, ends of the first conductive layer in the terminal part and the guard ring that face the connection part are located on the inside of ends of the first protective layer that face the connection part. Accordingly, the present configuration can be fabricated without the need for a separate step of removing the second metal film.

In the first configuration, the terminal part may further include the second conductive layer connected to the first conductive layer (second configuration).

In the first configuration, the pixel region and the terminal part may further include a third conductive layer over the first conductive layer, the third conductive layer may be disposed to overlap the first conductive layer in the terminal part, and the third conductive layer may contain a material that is lower in etching rate than the second conductive layer with respect to the etchant (third configuration).

According to the third configuration, the third conductive layer is hardly etched even when the second conductive layer is etched at the time of fabrication of the terminal part, so that the terminal part has its pad portion protected.

A method for manufacturing an imaging panel according to one embodiment of the present invention is a method for manufacturing an active matrix substrate including a pixel region over a substrate, a terminal part provided in a first region outside the pixel region and connected to the pixel region, a guard ring provided in a second region outside the first region, and a connection part, provided in a third region between the first region and the second region, that connects the terminal part and the guard ring to each other, the method including the steps of: in the pixel region, the first region, the second region, and the third region, forming a first conductive layer in which at least a first metal film and a second metal film that is lower in resistance than the first metal film are stacked; forming a first protective layer over the first conductive layer in the pixel region, the first region, the second region, and the third region; forming an opening in the first protective layer in the pixel region and the third region; forming a second conductive layer at a higher level than the first protective layer and then etching the second conductive layer in the pixel region, the first region, the second region, and the third region; and forming a second protective layer at a higher level than the first protective layer in the pixel region, the first region, the second region, and the third region, wherein the second conductive layer and the second metal film contain materials that are etchable with an identical etchant, the second conductive layer is removed by the etching from at least the second region and the third region, in the third region, the second metal film of the first conductive layer in a position of the opening of the protective layer is removed by the etching and the first metal film remains, and in the first region and the second region, ends of the first conductive layer that face the third region are located on an inside of ends of the protective layer that face the third region (first manufacturing method).

According to the first manufacturing method, only the first metal film is formed as a conductive layer of the connection part, and the first protective layer is provided over the first metal film. This makes it harder for a short circuit or the like to take place at the time of division than in a case where the second metal film and the first metal film are provided.

Further, the second conductive layer and the second metal film contain materials that are etchable with an identical etchant. Therefore, the second meal film in the connection part is etched by performing wet etching in forming the second conductive layer after having formed the first conductive layer in the terminal part, the connection part, and the guard ring part and formed the first protective layer in the terminal part and the guard ring part. Since the wet etching is isotropic, ends of the first conductive layer in the terminal part and the guard ring that face the connection part are located on the inside of ends of the first protective layer that face the connection part. Accordingly, the present configuration can be fabricated without the need for a separate step of removing the second metal film.

In the first manufacturing method, in the etching step, the second conductive layer may not be removed from the first region, and the first region may have the second conductive layer connected to the first conductive layer (second manufacturing method).

The first manufacturing method may further include the step of, after having formed the opening in the first protective layer, forming a third conductive layer in the pixel region, the first region, the second region, and the third region and etching the third conductive layer, and in the first manufacturing method, the pixel region and the first region may include the third conductive layer at a higher level than the first conductive layer, in the first region, the third conductive layer may be connected to the first conductive layer, and the third conductive layer may contain a material that is lower in etching rate than the second conductive layer with respect to the etchant (third manufacturing method).

According to the third manufacturing method, in the first region, the third conductive layer is hardly etched even when the second conductive layer is etched, so that a pad portion of the terminal part can be surely fabricated.

The following describes embodiments of the present invention in detail with reference to the drawings. Identical or corresponding components in the drawings are given identical signs and are not repeatedly described.

First Embodiment (Configuration)

FIG. 1 is a schematic view showing an X-ray imaging apparatus to which an active matrix substrate according to the present embodiment has been applied. The X-ray imaging apparatus 100 includes an imaging panel 1, which is an example of the active matrix substrate, and a control unit 2. The control unit 2 includes a gate control unit 2A and a signal readout unit 2B. A subject S is irradiated with X-rays from an X-ray source 3. X-rays transmitted through the subject S are converted into fluorescence (hereinafter referred to as "scintillation light") by a scintillator 1A disposed on top of the imaging pane 1. The X-ray imaging apparatus 100 acquires an X-ray image by imaging the scintillation light though the imaging panel 1 and the control unit 2.

Figure 2:
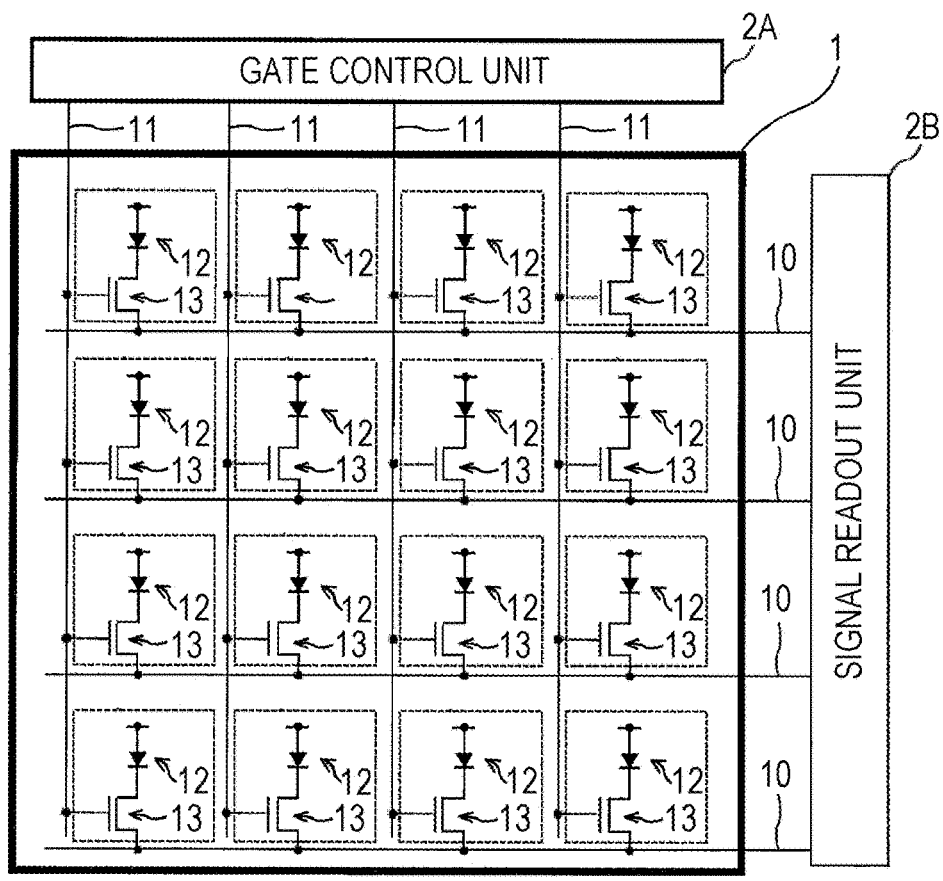
FIG. 2 is a schematic view schematically showing an imaging panel shown in FIG. 1.

FIG. 2 is a schematic view schematically showing a configuration of the imaging panel 1. As shown in FIG. 2, the imaging panel 1 includes a plurality of source wires 10 and a plurality of gate wires 11 crossing the plurality of source wires 10. The gate wires 11 are connected to the gate control unit 2A, and the source wires 10 are connected to the signal readout unit 2B.

The imaging panel 1 has TFTs 13 located at the crossings between the source wires 10 and the gate wires 11 and connected to the source wires 10 and the gate wires 11. Further, photodiodes 12 are provided in regions (hereinafter referred to as "pixels") surrounded by the source wires 10 and the gate wires 11. In the pixels, scintillation light into which X-rays having transmitted through the subject S have been converted is converted by the photodiodes 12 into electric charge corresponding to the light intensity of the scintillation light.

The gate wires 11 in the imaging panel 1 are switched in sequence into a selected state by the gate control unit 2A, and a TFT 13 connected to a gate wire 11 that is in a selected state is brought into an on-state. When the TFTs 13 are brought into an on-state, signals corresponding to electric charge produced through the conversion by the photodiodes 12 are outputted to the signal readout unit 2B via the source wires 10.

Figure 3A:
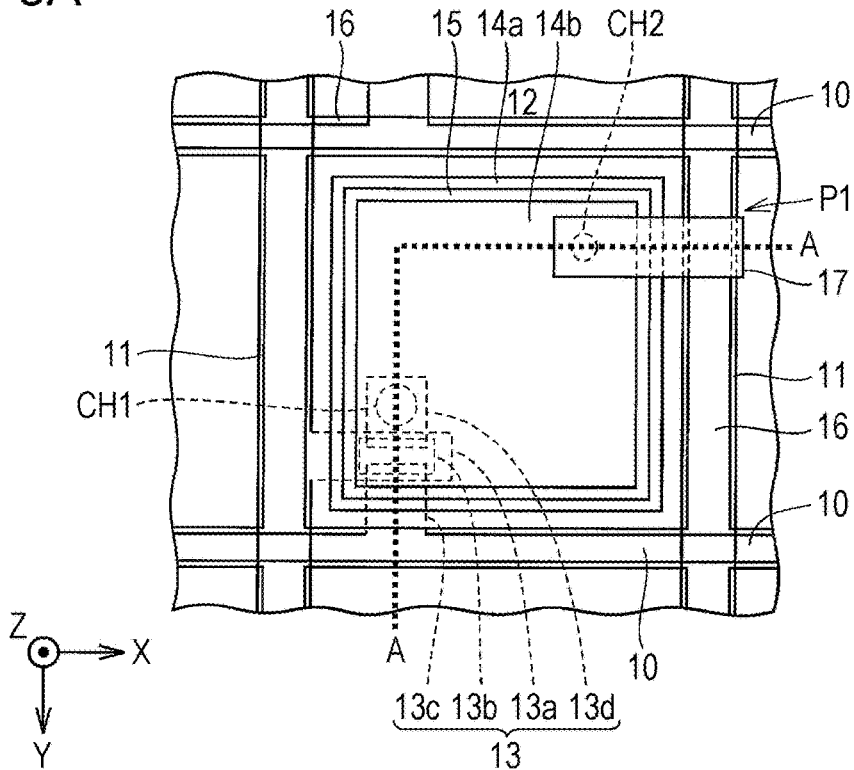
FIG. 3A is an enlarged plan view of a pixel portion of the imaging panel shown in FIG. 2.
Figure 3B:
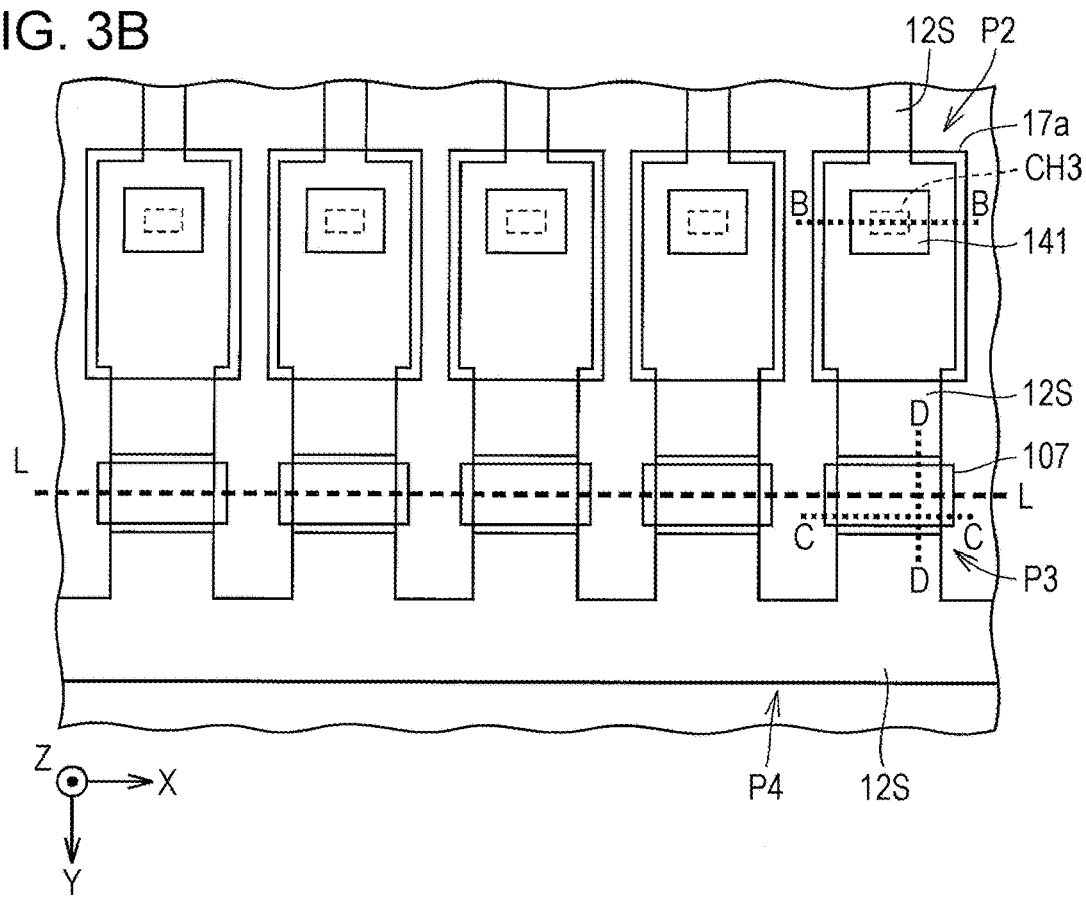
FIG. 3B is a partially-enlarged schematic view of a region in which a terminal part that is connected to the pixel portion shown in FIG. 3A, a guard ring part, and a connection part between the terminal part and the guard ring part are provided.

FIG. 3A is a partially-enlarged plan view of a pixel part P1 in which a pixel of the imaging panel 1 shown in FIG. 2 is provided. FIG. 3B is a partially-enlarged plan view of a region in which a terminal part P2 that is connected to the pixel part P1 shown in FIG. 3A, a guard ring part P4, and a connection part P3 between the terminal part P2 and the guard ring part P4 are provided.

The terminal part P2 is disposed outside the pixel part P1 and connected to the pixel part P1. The guard ring part P4 is disposed outside the terminal part P2. The connection part P3 connects the terminal part P2 and the guard ring part P4 to each other. After the imaging panel 1 has been manufactured, the terminal part P2 and the guard ring part P4 are divided from each other at a location (hereinafter referred to as "location of division L") of line L-L in the connection part P3.

As shown in FIG. 3A, the pixel part P1 has a photodiode 12 and a TFT 13 in a pixel surrounded by gate wires 11 and source wires 10.

The photodiode 12 includes a lower electrode 14a, a photoelectric conversion layer 15, and an upper electrode 14b. The TFT 13 has a gate electrode 13a integrated with a gate wire 11, a semiconductor active layer 13b, a source electrode 13c integrated with a source wire 10, and a drain electrode 13d. The drain electrode 13d and the lower electrode 14a are connected to each other via a contact hole CH1.

Further, a bias wire 16 is disposed to overlap the gate wires 11 and the source wires 10 in plan view. The bias wire 16 is connected to a transparent conductive film 17. The transparent conductive film 17 supplies the photodiode 12 with a bias voltage via a contact hole CH2.

Figure 4A:
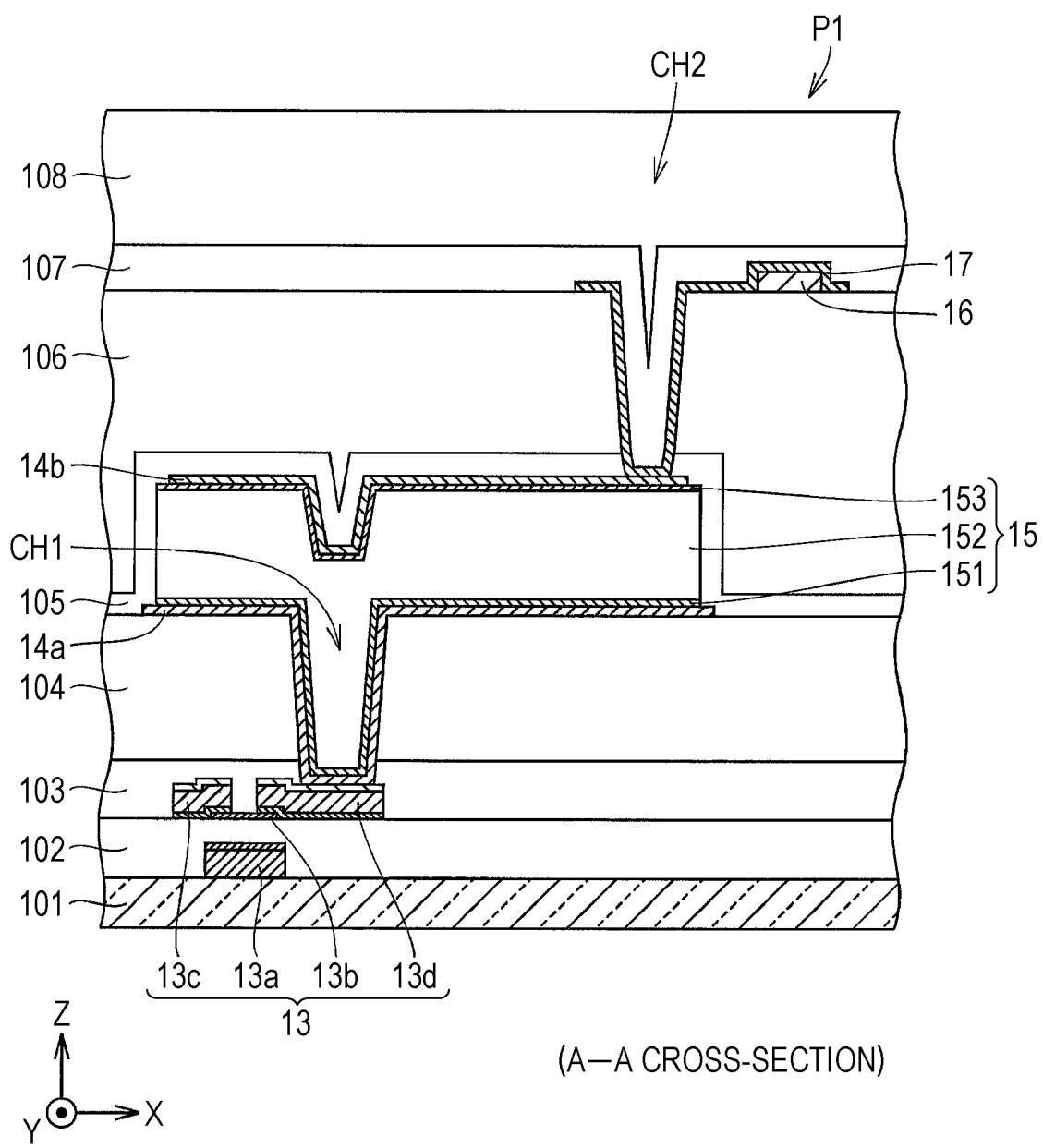
FIG. 4A is a cross-sectional view of a pixel part P1 of FIG. 3 as taken along line A-A.

FIG. 4A is a cross-sectional view of the pixel part P1 of FIG. 3 as taken along line A-A. FIG. 4B illustrates a cross-sectional view of the terminal part P2 as taken along line B-B and cross-sectional views of the connection part P3 as taken along line C-C and line D-D. The following describes the structure of each part in concrete terms.

<Pixel Part P1>

The structure of the pixel part P1 is described with reference to the A-A cross-sectional view illustrated in FIG. 4. The pixel part P1 is structured such that over a substrate 101, the gate electrode 13a integrated with the gate wire 11 (see FIG. 3) and a gate insulating film 102 are formed. The substrate 101 is a substrate having insulation properties and is constituted, for example, by a glass substrate or the like.

The gate electrode 13a and the gate wire 11 has a laminated structure in which a metal film 131 composed of titanium (Ti) and a metal film 132 composed of copper (Cu) are stacked in this order.

The gate insulating film 102 covers the gate electrode 13a. The gate insulating film 102 may be made, for example, of silicon oxide (SiOx), silicon nitride (SiNx), silicon oxynitride (SiOxNy) (x>y), silicon nitroxide (SiNxOy) (x>y), or the like. In the present embodiment, the gate insulating film 102 is constituted by a laminated film in which silicon oxide (SiOx) and silicon nitride (SiNx) are stacked in this order with film thicknesses of approximately 50 nm and approximately 400 nm, respectively.

The pixel part P1 is structured such that the semiconductor active layer 13b, the source electrode 13c connected to the semiconductor active layer 13b, and the drain electrode 13$d$ connected to the semiconductor active layer 13$b$ are provided over the gate electrode 13$a$ via the gate insulating film 102.

The semiconductor active layer 13$b$ is formed in contact with the gate insulating film 102. The semiconductor active layer 13$b$ is composed of an oxide semiconductor. A usable example of the oxide semiconductor is $InGaO_3 (ZnO)_5$, zinc magnesium oxide ($MgxZn_1$-xO), zinc cadmium oxide ($CdxZn_1$-xO), cadmium oxide (CdO), an amorphous oxide semiconductor containing indium (In), gallium (Ga), and zinc (Zn) in predetermined proportions, or the like. In the present embodiment, the semiconductor active layer 13$b$ is composed of an amorphous oxide semiconductor containing indium (In), gallium (Ga), and zinc (Zn) in predetermined proportions, and has a film thickness of, for example, 70 nm.

The source electrode 13$c$ and the drain electrode 13$d$ are disposed to be in contact with a part of the semiconductor active layer 13$b$ over the gate insulating film 102. The source electrode 13$c$ is integrated with the source wire 10 (see FIG. 3A). The drain electrode 13$d$ is connected to the lower electrode 14$a$ via the contact hole CH1.

The source electrode 13$c$ and the drain electrode 13$d$ are formed on the same level and, for example, have a laminated structure in which a metal film 231 composed of molybdenum nitride (MoN), a metal film 232 composed of aluminum (Al), and a metal film 233 composed of titanium (Ti) are stacked in this order with film thicknesses of approximately 100 nm, approximately 500 nm, and approximately 50 nm, respectively.

Over the gate insulating film 102, a first insulating film 103 is provided in such a manner as to overlap the source electrode 13$c$ and the drain electrode 13$d$. The first insulating film 103 has an opening over the drain electrode 13$d$.

The first insulating film 103 has a laminated structure in which silicon nitride (SiN) and silicon oxide ($SiO_2$) are stacked in this order.

Over the first insulating film 103, a second insulating film 104 is provided. The second insulating film 104 has an opening over the drain electrode 13$d$, and the contact hole CH1 is formed by the opening of the first insulating film 103 and the opening of the second insulating film 104.

The second insulating film 104 is made, for example, of organic transparent resin such as acrylic resin or siloxane resin with a film thickness of approximately 2.5 μm.

Over the second insulating film 104, the lower electrode 14$a$ is provided. The lower electrode 14$a$ is connected to the drain electrode 13$d$ via the contact hole CH1. The lower electrode 14$a$ is constituted, for example, by a metal film containing molybdenum nitride (MoN) with a film thickness of approximately 200 nm.

Over the lower electrode 14$a$, the photoelectric conversion layer 15 is provided. The photoelectric conversion layer 15 is constituted by an n-type amorphous semiconductor layer 151, an intrinsic amorphous semiconductor layer 152, and a p-type amorphous semiconductor layer 153 being stacked in this order. In this example, the length of the photoelectric conversion layer 15 in an X-axis direction is shorter than the length of the lower electrode 14$a$ in the X-axis direction.

The n-type amorphous semiconductor layer 151 is composed of amorphous silicon doped with an n-type impurity (e.g. phosphorus). The n-type amorphous semiconductor layer 151 has a film thickness of approximately 30 nm.

The intrinsic amorphous semiconductor layer 152 is composed of intrinsic amorphous silicon. The intrinsic amorphous semiconductor layer 152 is formed in contact with the n-type amorphous semiconductor layer 151. The intrinsic amorphous semiconductor layer 152 has a film thickness of approximately 1000 nm.

The p-type amorphous semiconductor layer 153 is composed of amorphous silicon doped with a p-type impurity (e.g. boron). The p-type amorphous semiconductor layer 153 is formed in contact with the intrinsic amorphous semiconductor layer 152. The p-type amorphous semiconductor layer 153 has a film thickness of approximately 5 nm.

Over the photoelectric conversion layer 15, the upper electrode 14$b$ is provided. The upper electrode 14$b$ is composed, for example, of ITO (indium tin oxide) with a film thickness of approximately 70 nm.

Over the second insulating film 104, the upper electrode 14$b$, and the photoelectric conversion layer 15, a third insulating film 105 is provided. The third insulating film 105 has an opening on top of the upper electrode 14$b$.

The third insulating film 105 is an inorganic insulating film composed, for example, of silicon nitride (SiN) with a film thickness of, for example, 300 nm.

Over the third insulating film 105, a fourth insulating film 106 is provided. In the pixel part P1, the fourth insulating film 106 has an opening, and the contact hole CH2 is formed by the opening of the third insulating film 105 and the opening of the fourth insulating film 106. The fourth insulating film 106 is made, for example, of organic transparent resin such as acrylic resin or siloxane resin with a film thickness of, for example, 2.5 μm.

Over the fourth insulating film 106, the bias wire 16 and the transparent conductive film 17 connected to the bias wire 16 are provided. The transparent conductive film 17 makes contact with the upper electrode 14$b$ in the contact hole CH2.

The bias wire 16 is connected to the control unit 2 (see FIG. 1). The bias wire 16 applies a bias voltage inputted from the control unit 2 to the upper electrode 14$b$ via the contact hole CH2.

The bias wire 16 has a laminated structure in which a metal film composed of molybdenum nitride (MoN), a metal film composed of aluminum (Al), and a metal film composed of titanium (Ti) are stacked in this order with film thicknesses of approximately 100 nm, approximately 300 nm, and approximately 50 nm, respectively.

The transparent conductive film 17 is composed, for example, of ITO with a film thickness of approximately 70 nm.

Over the fourth insulating film 106 and the transparent conductive film 17, a fifth insulating film 107 is provided. The fifth insulating film 107 is an inorganic insulating film composed, for example, of silicon nitride (SiN) with a film thickness of approximately 200 nm.

Over the fifth insulating film 107, a sixth insulating film 108 is provided. The sixth insulating film 108 is made, for example, of organic transparent resin such as acrylic resin or siloxane resin with a film thickness of approximately 2.0 μm.

<Terminal Part P2>

Next, the structure of the terminal part P2 is described with reference to the B-B cross-sectional view illustrated in FIG. 4B.

The terminal part P2 is structured such that the gate insulating film 102 is provided over the same substrate 101 as the pixel part P1.

Over the gate insulating film 102 in the terminal part P2, a metal layer (hereinafter referred to as "source layer") 13$s$ made of the same material as the source electrode 13$c$ and the drain electrode 13$d$ is provided.

Further, over the gate insulating film 102, the first insulating film 103 is provided in such a manner as to overlap the source layer 13s. In the terminal part P2, the first insulating film 103 has an opening over the source layer 13s.

The terminal part P2 is structured such that over the first insulating film 103 and the source layer 13s, a metal layer (hereinafter referred to as "lower electrode layer 141") made of the same material as the lower electrode 14a is provided. The lower electrode layer 141 makes contact with the source layer 13s in the opening of the first insulating film 103.

Further, the terminal part P2 is structured such that the third insulating film 103 is provided over a part of the lower electrode layer 141 and the first insulating film 103. In the terminal part P2, the third insulating film 103 has an opening over the lower electrode layer 141.

Further, the terminal part P2 is structured such that a transparent conductive layer 171 made of the same material as the transparent conductive film 17 is provided over the third insulating film 105 and the lower electrode layer 141. The transparent conductive layer 171 makes contact with the lower electrode layer 141 in the opening of the third insulating film 105.

Further, the terminal part P2 is structured such that the fifth insulating film 107 is provided over a part of the transparent conductive layer 171 and the third insulating film 105. In the terminal part P2, the fifth insulating film 107 has an opening over the transparent conductive layer 171. The contact hole CH3 is formed by the opening of the first insulating film 103 and the third insulating film.

<Guard Ring Part P4>

Next, the structure of the guard ring part P4 is described with reference to the D-D cross-sectional view illustrated in FIG. 4B.

The guard ring part P4 is structured such that over the substrate 101, the gate insulating film 102 is provided and that over the gate insulating film 102, the source layer 13s is provided.

In the guard ring part P4, the first insulating film 103 is provided over the source layer 13s. As illustrated, the first insulating film 103 is spaced between the guard ring part P4 and the terminal part P2. An end of the first insulating film 103 in the guard ring part P4 is located on the outside of an end of the source layer 13s. A reason for that will be referred to in a description of a manufacturing method that will be described later.

The guard ring part P4 is structured such that the third insulating film 105 is provided over the first insulating film 103 and that the fifth insulating film 107 is provided over the third insulating film 105.

<Connection Part P3>

Next, the structure of the connection part P3 is described with reference to the C-C and D-D cross-sectional views illustrated in FIG. 4B.

As illustrated, the connection part P3 is structured such that the gate insulating film 102 is provided over the substrate 101. The metal film 231 composed of titanium (Ti) as the lowermost layer of the source layer 13s is provided over the gate insulating film 102, and the first insulating film 103 is provided in such a position as not to overlap the metal film 231.

The third insulating film 105 is provided over the metal film 231 and the first insulating film 103, and the fifth insulating film 107 is provided over the third insulating film 105.

The metal film 231 in the connection part P3 is joined to the metal film 231 of the source layer 13s of the terminal part P2 and the guard ring part P4, and the terminal part P2 and the guard ring part P4 are connected to each other by the metal film 231. The metal film 231 in the connection part P3 is covered with the third insulating film 105 and the fifth insulating film 107. That is, the metal film 231 composed of titanium (Ti) is the only metal film that is provided in the location of division L shown in FIG. 3. Therefore, the first insulating film 103 of each of the guard ring part P4 and the terminal part P2 and the metal films 233 and 232 of the source layer 13s are spaced by the connection part P3, whereby an opening H1 is provided.

(Method for Manufacturing Imaging Panel 1)

Figure 5A:
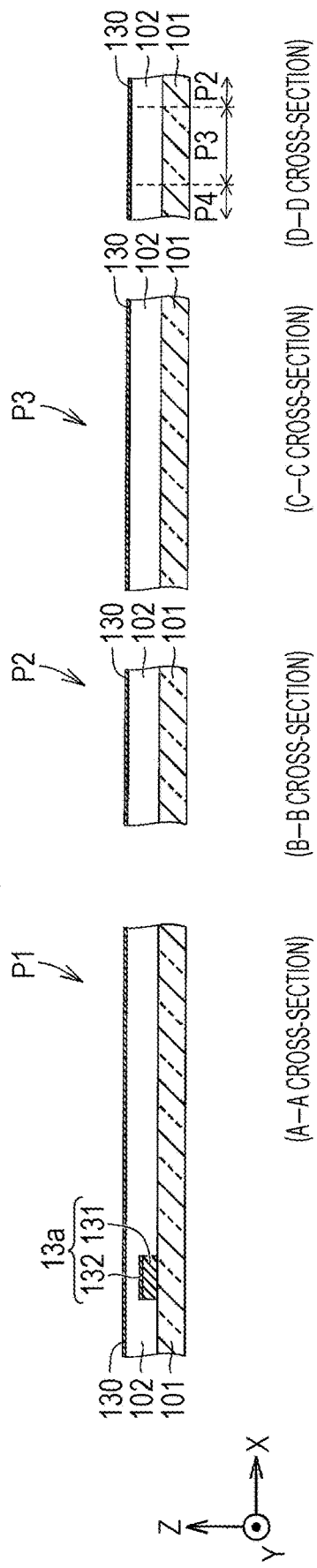
FIG. 5A illustrates diagrams explaining steps of fabricating the pixel part shown in FIG. 4A, the terminal part shown in FIG. 4B, the connection part shown in FIG. 4B, and a guard ring part shown in FIG. 4B and cross-sectional views of a step of forming a gate electrode, a gate insulating film, and a semiconductor active layer in the pixel part.

Next, a method for manufacturing an imaging panel 1 according to the present invention is described with reference to FIGS. 5A to 5Z. FIGS. 5A to 5Z illustrate cross-sectional views (A-A, B-B, C-C, and D-D cross-sections of FIG. 3) showing steps of manufacturing the imaging panel 1. In the present embodiment, a terminal part P2, a connection part P3, and a guard ring part P4 are fabricated through steps of manufacturing a pixel part P1. The followings gives a description in concrete terms.

As shown in FIG. 5A, a gate insulating film 102 and a gate electrode 13a in which a metal film 130 composed of titanium (Ti) and a metal film 131 composed of copper (Cu) are stacked are formed by an already-known method over a substrate 101 in the pixel part P1. After that, a semiconductor active layer 130 is formed all over a surface of the gate insulating film 102.

Figure 5B:
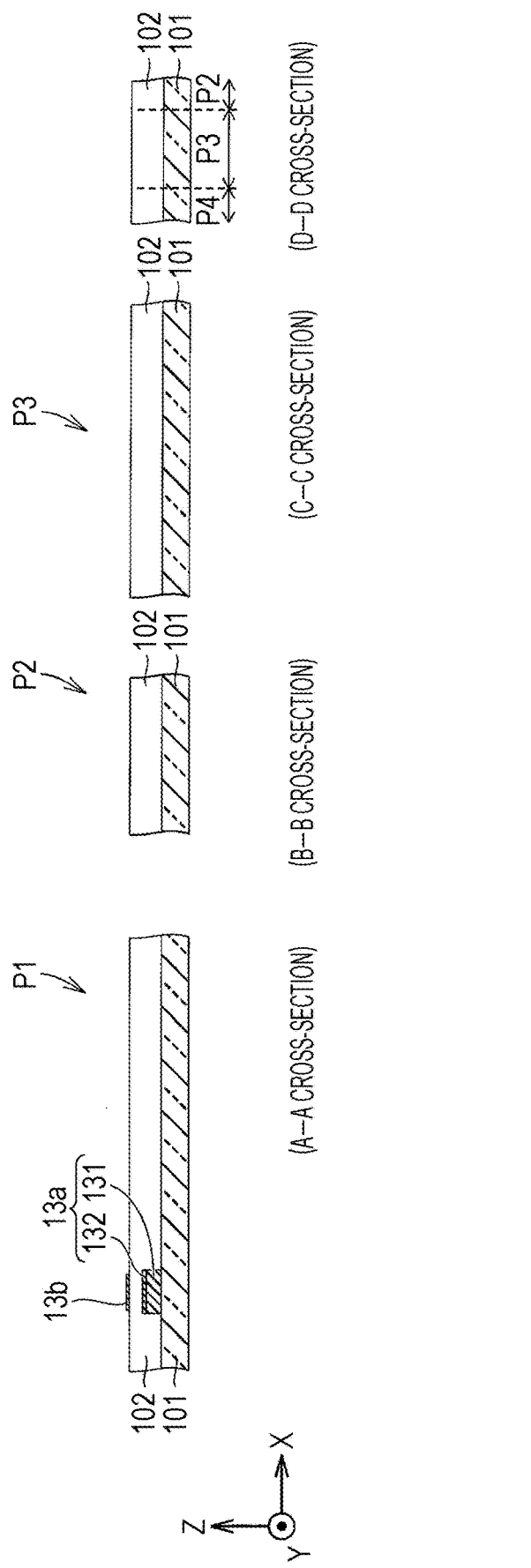
FIG. 5B illustrates cross-sectional views showing a step of patterning the semiconductor active layer shown in FIG. 5A.

Next, the semiconductor active layer 130 is patterned by a photolithography process and dry etching (see FIG. 5B). As a result, as shown in the A-A cross-section of FIG. 5B, a semiconductor active layer 13b is formed in the pixel part P1. Further, as shown in the B-B, C-C, and D-D cross-sections of FIG. 5B, the semiconductor active layer 130 is removed from the terminal part P2, the connection part P3, and the guard ring part P4.

Then, a laminated film 230 in which a metal film 233 composed of molybdenum nitride (MoN), a metal film 232 composed of aluminum (Al), and a metal film 231 composed of titanium (Ti) are stacked in this order is formed, for example, by a sputtering method (see FIG. 5C).

Then, the laminated film 230 is patterned by a photolithography process and etching (see FIG. 5D). In this case, the etching is wet etching that involves the use of an etchant containing acetic acid, nitric acid, and phosphoric acid. Therefore, the metal films 232 and 233, which are not covered with a resist, of the laminated film 230 are etched.

As a result, in the pixel part P1, as shown in the A-A cross-section of FIG. 5D, a source electrode 13c and a drain electrode 13d placed at a spacing from each other over the semiconductor active layer 13b are formed, and the metal film 231 remains in a region other than the source electrode 13c and the drain electrode 13d. Further, in the terminal part P2 and in a direction of division of the connection part P3, as shown in the B-B and C-C cross-sections of FIG. 5D, the metal film 231 is not etched, and the metal film 233 and the metal film 232 are formed into island shapes. Meanwhile, in a direction orthogonal to the direction of division of the connection part P3 and in the guard ring part P4, as shown in the D-D cross-section of FIG. 5D, the laminated film 230 remains without being etched.

Next, the metal film 231 is patterned by a photolithography process and wet etching (see FIG. 5E). As a result, as shown in the A-A, B-B, and C-C cross-sections of FIG. 5D, the metal film 231 remaining in the pixel part P1, in the terminal part P2, and in the direction of division of the connection part P3 is removed, and in the terminal part P2 and in the direction of division of the connection part P3, a source layer 13s composed of the metal films 231 to 233 is formed.

Figure 5F:
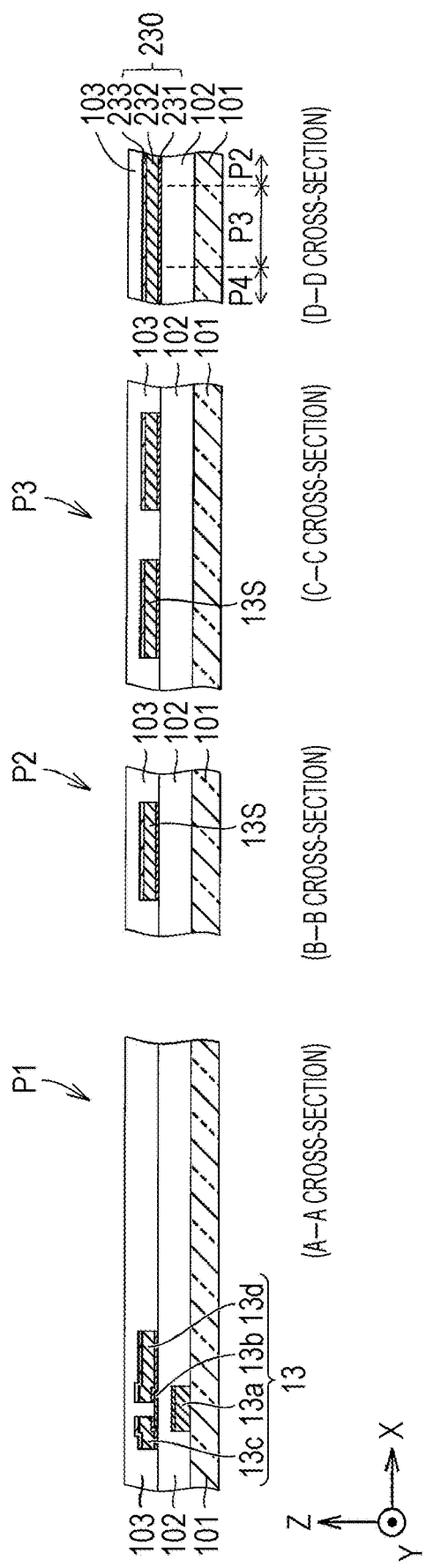
FIG. 5F illustrates cross-sectional views of a step of forming a first insulating film shown in FIG. 4A.

Then, a first insulating film 103 in which silicon nitride (SiN) and silicon oxide (SiO$_2$) are stacked is formed, for example, by a plasma CVD method (see FIG. 5F).

Figure 5G:
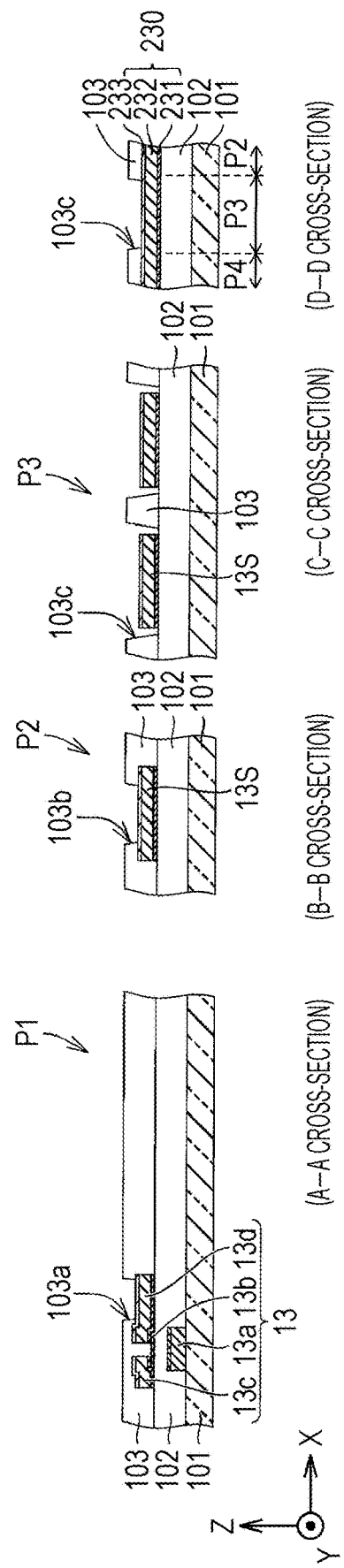
FIG. 5G illustrates cross-sectional views of a step of patterning the first insulating film shown in FIG. 5F.

After that, a whole surface of the substrate 101 is treated with heat at approximately 350° C., and the first insulating film 103 is patterned by a photolithography process and dry etching that involves the use of fluorine gas (see FIG. 5G).

As a result, in the pixel part P1, as shown in the A-A cross-section of FIG. 5G, an opening 103a is formed in the first insulating film 103 over the drain electrode 13d. In the terminal part P2, as shown in the B-B cross-section of FIG. 5G, an opening 103b is formed in the first insulating film 103 over the source layer 13s. In the connection part P3, as shown in the C-C and D-D cross-section of FIG. 5G, an opening 103c is formed in the first insulating film 103.

Next, a second insulating film 104 made of acrylic resin or siloxane resin is formed, for example, by a slit coating method over the first insulating film 103 (see FIG. 5H). After that, the second insulating film 104 is patterned by a photolithography process (see FIG. 5I). As a result, as shown in the A-A cross-section of FIG. 5I, an opening 104a is formed in the second insulating film 104 over the opening 103a, whereby a contact hole CH2 composed of the openings 103a and 104a is formed. Further, as shown in the B-B-C-C, and D-D cross-sections of FIG. 5I, the second insulating film 104 is removed from the terminal part P2, the connection part P3, and the guard ring part P4.

Figure 5I:
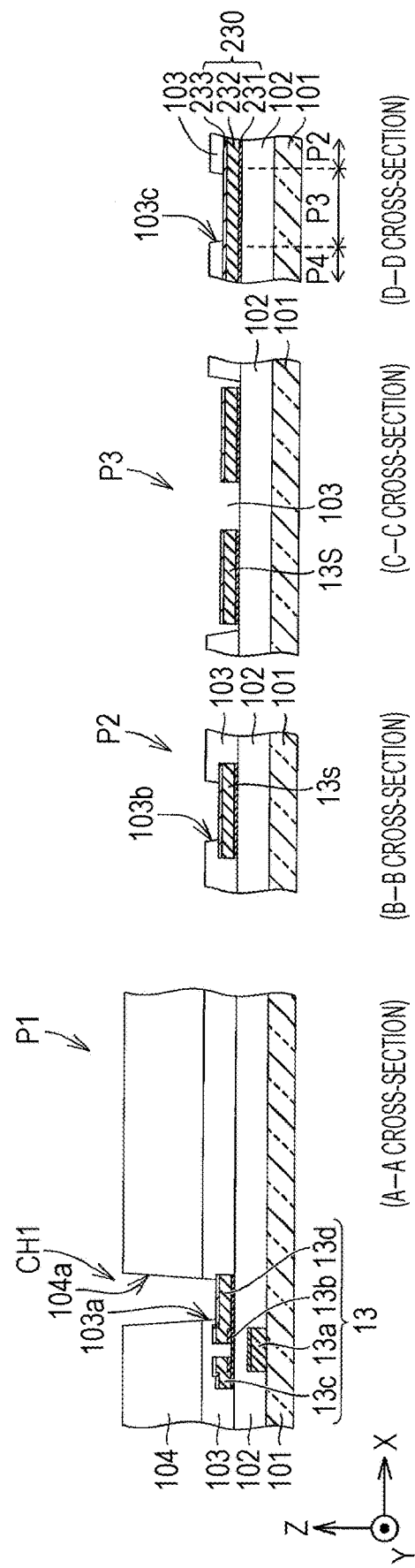
FIG. 5I illustrates cross-sectional views of a step of patterning the second insulating film shown in FIG. 5H.
Figure 5J:
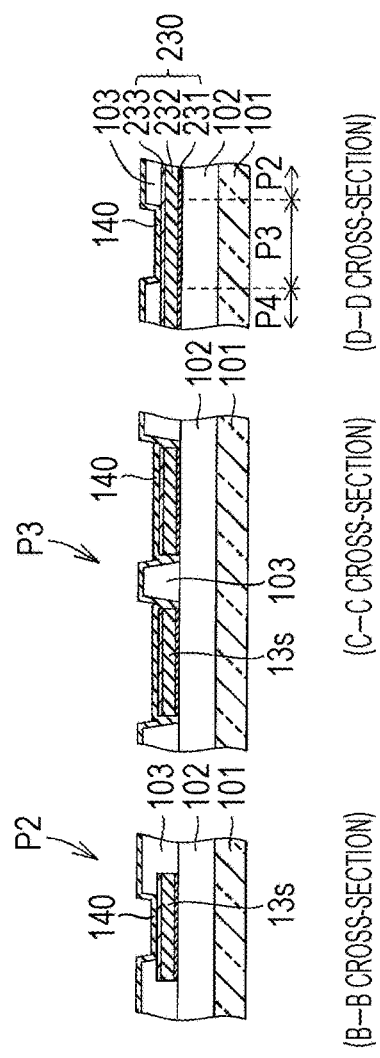
FIG. 5J illustrates cross-sectional views of a step of forming a metal film that is to serve as a lower electrode shown in FIG. 4A.

Then, a metal film 140 composed of molybdenum nitride (MoN) is formed, for example, by a sputtering method (see FIG. 5J). After that, the metal film 140 is patterned by a photolithography process and wet etching (see FIG. 5K). The wet etching of the metal film 140 involves the use of an etchant containing acetic acid, nitride acid, and phosphoric acid.

As a result, in the pixel part P1, as shown in the A-A cross-section of FIG. 5K, a lower electrode 14a connected to the drain electrode 13d via the contact hole CH1 is formed over the second insulating film 104. Further, in the terminal part P2, as shown in the B-B cross-section of FIG. 5K, a lower electrode layer 141 connected to the source layer 13s via the opening 103b is formed over the first insulating film 103.

In the connection part P3 and the guard ring part P4, as shown in the C-C and D-D cross-sections of FIG. 5K, the metal film 140 composed of molybdenum nitride (MoN) is removed. At this point in time, the metal film 232 composed of molybdenum nitride (MoN) and the metal film 233 composed of aluminum (Al) in the connection part P3 are etched at the same time as the metal film 140. Since the wet etching of the metal film 140 is isotropic, ends of the source layer 13s in the guard ring part P4 and the terminal part P2 are located on the inside of ends of the first insulating film 103.

Figure 5L:
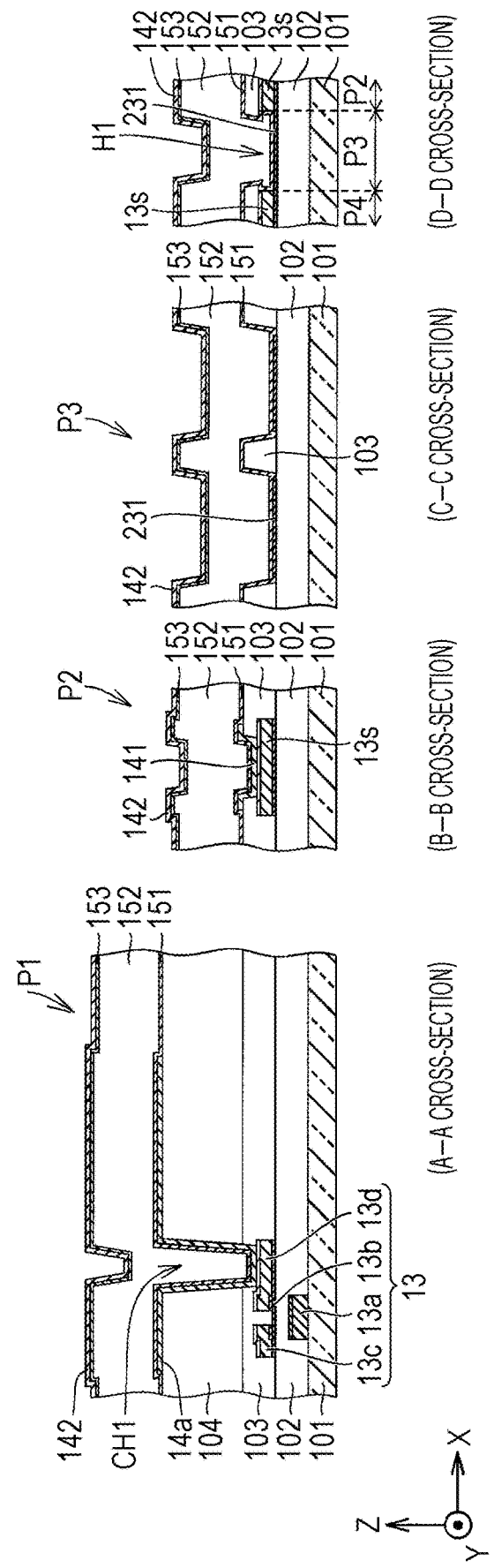
FIG. 5L illustrates cross-sectional views of a step of forming an n-type amorphous semiconductor layer, an intrinsic amorphous semiconductor layer, and a p-type amorphous semiconductor layer that is to serve as a photoelectric conversion layer shown in FIG. 4A and forming a metal film that is to serve as an upper electrode shown in FIG. 4A.

Next, an n-type amorphous semiconductor layer 151, an intrinsic amorphous semiconductor layer 152, and a p-type amorphous semiconductor layer 153 are formed in this order, for example, by a plasma CVD method, and after that, a transparent conductive film 142 composed of ITO is formed, for example, by a sputtering method (see FIG. 5L).

Figure 5M:
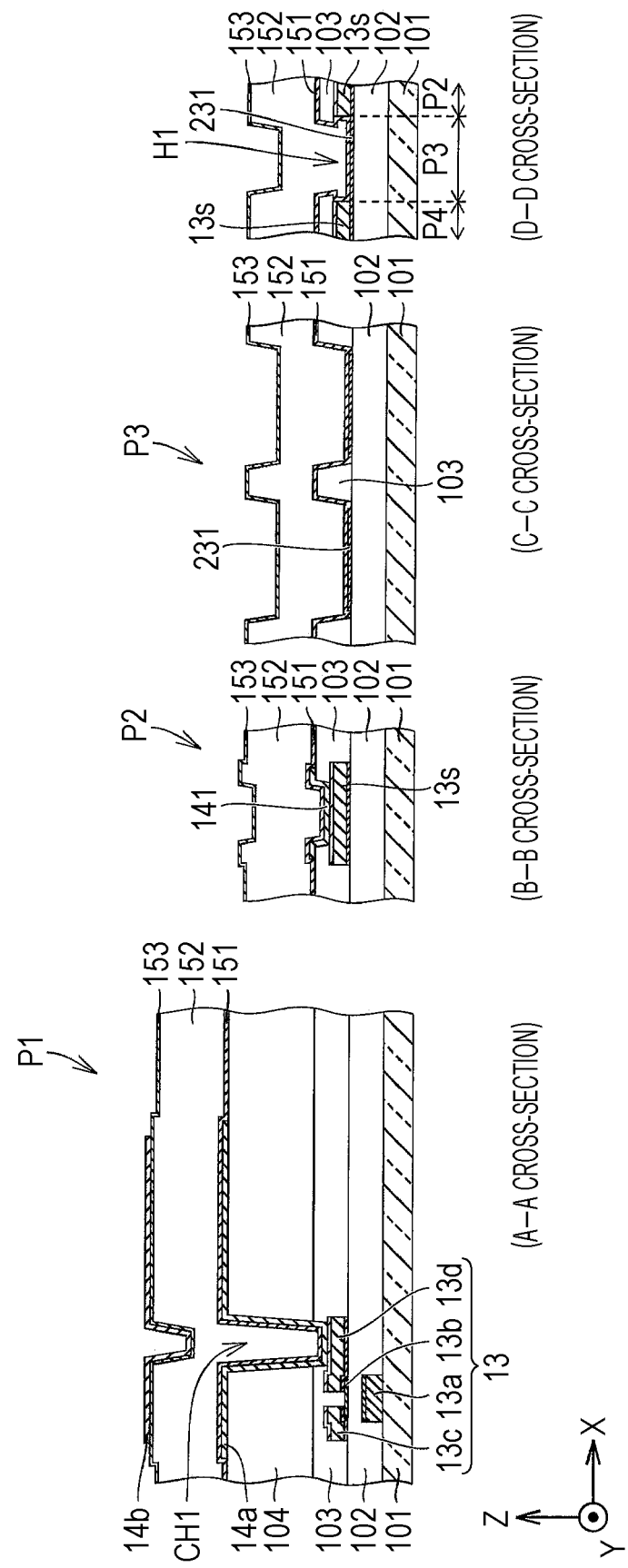
FIG. 5M illustrates cross-sectional views of a step of patterning the metal film, shown in FIG. 5L, that is to serve as the upper electrode.

Then, the transparent conductive film 142 is patterned by a photolithography process and dry etching (see FIG. 5M).

As a result, as shown in the A-A cross-section of FIG. 5M, an upper electrode 14b is formed over the p-type amorphous semiconductor layer 153 in the pixel part P1. Further, as shown in the B-B, C-C, and D-D cross-sections of FIG. 5M, the transparent conductive film 142 is removed from the terminal part P2, the connection part P3, and the guard ring part P4.

Figure 5N:
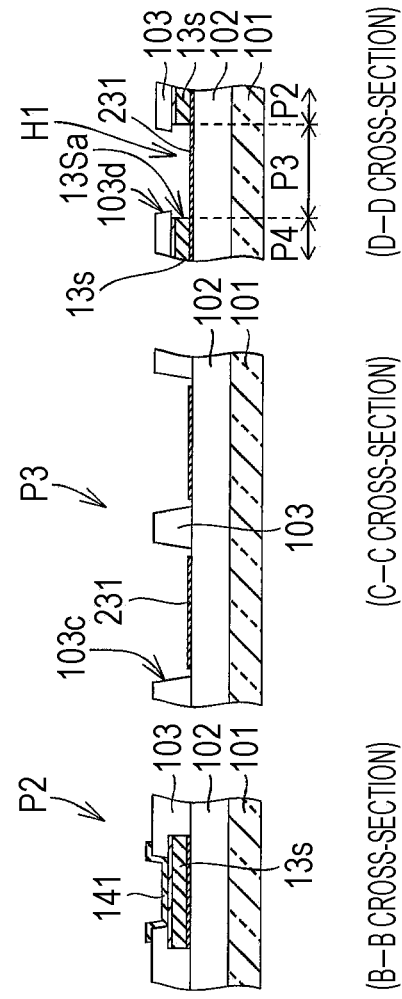
FIG. 5N illustrates cross-sectional views of a step of patterning the n-type amorphous semiconductor layer, the intrinsic amorphous semiconductor layer, and the p-type amorphous semiconductor layer shown in FIG. 5M.
Figure 50:
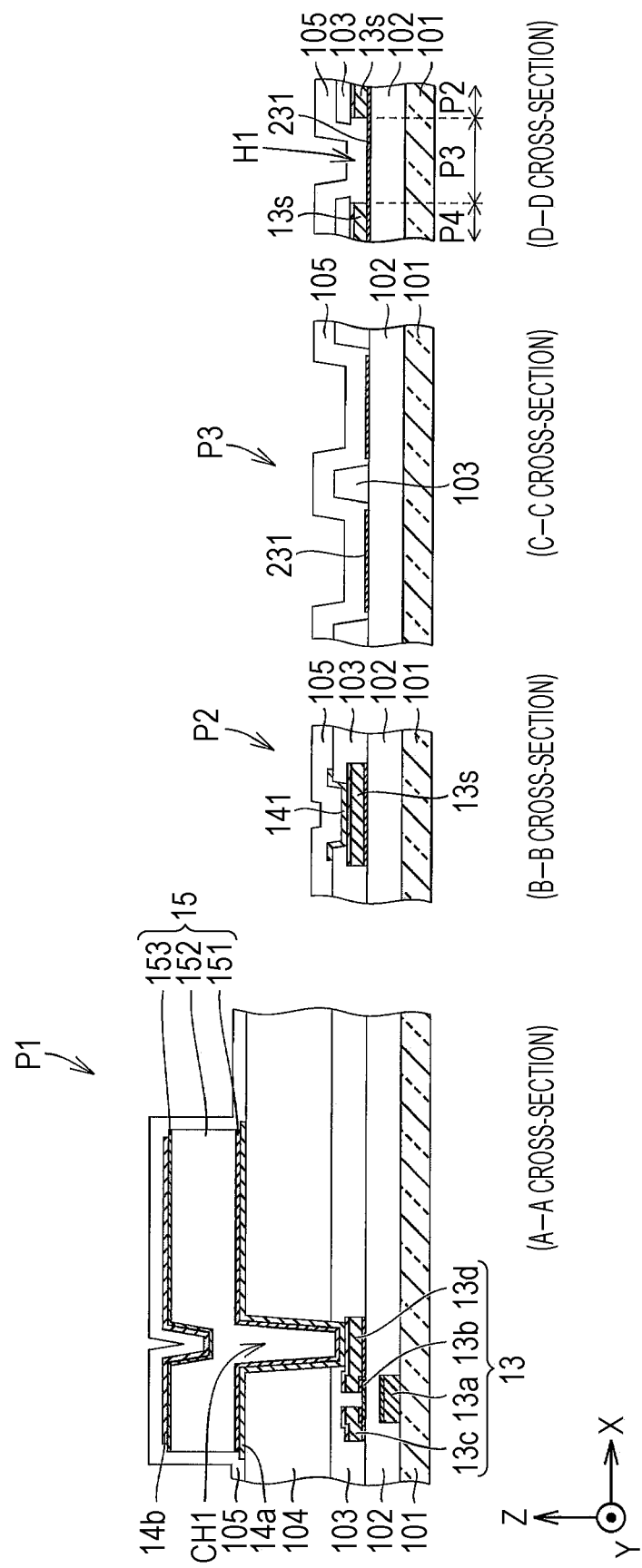

Next, the n-type amorphous semiconductor layer 151, the intrinsic amorphous semiconductor layer 152, and the p-type amorphous semiconductor layer 153 are patterned by a photolithography process and dry etching (see FIG. 5N).

As a result, as shown in the A-A cross-section of FIG. 5N, a photoelectric conversion layer 15 is formed in the pixel part P1. Further, as shown in the B-B, C-C, and D-D cross-sections of FIG. 5N, the n-type amorphous semiconductor layer 151, the intrinsic amorphous semiconductor layer 152, and the p-type amorphous semiconductor layer 153 are removed from the terminal part P2 and the connection part P3.

Next, a third insulating film 105 composed of silicon nitride (SiN) is formed, for example, by a plasma CVD method (see FIG. 5O). After that, the third insulating film 105 is patterned by a photolithography process and dry etching (see FIG. 5P).

Figure 5P:
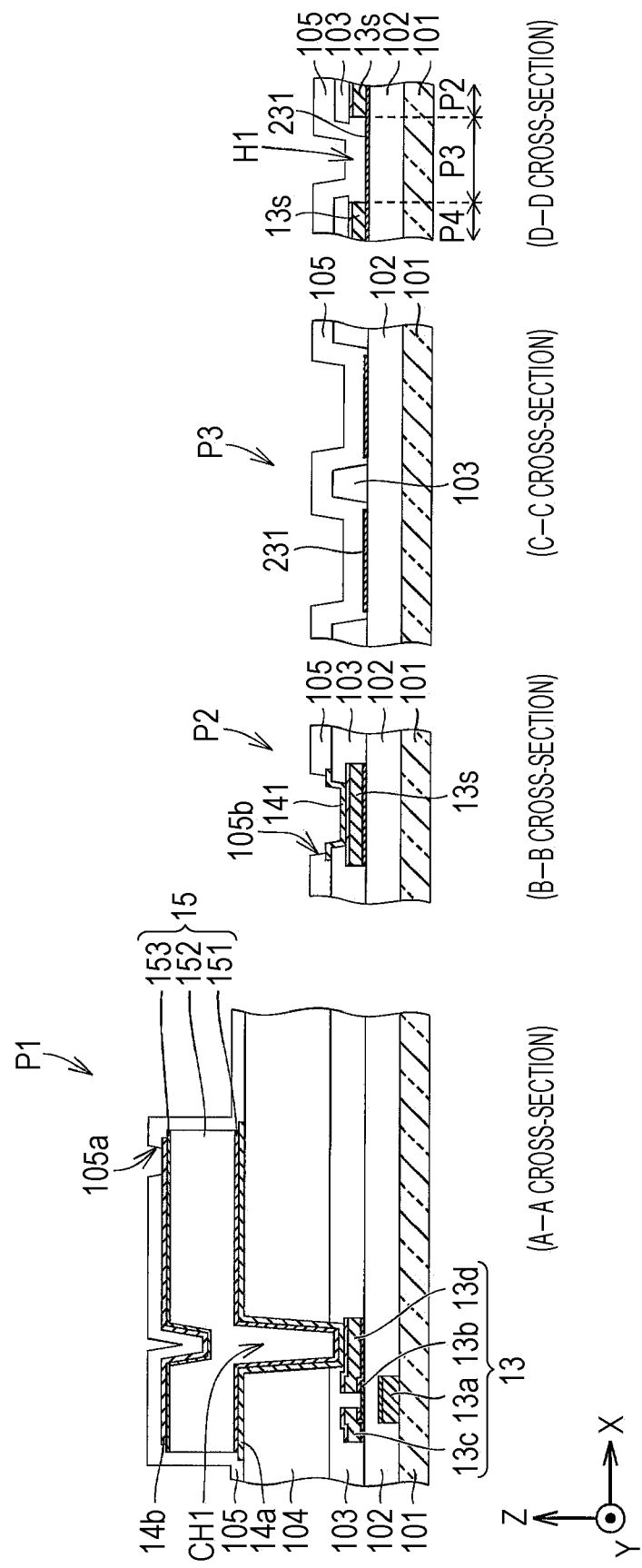
FIG. 5P illustrates cross-sectional views of a step of patterning the third insulating film shown in FIG. 5O.

As a result, as shown in the A-A cross-section of FIG. 5P, an opening 105a is formed in the third insulating film 105 over the upper electrode 14b in the pixel part P1. Further, in the terminal part P2, as shown in the B-B cross-section of FIG. 5P, an opening 105b is formed in the third insulating film 105 over the lower electrode layer 141.

Figure 5Q:
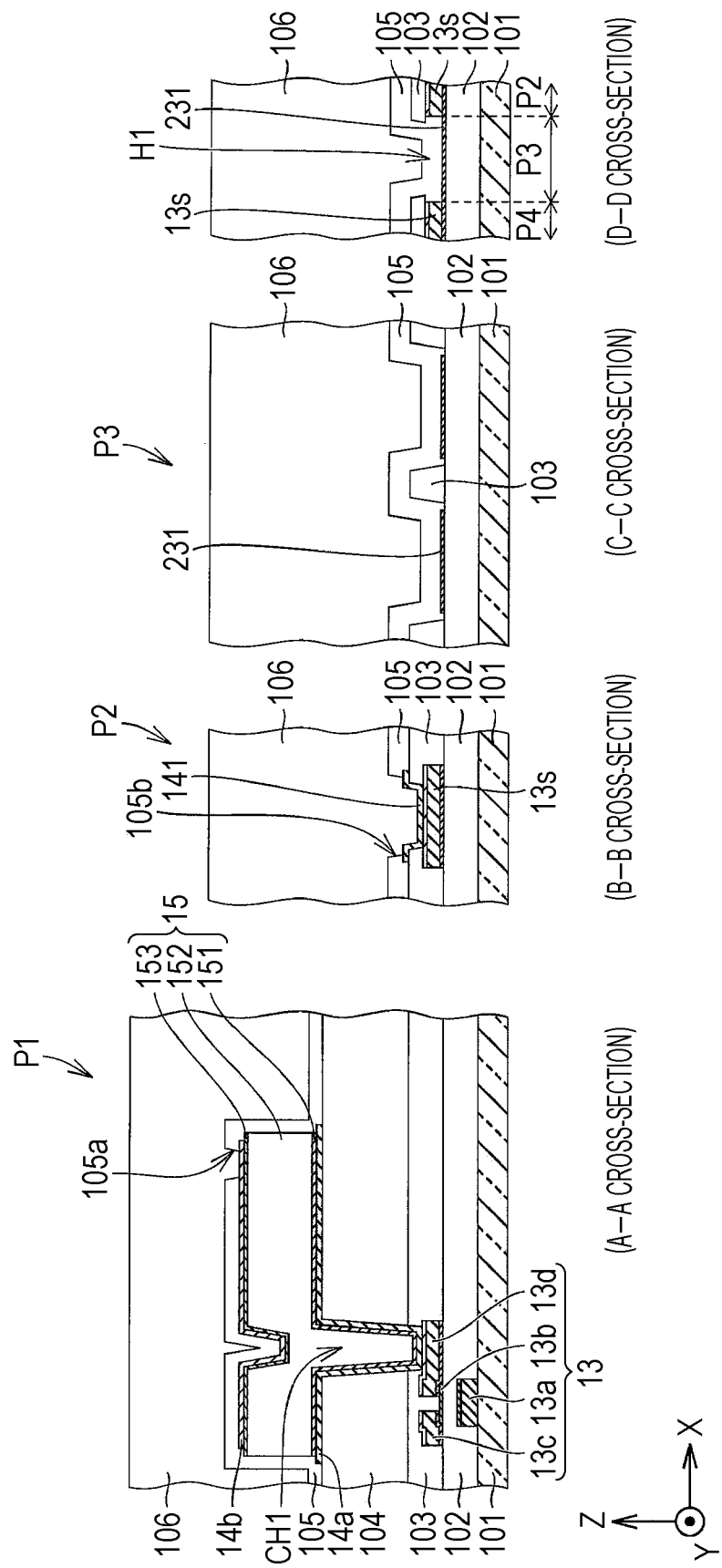
FIG. 5Q illustrates cross-sectional views of a step of forming a fourth insulating film shown in FIG. 4A.

Then, a fourth insulating film 106 made of acrylic resin or siloxane resin is formed, for example, by a slit coating method (see FIG. 5Q). After that, the fourth insulating film 106 is patterned by a photolithography process (see FIG. 5R).

Figure 5R:
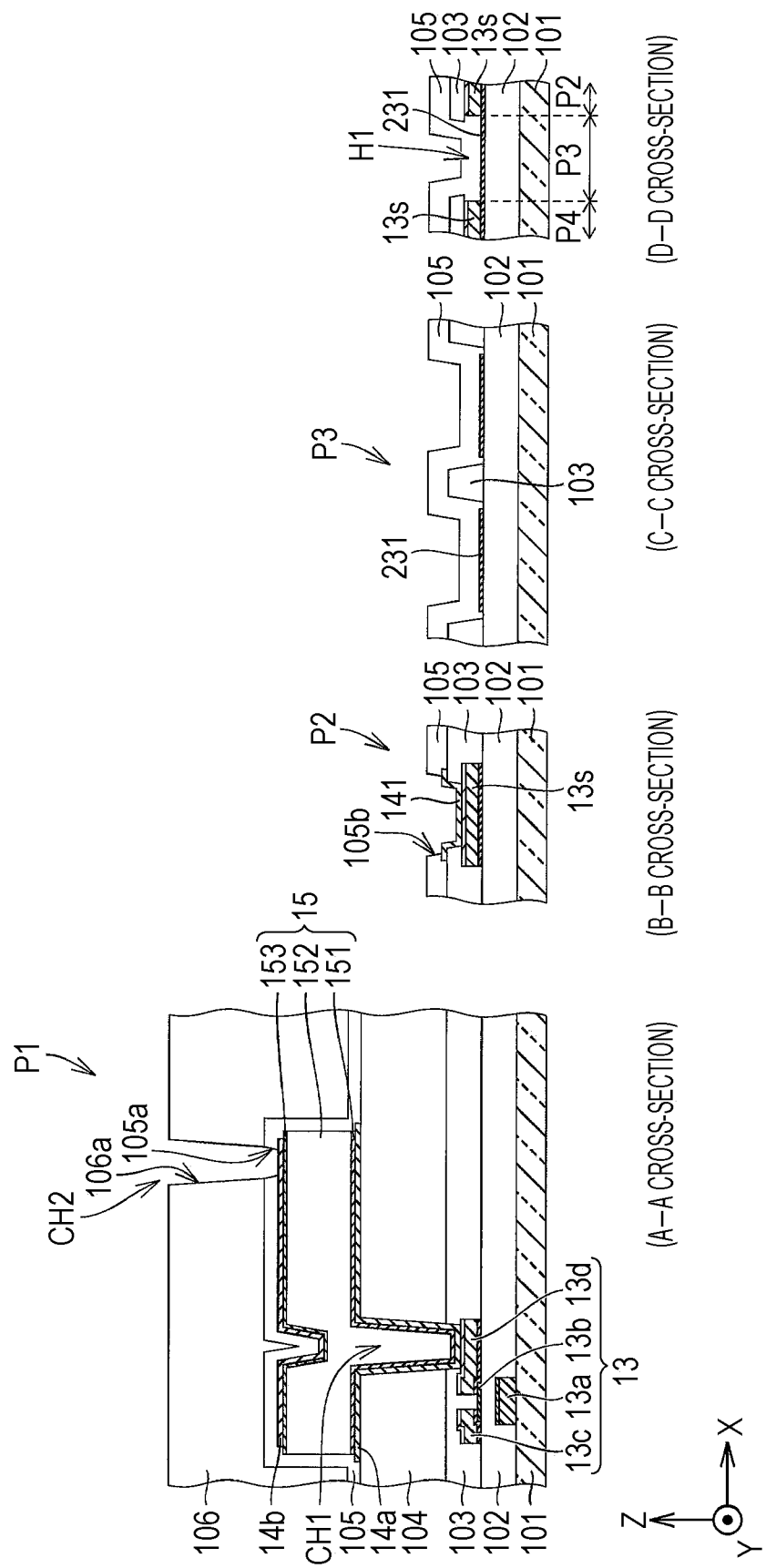
FIG. 5R illustrates cross-sectional views of a step of patterning the fourth insulating film shown in FIG. 5Q.

As a result, as shown in the A-A cross-section of FIG. 5R, an opening 106a is formed in the fourth insulating film 106 over the opening 105a in the pixel part P1, whereby a contact hole CH2 is formed. As shown in the B-B, C-C, and D-D cross-sections of FIG. 5R, the fourth insulating film 106 is removed from the terminal part P2, the connection part P3, and the guard ring part P4.

Next, a metal film 160 in which molybdenum nitride (MoN), aluminum (Al), and titanium (Ti) are stacked in this order is formed, for example, by a sputtering method (see FIG. 5S). After that, the metal film 160 is patterned by a photolithography process and wet etching (see FIG. 5T). The wet etching of the metal film 160 involves the use of an etchant containing acetic acid, nitride acid, and phosphoric acid.

Figure 5T:
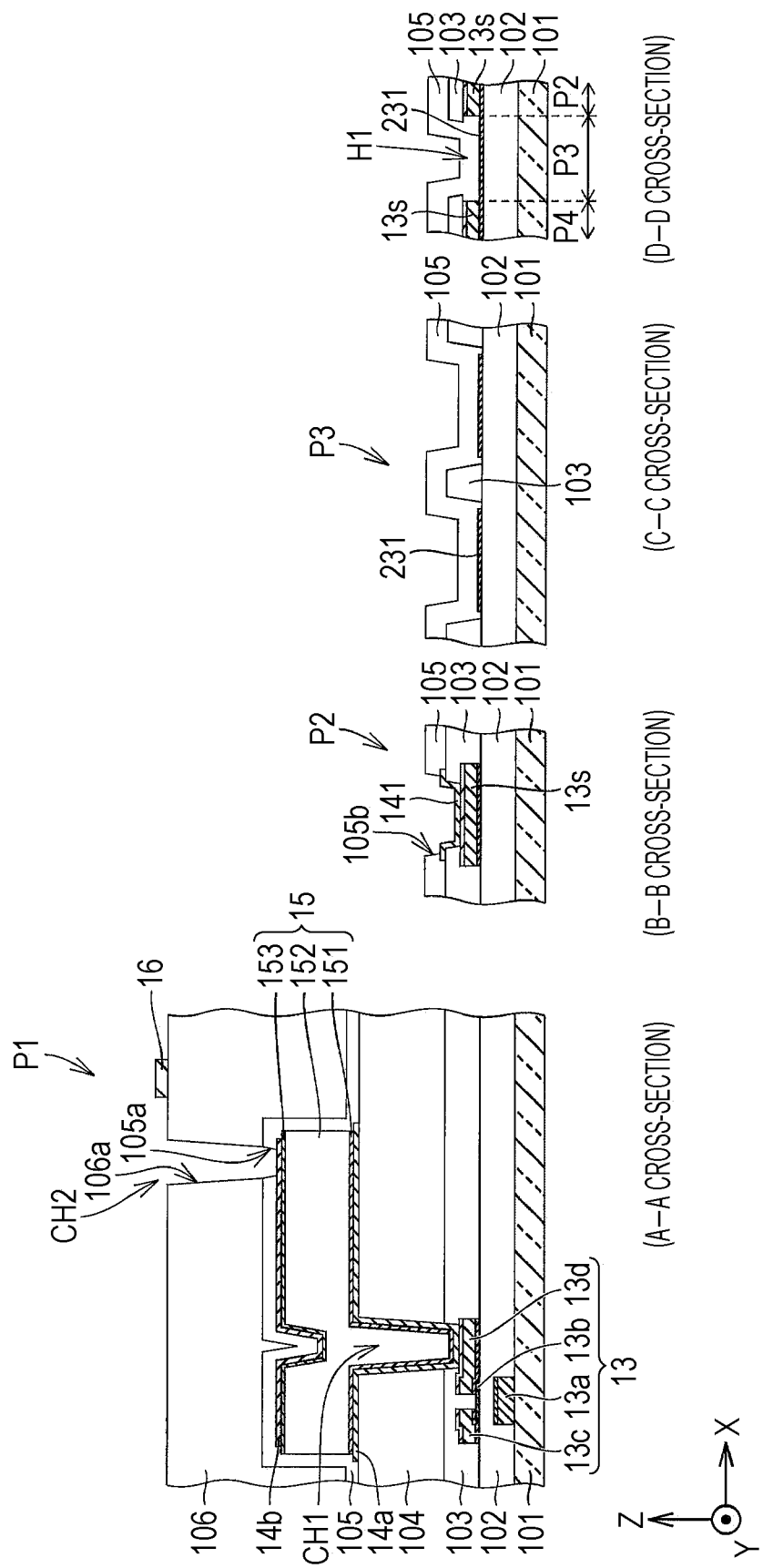
FIG. 5T illustrates cross-sectional views of a step of patterning the metal film, shown in FIG. 5S, that is to serve as the bias wire.

As a result, in the pixel part P1, as shown in the A-A cross-section of FIG. 5T, a bias wire 16 is formed on the outside of the contact hole CH2 over the fourth insulating film 106. At this point in time, as shown in the B-B, C-C, and D-D cross-sections of FIG. 5T, the metal film 160 is removed from the terminal part P2, the connection part P3, and the guard ring part P4.

Figure 5U:
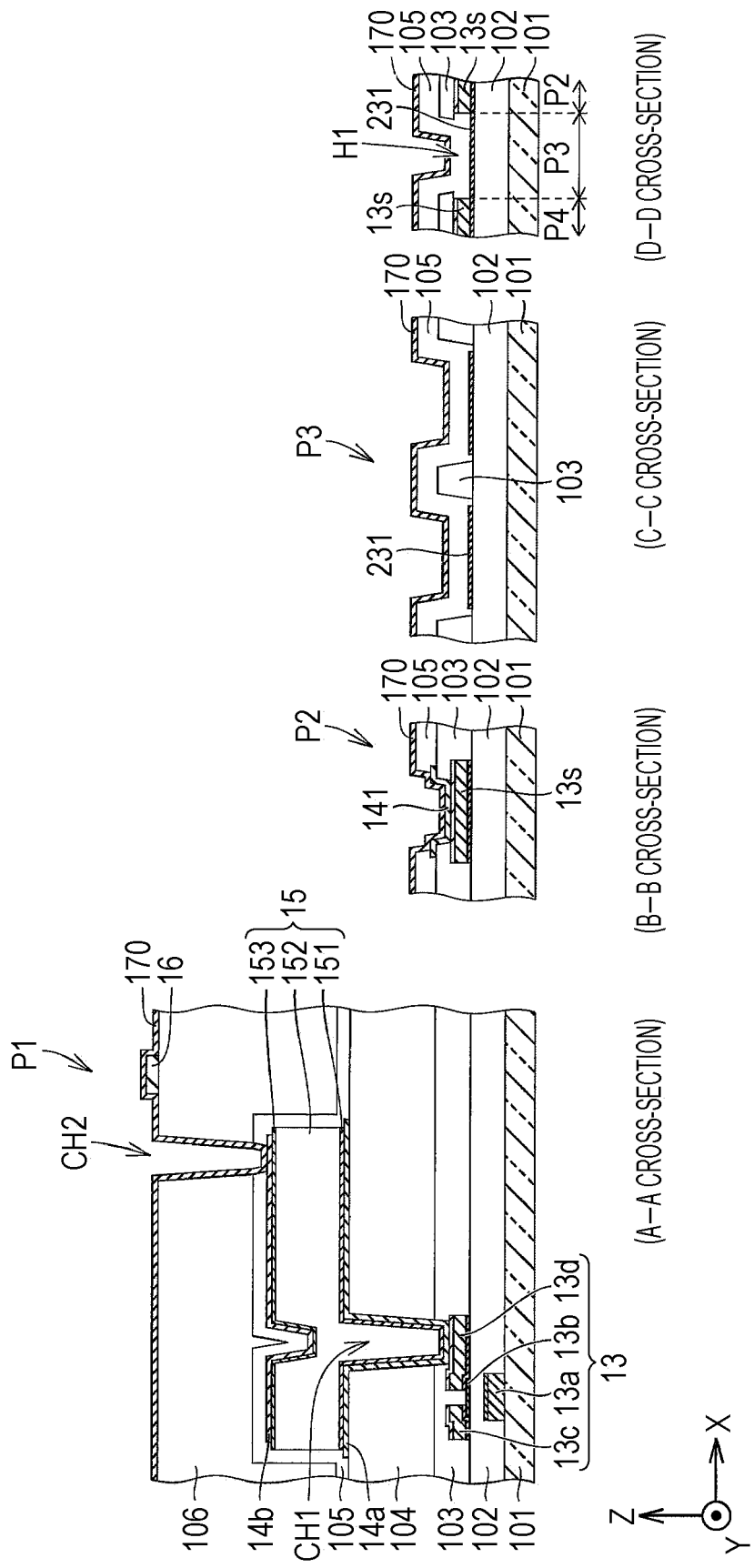
FIG. 5U illustrates cross-sectional views of a step of forming a transparent conductive film shown in FIG. 4.

Next, a transparent conductive film 170 composed of ITO is formed, for example, by a sputtering method (see FIG. 5U). After that, the transparent conductive film 170 is patterned by a photolithography process and dry etching (see FIG. 5V).

Figure 5V:
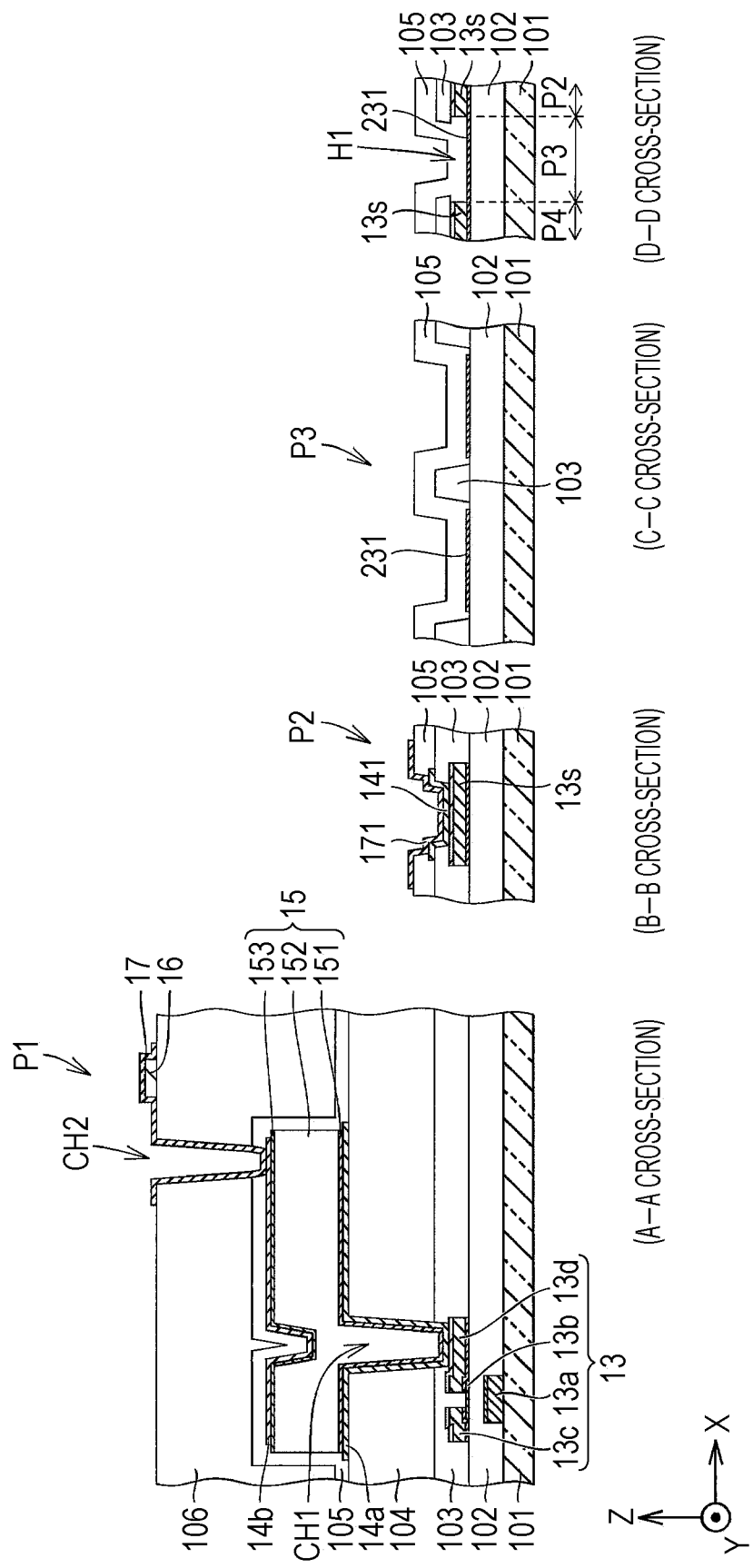
FIG. 5V illustrates cross-sectional views of a step of forming the transparent conductive film shown in FIG. 5U.

As a result, in the pixel part P1, as shown in the A-A cross-section of FIG. 5V, a transparent conductive film 17 connected to the bias wire 16 and connected to the photoelectric conversion layer 15 via the contact hole CH2 is formed. At this point in time, as shown in the B-B, C-C, and D-D cross-sections of FIG. 5V, the metal film 160 is removed from the terminal part P2, the connection part P3, and the guard ring part P4.

Figure 5W:
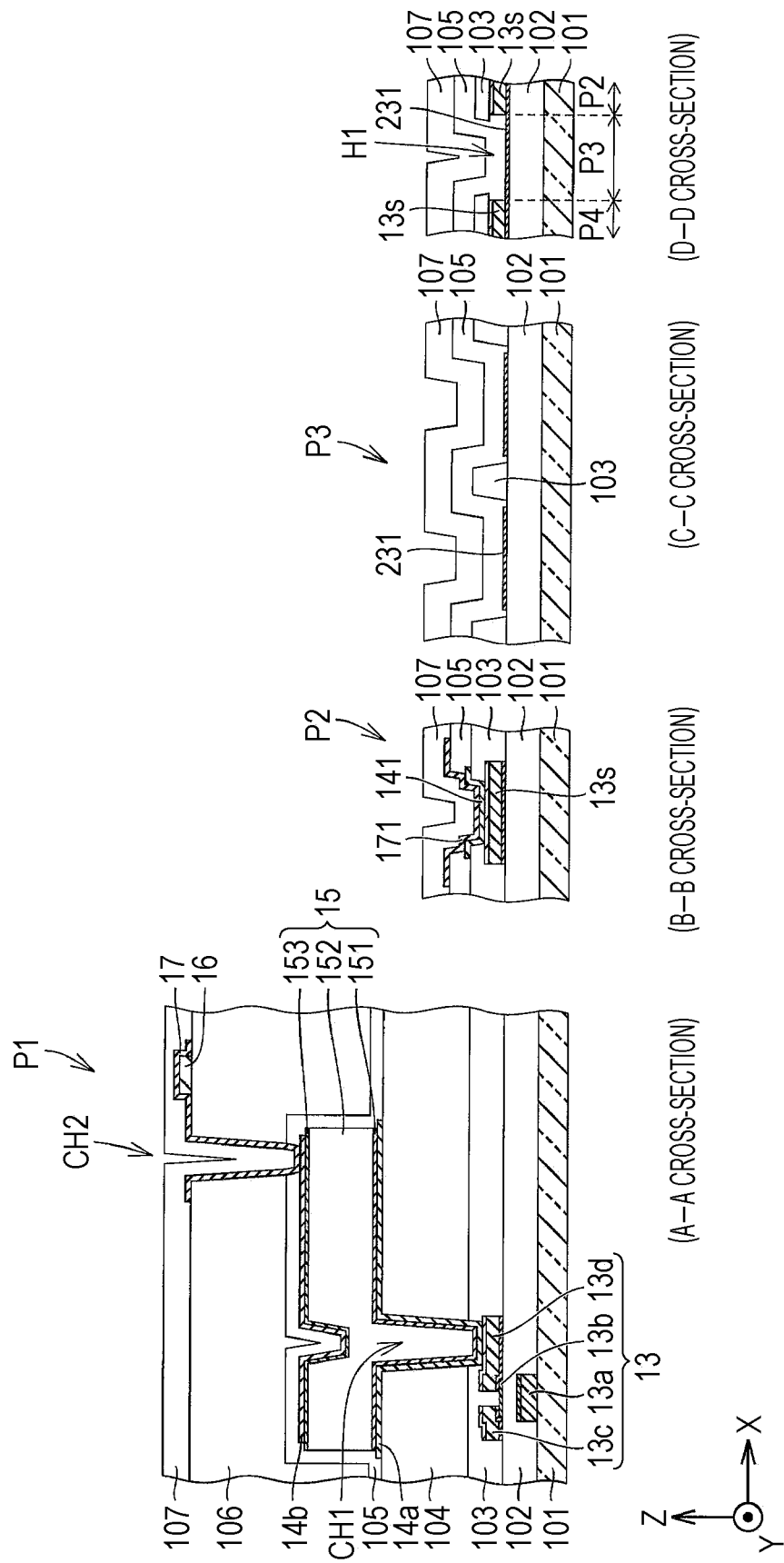
FIG. 5W illustrates cross-sectional views of a step of forming a fifth insulating film shown in FIG. 4A.

Then, a fifth insulating film 107 composed of silicon nitride (SiN) is formed, for example, by a plasma CVD method (see FIG. 5W). After that, the fifth insulating film 107 is patterned by a photolithography process and dry etching (see FIG. 5X).

Figure 5X:
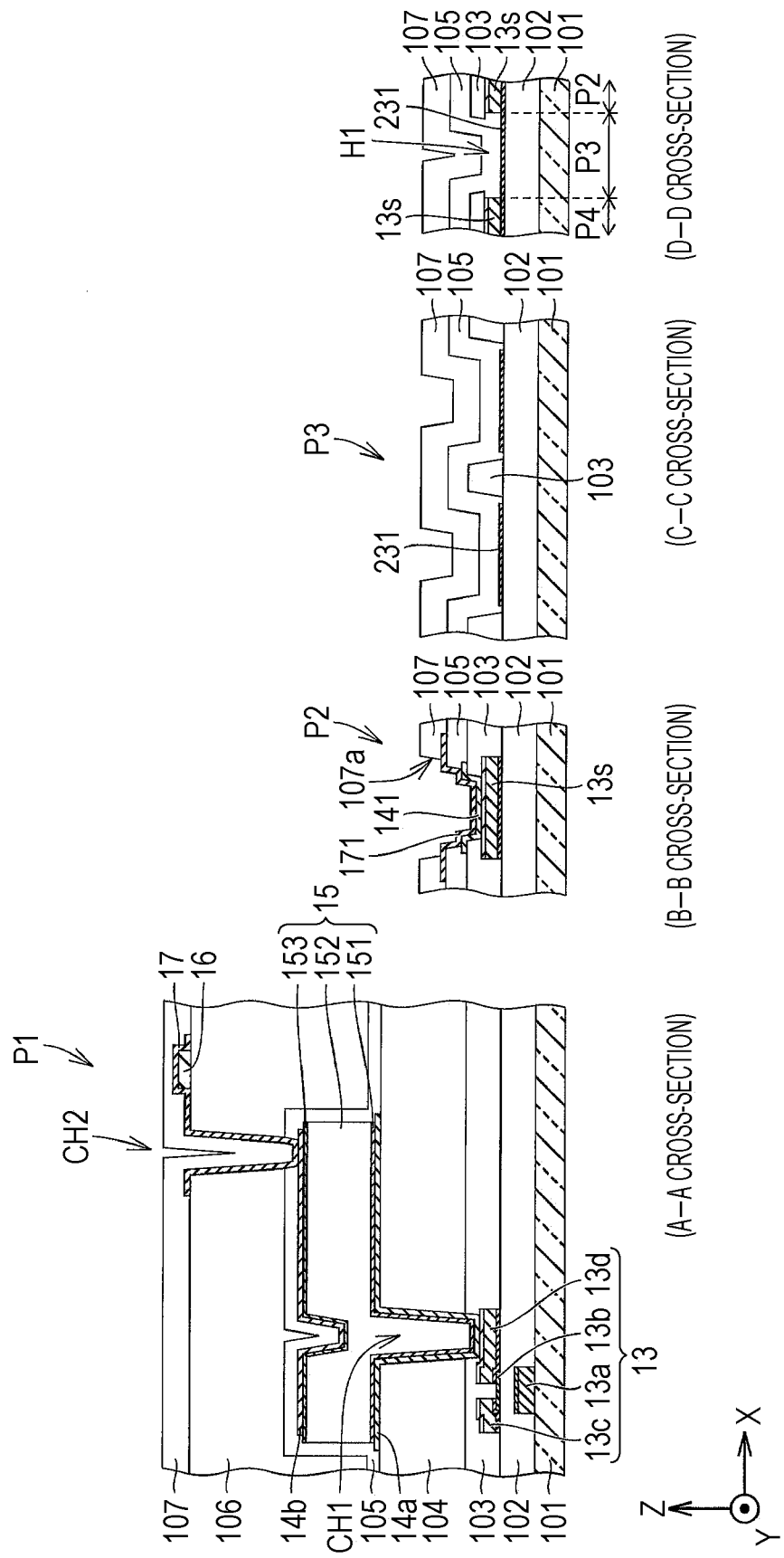
FIG. 5X illustrates cross-sectional views of a step of patterning the fifth insulating film shown in FIG. 5W.

As a result, in the terminal part P2, as shown in the B-B cross-section of FIG. 5X, an opening 107a is formed in the fifth insulating film 107 over a transparent conductive layer 171.

Next, a sixth insulating film 108 made of acrylic resin or siloxane resin is formed, for example, by a slit coating method over the fifth insulating film 107 (see FIG. 5Y). After that, the sixth insulating film 108 is patterned by a photolithography process (see FIG. 5Z). As a result, as shown in the B-B, C-C, and D-D cross-sections of FIG. 5W, the sixth insulating film 108 is removed from the terminal part P2, the connection part P3, and the guard ring part P4, whereby the imaging panel 1 according to the present embodiment is fabricated.

The imaging panel 1 is then cut at the location of division L (see FIG. 3) of the connection part P3.

As mentioned above, the metal film 231 composed of titanium (Ti) is the only metal film that is provided in the connection part P3, and the metal film 232, which is composed of aluminum (Al), of the source layer 13s is not disposed in the connection part P3. Since a film of a metal such as aluminum (Al) that is lower in resistance and hardness than titanium (Ti) is not provided in the connection part P3, a short circuit hardly takes place between the metal film 231 and another wire even when the imaging panel 1 is cut at the location of division L.

Further, a step of forming only the metal film 231 in the connection part P3 is executed in the steps of manufacturing the pixel part P1. Specifically, in the example of the first embodiment described above, the metal films 232 and 233 of the source layer 13s provided in the connection part P3 are etched at the same time as the etching by which the lower electrode 14a of the pixel part P1 is formed. This makes it possible to reduce the number of steps of manufacturing the imaging panel 1 as compared with a case where an etching step is separately executed only to remove the metal films 232 and 233 from the connection part P3.

(Operation of the X-ray Imaging Apparatus 100)

A description is given here of how the X-ray imaging apparatus 100 shown in FIG. 1 operates. First, X-rays are emitted from the X-ray source 3. At this point in time, the control unit 2 applies a predetermined voltage (bias voltage) to the bias wire 16 (see, for example, FIG. 3A). The X-rays emitted from the X-ray source 3 fall on the scintillator 1A through the subject S. The X-rays having fallen on the scintillator 1A are converted into fluorescence (scintillation light), and the scintillation light falls on the imaging panel 1. When the scintillation light falls on the photodiodes 12 provided in the pixels of the imaging panel 1, the scintillation light is converted into electric charge corresponding to the light intensity of the scintillation light. Signals corresponding to the electric charge produced through the conversion by the photodiodes 12 are read out by the signal readout unit 2B (see, for example, FIG. 2) through the source wires 10 when the TFTs 13 (see, for example, FIG. 3A) are in an on-state in accordance with gate voltages (positive voltages) that are outputted from the gate control unit 2A via the gate wires 11. Then, an X-ray image corresponding to the signals thus read out is generated by the control unit 2.

Modification 1

The structure of the terminal part P2 according to the first embodiment described above is not limited to the structure described above. The following describes a structure of the terminal part P2 which is different from that of the first embodiment.

FIG. 6 is a diagram showing a cross-sectional structure of a terminal part P21 according to Modification 1. In FIG. 6, components which are similar to those of the first embodiment are given the same signs. The following mainly describes components which are different from those of the first embodiment.

As shown in FIG. 6, the terminal part P21 differs from the terminal P2 of the first embodiment in that no lower electrode layer 141 is provided between the source layer 13s and the transparent conductive layer 171.

Figure 7H:
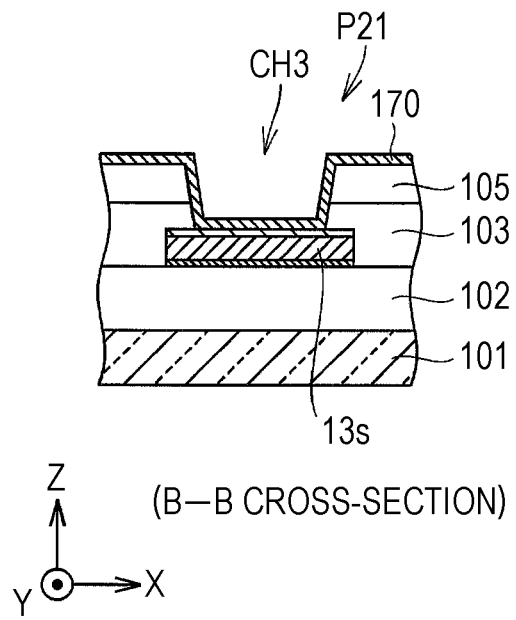
FIG. 7H is a cross-sectional view showing a state in which a transparent conductive film has been formed.

In this case, after execution of steps which are similar to those of FIGS. 5A to 5F described above, the first insulating film 103 is patterned by a method which is similar to the step of FIG. 5G, but no opening is formed in the first insulating film 103 in the terminal part P21 (see FIG. 7A).

After that, the second insulating film 104 is formed over the first insulating film 103 by a method which is similar to the step of FIG. 5H described above (see FIG. 7B), and the second insulating film 104 is removed from the terminal part P21 by a method which is similar to the step of FIG. 5I described above (see FIG. 7C).

Next, the metal film 140 is formed by a method which is similar to the step of FIG. 5J described above (see FIG. 7D), and the metal film 140 is patterned by a method which is similar to the step of FIG. 5K described above, whereby the metal film 140 is removed from the terminal part P21 (see FIG. 7E).

Then, after execution of steps which are similar to those of FIGS. 5L to 5N described above, the third insulating film 105 is formed by a method which is similar to the step of FIG. 5O described above (see FIG. 7F), and after that, the third insulating film 105 is patterned by a method which is similar to the step of FIG. 5P. As a result, the contact hole CH3 bored through the first insulating film 103 and the third insulating film 105 is formed over the source layer 13s in the terminal part P21 (see FIG. 7G).

Figure 7I:
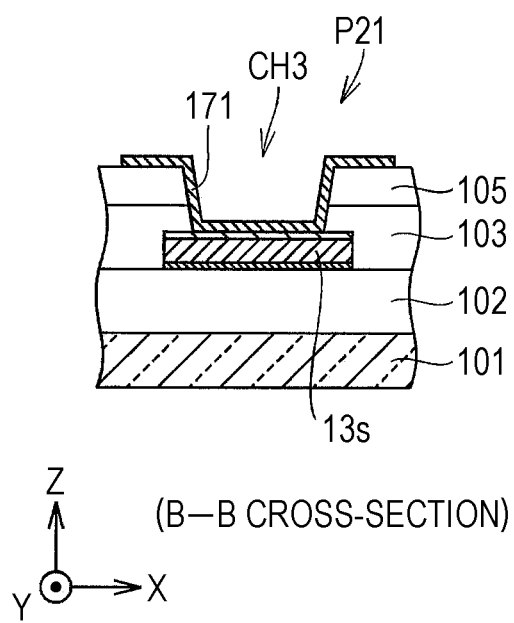
FIG. 7I is a cross-sectional view showing a state in which the transparent conductive film shown in FIG. 7H has been patterned.

Next, after execution of steps which are similar to those of FIGS. 5Q to 5T described above, the transparent conductive film 170 is formed by a method which is similar to the step of FIG. 5U described above (see FIG. 7H), and the transparent conductive film 170 is patterned by a method which is similar to the step of FIG. 5V described above (see FIG. 7I). After that, the terminal part P21 shown in FIG. 6 is formed by execution of steps which are similar to those of FIGS. 5W to 5Z described above.

Modification 2

Although the first embodiment and Modification 1 described above have illustrated an example in which in patterning the metal film 140, i.e. in the step of forming the lower electrode 14a, the metal films 233 and 232 of the source layer 13s are removed from the connection part P3, the metal films 233 and 232 may be removed in the step of forming the transparent conductive film 17.

In this case, in patterning the first insulating film 103 and the third insulating film 105 in the steps of FIGS. 5G and 5P described above, respectively, the first insulating film 103 and the third insulating film 105 are not etched in the connection part P3. After that, after execution of the steps of FIGS. 5Q to 5T and execution of the patterning by which to form the bias wire 16 and before formation of the transparent conductive film 170, the first insulating film 103 and the third insulating film 105 are simultaneously subjected to dry etching with fluorine gas in the connection part P3, whereby openings are formed in the first insulating film 103 and the third insulating film 105. Then, the transparent conductive film 170 is formed in the step of FIG. 5U, and in the step of FIG. 5V, the transparent conductive film 170 is subjected to wet etching with an etchant containing oxalic acid, acetic acid, nitric acid, and phosphoric acid. As a result, the transparent conductive film 170 is removed from the connection part P3, whereby the metal films 233 and 232 of the source layer 13s are removed from the connection part P3.

Second Embodiment

The first embodiment described above has illustrated an example in which by the wet etching of the metal film 140 in the formation of the lower electrode 14a, the metal films 232 and 233 are removed with only the metal film 231 left in the connection part P3. The present embodiment describes a method for leaving only the metal film 231 in the connection part P3 by a method which is different from that of the first embodiment.

Figure 8:
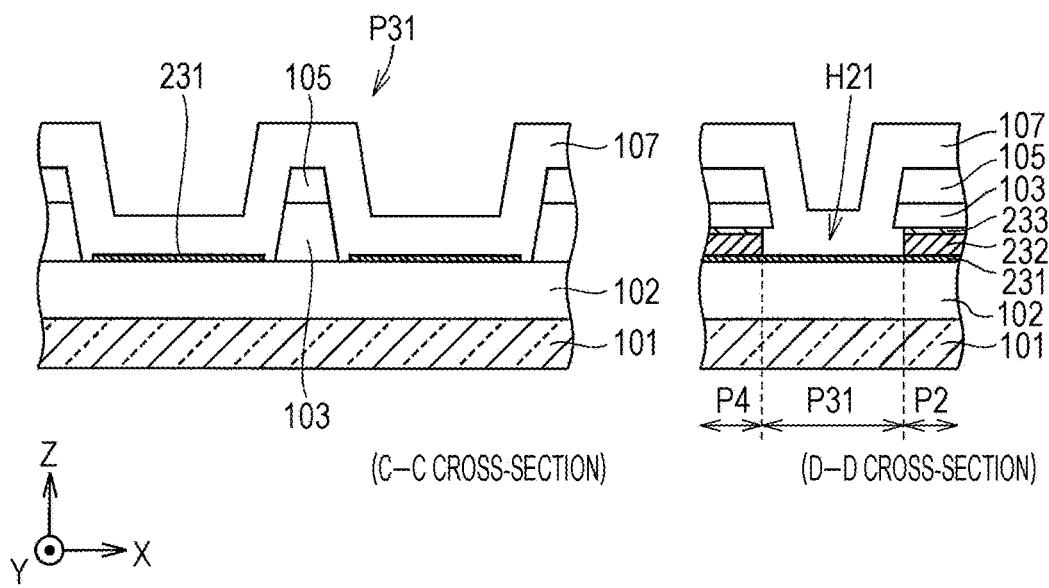
FIG. 8 illustrates cross-sectional views of a connection part and a guard ring part according to a third embodiment.

The C-C cross-section of FIG. 8 is a cross-sectional view of a connection part P31 according to the present embodiment, and the D-D cross-section of FIG. 8 is a cross-sectional view of a guard ring part P41 according to the present embodiment and the connection part P31. In FIG. 8, components which are similar to those of the first embodiment are given the same signs. The following mainly describes points of difference from the first embodiment.

The present embodiment differs from the first embodiment in that as shown in FIG. 8, the third insulating film 105 is provided only over the first insulating film 103 and is discontinued by being spaced between the terminal part P21 and the guard ring part P41.

Figure 9A:
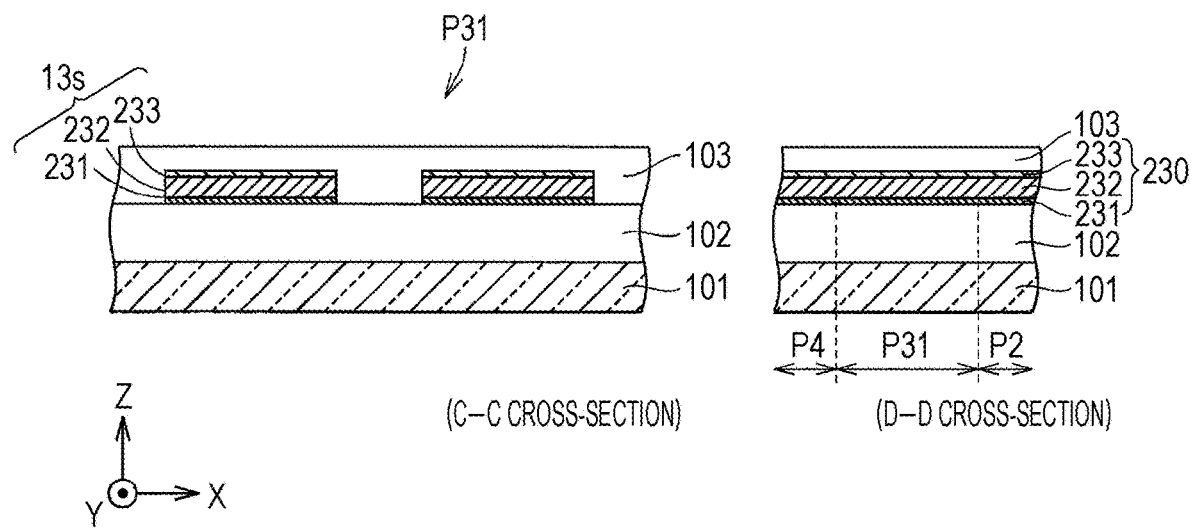
FIG. 9A illustrates diagrams explaining a step of fabricating the connection part and the guard ring part shown in FIG. 8 and cross-sectional views showing a state of the connection part and the guard ring part after patterning of a first insulating film.

In this case, after execution of steps which are similar to those of FIGS. 5A to 5F described above, the first insulating film 103 is patterned by a method which is similar to the step of FIG. 5G. At this point in time, the first insulating film 103 is not patterned in the connection part P31 and the guard ring part P41 (see FIG. 9A).

Next, by steps which are similar to those of FIGS. 5H to 5J described above, a film of titanium (Ti) is formed as the metal film 140 to serve as the lower electrode 14a, and in the step of FIG. 5K, the metal film 140 is patterned. At this point in time, the metal film 140 is etched by dry etching that involves the use of chlorine gas. This causes the lower electrode 14a and the lower electrode layer 141 to be formed in the pixel part P1 and the terminal part P2, respectively, and causes only the metal film 140 to be removed from the connection part P31 and the guard ring part P41.

Figure 9B:
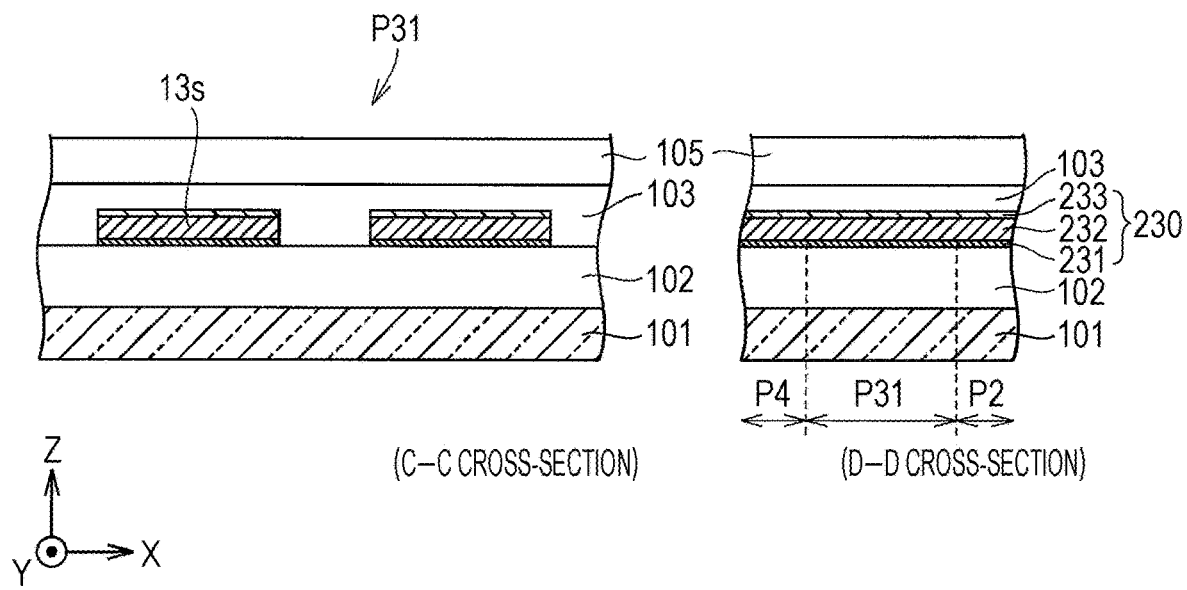
FIG. 9B illustrates cross-sectional views showing a state in which a third insulating film has been formed.
Figure 9C:
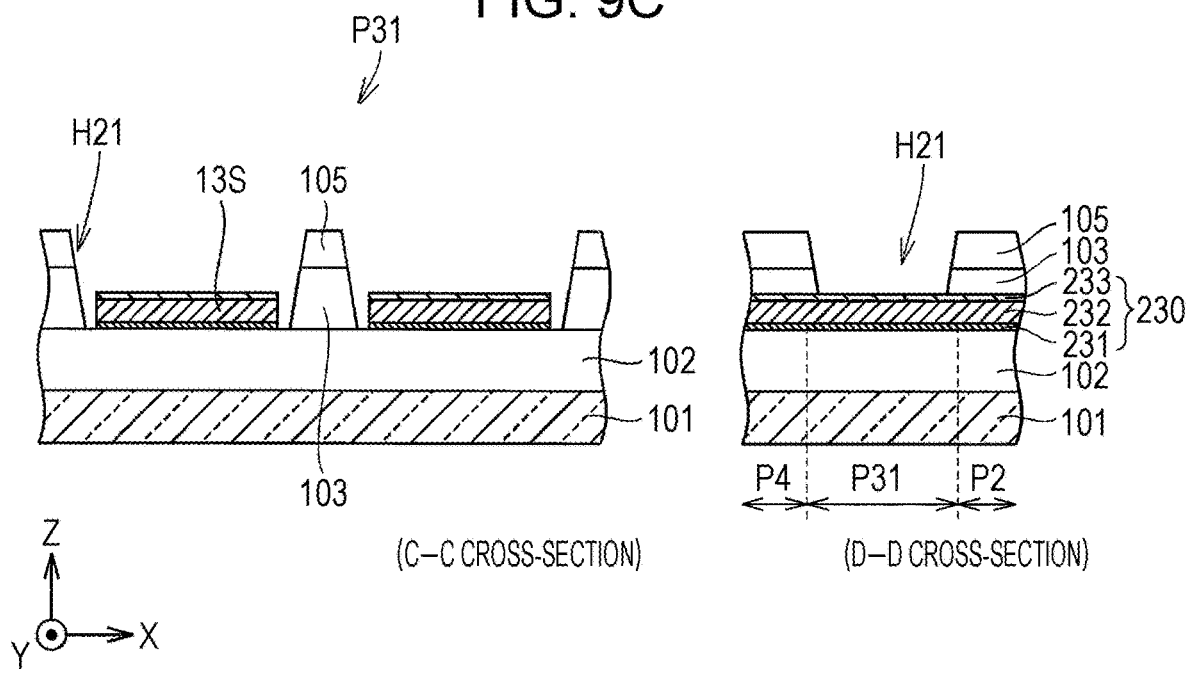
FIG. 9C illustrates cross-sectional views showing a state in which an opening bored through the first and third insulating films shown in FIG. 9B has been formed.

Then, after execution of steps which are similar to those of FIGS. 5L to 5N, the third insulating film 105 is formed by a method which is similar to the step of FIG. 5O (see FIG. 9B), and the third insulating film 105 is patterned by a method which is similar to the step of FIG. 5P (see FIG. 9C). As a result, in the connection part P31, an opening H21 bored through the first insulating film 103 and the third insulating film 105 is formed, and the first insulating film 103 and the third insulating film 105 are spaced by the connection part P31.

Figure 9D:
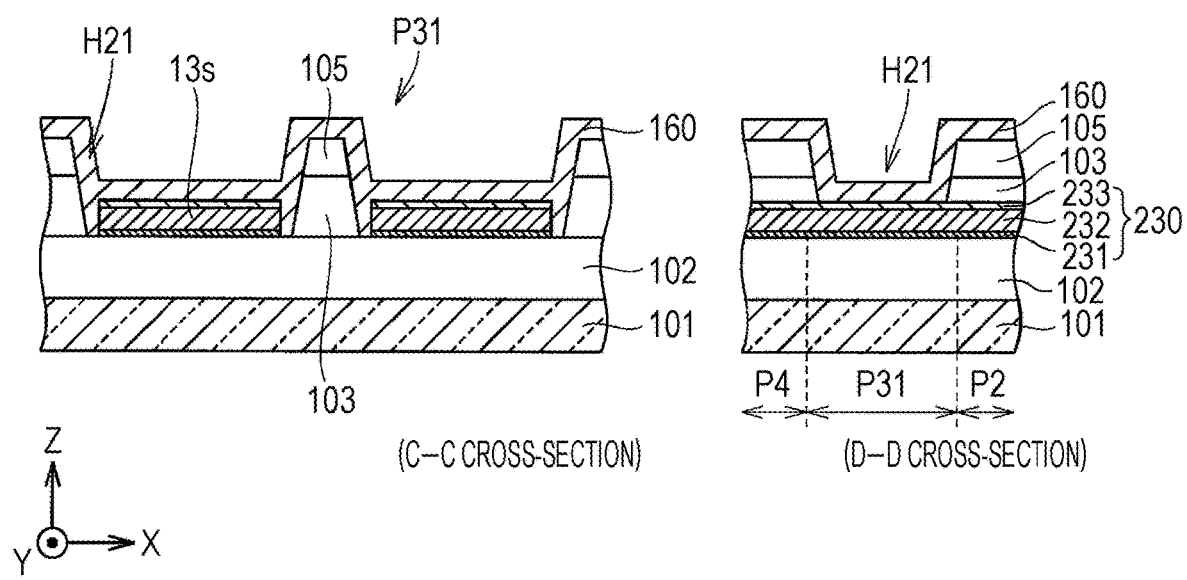
FIG. 9D illustrates cross-sectional views showing a state in which a metal film that is to serve as a bias wire has been formed.
Figure 9E:
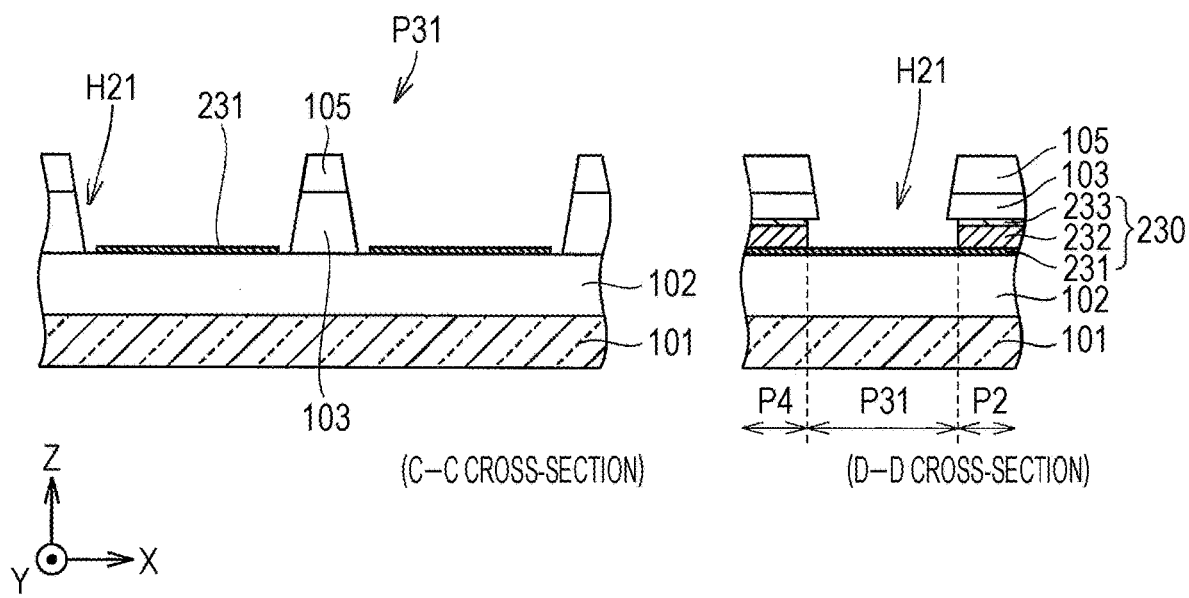
FIG. 9E illustrates cross-sectional views showing a state in which the metal film, shown in FIG. 9D, that is to serve as the bias wire has been removed and the lowermost metal film of a source layer has remained.

After that, steps which are similar to those of FIGS. 5Q and 5R described above are executed in sequence. By a method which is similar to the step of FIG. 5S, a metal film 160 in which molybdenum nitride (MoN), aluminum (Al), and molybdenum nitride (MoN) are stacked is formed to serve as the bias wire 16 (see FIG. 9D). The metal film 160 is patterned by a method which is similar to the step of FIG. 5T (see FIG. 9E). At this point in time, the metal film 160 is removed from the connection part P31, the guard ring part P41, and the terminal part P2, and at the same time, the metal films 232 and 233, which are composed of molybdenum nitride (MoN) and aluminum (Al), respectively, of the source layer 13s are removed from the connection part P31, and the metal film 231 composed of titanium (Ti) remains.

Then, the connection part P31 and the guard ring part P41 as shown in FIG. 8 are formed by steps which are similar to those of FIGS. 5U to 5Z described above.

Modification 1

The terminal part according to the second embodiment described above has a structure which is similar to that of the terminal part P2 according to the first embodiment shown in FIG. 4B. Although the terminal part P2 has the lower electrode layer 141 provided between the source layer 13s and the transparent conductive layer 171, the terminal part P2 is not limited to this structure.

For example, the lower electrode layer 141 may be replaced by a metal film (bias wire layer) made of the same material as the bias wire 16. In this case, steps which are similar to those of FIGS. 7A to 7C of Modification 1 of the first embodiment described above are executed. After that, in the step of FIG. 7D, a film of titanium (Ti) is formed as the metal film 140 to serve as the lower electrode 14a, and in the step of FIG. 7E, the metal film 140 is patterned. At this point in time, the metal film 140 is etched by dry etching that involves the use of chlorine gas. This causes the lower electrode 14a and the lower electrode layer 141 to be formed in the pixel part P1 and the terminal part P2, respectively, and causes only the metal film 140 to be removed from the connection part P31 and the guard ring part P41.

After that, the metal film 160 that is to serve as the bias wire 16 has been formed by steps which are similar to those of FIGS. 5L to 5O, and the metal film 160 is patterned by a method which is similar to that of FIG. 5T. At this point in time, the metal film 160 is not removed from the terminal part P2, and a bias wire layer constituted by the metal film 160 is formed over the source layer 13s. In the connection part P31 and the guard ring part P41, the metal film 160 is removed, and the metal films 232 and 233 of the source layer 13s removed, while the metal film 231 remains. After the formation of the bias wire layer, steps which are similar to those of FIGS. 5U to 5Z need only be executed.

Modification 2

Although Modification 1 described above has illustrated an example in which the lower electrode layer 141 is replaced by the bias wire layer, the terminal part P2 does not need to be provided with the lower electrode layer 141 or the bias wire layer. That is, the terminal part P2 shown in FIG. 4B may be provided with only the transparent conductive layer 171 in contact with the source layer 13s.

In this case, steps which are similar to those of FIGS. 7A to 7E are executed in a manner similar to Modification 1 described above, and steps which are similar to those of FIGS. 5L to 5T are executed. In the step of FIG. 5U, the transparent conductive film 170 is formed, and then by a method which is similar to the step of FIG. 5V, the transparent conductive film 170 is patterned. The transparent conductive film 170 is subjected to wet etching, for example, with an etchant containing oxalic acid, acetic acid, nitric acid, and phosphoric acid. At this point in time, in the connection part P31 and the guard ring part P41, the transparent conductive film 170 is removed, and the metal films 232 and 233 of the source layer 13s are removed, while the metal film 231 remains. After that, steps which are similar to those of FIGS. 5W to 5Z need only be executed.

Third Embodiment

Although the first embodiment described above has illustrated an example in which at least a part of the source layer 13s is provided as the lower most conductive layer in the terminal part P2, the connection part P3, and the guard ring part P4, at least a part of a gate layer may be provided.

Figure 10:
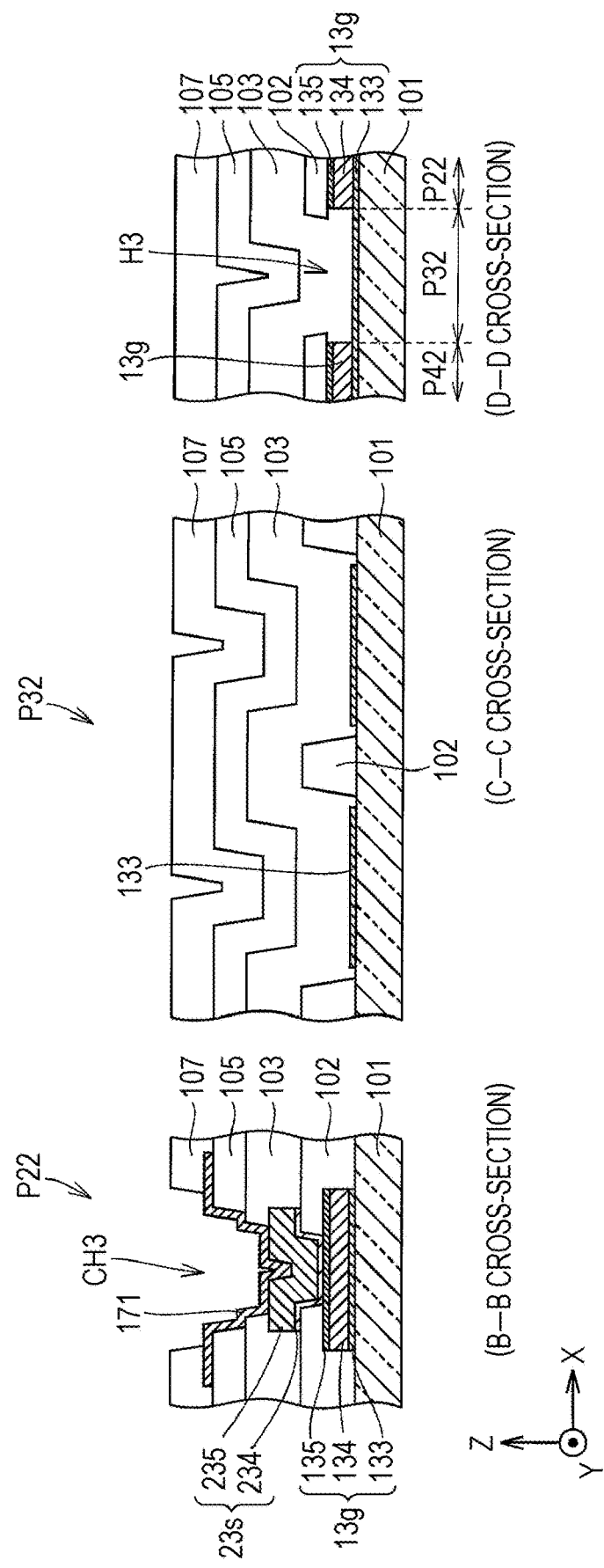
FIG. 10 illustrates cross-sectional views of a terminal part, the connection part, and the guard ring part according to the third embodiment.

FIG. 10 illustrates cross-sectional view of a terminal part 22, a connection part 32, and a guard ring part P42 according to the present embodiment. In FIG. 10, components which are similar to those of the first embodiment are given the same signs. The following mainly describes points of difference from the first embodiment.

Although not illustrated in FIG. 10, a cross-sectional structure of a pixel part according to the present embodiment has substantially the same structure as that of the first embodiment, except for differences in material of a source electrode, a drain electrode, and a gate electrode. Specifically, whereas the source electrode and the drain electrode in the first embodiment have a three-layer structure in which titanium (Ti), aluminum (Al), and molybdenum nitride (MoN) are stacked in this order, the source electrode and the drain electrode in the present embodiment have a two-layer structure in which molybdenum (Mo) and copper (Cu) are stacked in this order. Further, whereas the gate electrode in the first embodiment has a two-layer structure in which titanium (Ti) and copper (Cu) are stacked in this order, the gate electrode in the present embodiment has a three-layer structure in which titanium (Ti), aluminum (Al), and copper (Cu) are stacked in this order.

As shown in FIG. 10, the terminal part 22, the connection part 32, and the guard ring part P42 are structured such that a gate layer 13g or a metal film 133, which is a part of the gate layer 13g, is provided over the substrate 101.

The gate layer 13g is made of the same material as the gate electrode (not illustrated) of the pixel part P1. That is, in this example, the gate electrode and the gate layer 13g are constituted by a laminated film in which the metal film 133 composed of titanium (Ti), a metal film 134 composed of aluminum (Al), and a metal film 135 composed of molybdenum nitride (MoN) are stacked in this order as mentioned above.

As shown in the B-B cross-section, the terminal part 22 is structured such that the gate insulating film 102 is disposed with a space over the gate layer 13g so that the gate layer 13g and a source layer 23s are connected to each other. The source layer 23s is made of the same material as the source electrode 13c and drain electrode 13d of a TFT 13 provided in the pixel part. As mentioned above, the source layer 23s is constituted by a metal layer (hereinafter referred to as "source layer 23s") in which a metal film 234 composed of molybdenum (Mo) and a metal film 235 composed of copper (Cu) are stacked in this order.

The first insulating film 103 has an opening over the source layer 23s, and the third insulating film 105 has an opening over the first insulating film 103. The contact hole CH3 is formed by these openings. The transparent conductive layer 171 is provided over the third insulating film 105 and is connected to the source layer 23s via the contact hole CH3. The fifth insulating film 107 is disposed over the transparent conductive layer 171 on the outside of the contact hole CH3.

As shown in the C-C cross-section and the D-D cross-section, the connection part P32 is structured such that the metal film 133 of the gate layer 13g is provided over the substrate 101 and that the gate insulating film 102 is provided in such a position as not to overlap the metal film 133. The first insulating film 103 is provided over the metal film 133 and the gate insulating film 102, and over the first insulating film 103, the third insulating film 105 and the fifth insulating film 107 are stacked in this order.

As shown in the D-D cross-section, the guard ring part P42 is structured such that the gate layer 13g is provided over the substrate 101 and that the gate insulating film 102 is provided over the gate layer 13g. Over the gate insulating film 102, the first insulating film 103, the third insulating film 105, and the fifth insulating film 107 are stacked in this order.

That is, as in the case of the first embodiment, the guard ring part P42 and the terminal part P22 are connected to each other by the metal film 133, and the metal films 134 and 135 and the gate insulating film 102 are spaced by the connection part P32. The following describes a method for manufacturing an imaging panel 1 according to the present embodiment, with a focus on points of difference from the first embodiment.

FIGS. 11A to 11E illustrate cross-sectional views of steps of a terminal part P22, a connection part P32, and a guard ring part P42 that are fabricated through steps of manufacturing an imaging panel according to the present embodiment.

In the present embodiment, after a metal film 133 composed of titanium (Ti), a metal film 134 composed of aluminum (Al), and a metal film 135 composed of molybdenum nitride (MoN) have been stacked in this order over a substrate 101, the metal films 133 to 135 are patterned by a photolithography process and wet etching. After that, a gate insulating film 102 is formed by an already-known method, and an oxide semiconductor layer 130 is formed over the gate insulating film 102 (see FIG. 11A).

Figure 11A:
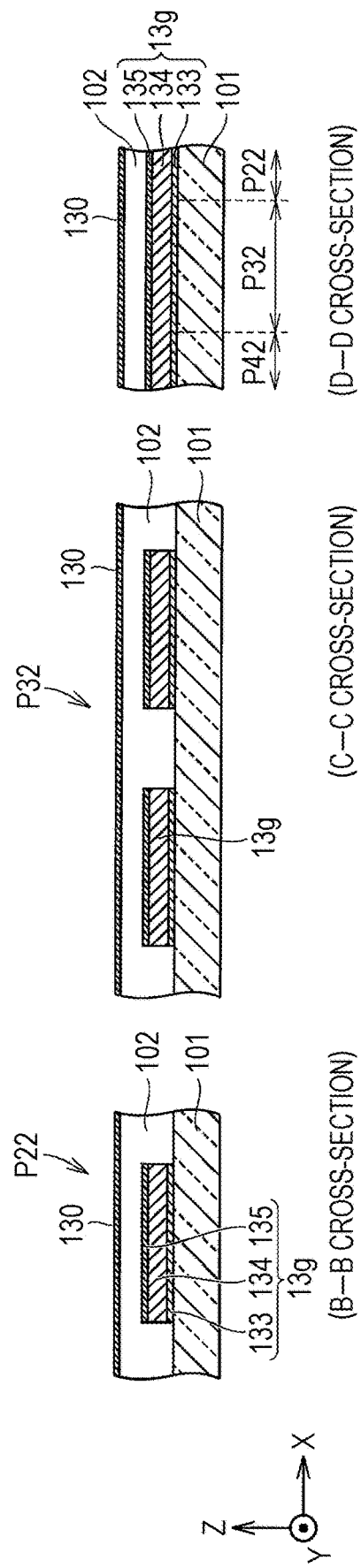
FIG. 11A illustrates diagrams explaining a step of fabricating a pixel part, the terminal part, the connection part, and the guard ring part according to the third embodiment and cross-sectional views showing a state in which a gate electrode and a gate layer, a gate insulating film, and an oxide semiconductor layer have been formed.

As a result, in the terminal part P22, the connection part P32, and the guard ring part P42, as shown in the B-B to D-D cross-sections of FIG. 11A, a gate layer 13g composed of the metal films 133 to 135, the gate insulating film 102, and the oxide semiconductor layer 130 are formed over the substrate 101. At this point in time, although not illustrated, a gate electrode 13a is formed in the pixel part P21, and the gate electrode 13g is integrally provided in the terminal part P22, the connection part P32, and the guard ring part P42.

Next, the oxide semiconductor layer 130 is patterned by a method which is similar to the step of FIG. 5B described above, and after that, the gate insulating film 102 is patterned by a photolithography process and dry etching that involves the use of fluorine gas (see FIG. 11B). As a result, although not illustrated, an oxide semiconductor layer 13b is formed in the pixel part, and in the terminal part P22, as shown in the B-B cross-section of FIG. 11B, an opening 102b is formed in the gate insulating film 102 over the gate layer 13g. Further, in the connection part P32, as shown in the C-C and D-D cross-sections of FIG. 11B, an opening 102c is formed in the gate insulating film 102 over the gate layer 13g.

Then, a laminated film 2301 in which a metal film 234 composed of molybdenum (Mo) and a metal film 235 composed of copper (Cu) are stacked in this order is formed by a method which is similar to the step of FIG. 5C described above (see FIG. 11C), and the laminated film 2301 is patterned by a photolithography process and wet etching (see FIG. 11D). The wet etching of the laminated film 230I involves the use of, for example, a mixed acid liquid.

As a result, although not illustrated, a source electrode 13c and a drain electrode 13d are formed in the pixel part P21. Further, as shown in the B-B cross-section of FIG. 11D, a source layer 23s composed of the metal films 234 and 235 is formed over the gate insulating film 102 in the terminal part P22, and the source layer 23s is connected to the gate layer 13g in the opening 102b.

In the connection part P32, as shown in the C-C and D-D cross-sections of FIG. 11D, the metal films 234 and 235 are removed, and the metal films 134 and 135, which are composed of aluminum (Al) and molybdenum nitride (MoN), respectively, of the gate layer 13g are removed, whereby only the metal layer 133 composed of titanium (Ti) as the lowermost layer remains. As a result, in the connection part P32, an opening H3 formed by an opening 13ga of the metal films 234 and 235 and the opening 102c of the gate insulating film 102 is formed.

Further, since the wet etching of the metal films 234 and 235 is isotropic, ends of the gate layer 13g in the guard ring part P42 and the terminal part P22 are located on the inside of ends of the gate insulating film 102.

After that, steps which are similar to those of FIGS. 5F to 5J described above are executed, and in the step of FIG. 5K, a metal film 140 that is to serve as a lower electrode 14a is patterned (see FIG. 11E). As result, although not illustrated, the lower electrode 14a is formed in the pixel part P1. The metal film 140 is removed from the terminal part P22, the connection part P32, and the guard ring part P42. After that, steps which are similar to those of FIGS. 5L to 5Z described above are executed, whereby the imaging panel according to the present embodiment is fabricated.

Modification 1

Although the terminal part P22 (see FIG. 10) according to the third embodiment described above is structured to include the gate layer 13g, the source layer 23s, and the transparent conductive layer 171, the source layer 23s does not need to be provided.

Figure 12:
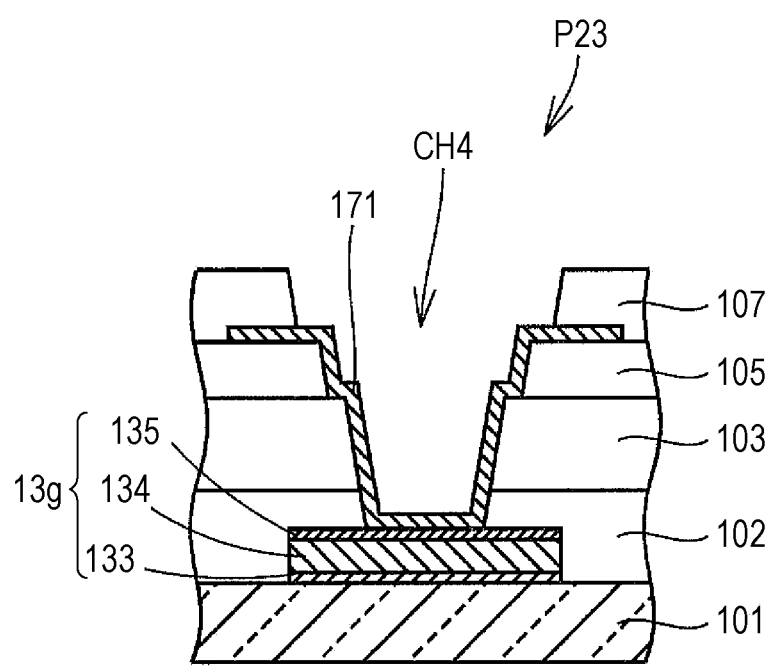
FIG. 12 is a cross-sectional view of a terminal part according to Modification 1 of the third embodiment.

FIG. 12 is a cross-sectional view of a terminal part P23 according to Modification 1. As shown in FIG. 12, the terminal part P23 is connected to the transparent conductive layer 171 via a contact hole CH4 composed of openings of the gate insulating film 102, the first insulating film 103, and the third insulating film 105 formed over the gate layer 13g.

Since the structures of a connection part and a guard ring part according to Modification 1 are similar to those of the third embodiment, FIG. 12 omits to illustrate the structure of each of these parts. Further, although not illustrated here, the structure of a pixel part according to Modification 1 is similar to that of the pixel part of the third embodiment, except for differences in material of a source electrode and a drain electrode. Whereas the source electrode and the drain electrode in the pixel part according to the third embodiment described above have a two-layer structure, the source electrode and the drain electrode in the present modification have a three-layer structure in which titanium (Ti), aluminum (Al), and molybdenum nitride (MoN) are stacked in this order.

The following describes a method for manufacturing an imaging panel 1 according to Modification 1, with a focus on points of difference from the third embodiment.

FIGS. 13A to 13K illustrate cross-sectional views of steps of a pixel part, a terminal part, a connection part, and a guard ring part that are fabricated through steps of manufacturing an imaging panel according to Modification 1.

As shown in the cross-section A-A of FIG. 13A, a gate electrode 130a in which a metal film 133 composed of titanium (Ti), a metal film 134 (composed of aluminum (Al), and a metal film 135 composed of copper (Cu) are stacked and a gate insulating film 102 are formed over a substrate 101 in a pixel part P13 by a method which is similar to that of the third embodiment, and a semiconductor active layer 13b is formed over the gate insulating film 102.

Further, as shown in the B-B, C-C, and D-D cross-sections of FIG. 13A, a gate layer 13g made of the same material as the gate electrode 130a and the gate insulating film 102 are formed over the substrate 101 in a terminal part P23, a connection part P33, and a guard ring part P43. After that, a laminated film 230 in which a metal film 231 composed of titanium (Ti), a metal film 232 composed of aluminum (Al), and a metal film 233 composed of molybdenum nitride (MoN) are stacked in this order is formed by a step which is similar to that of FIG. 5C described above.

Figure 13B:
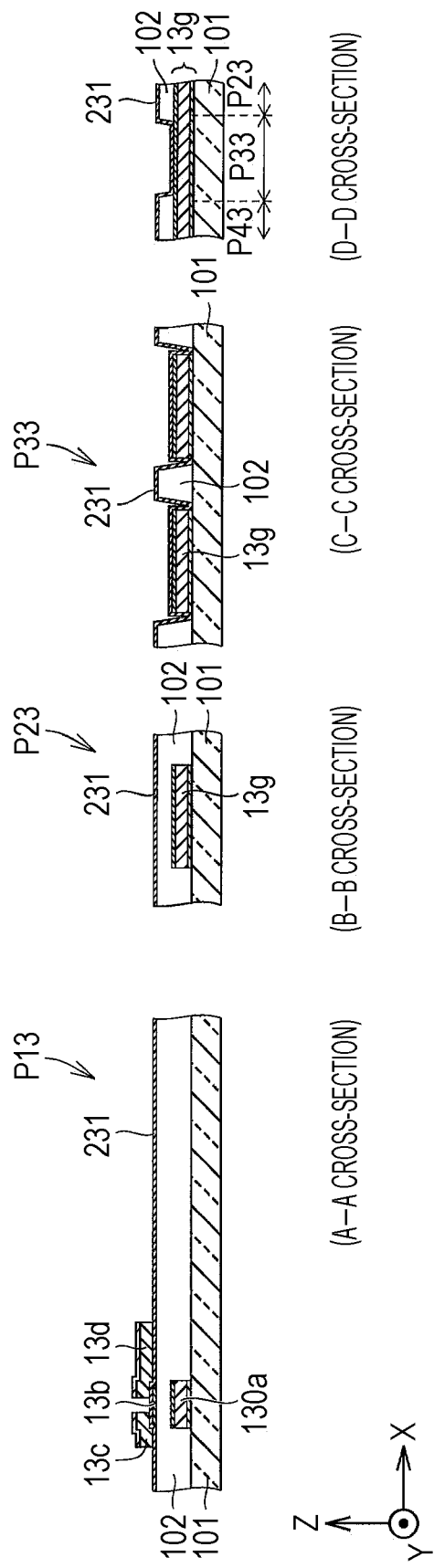
FIG. 13B illustrates cross-sectional views showing a state in which the laminated film shown in FIG. 13A has been patterned.
Figure 13D:
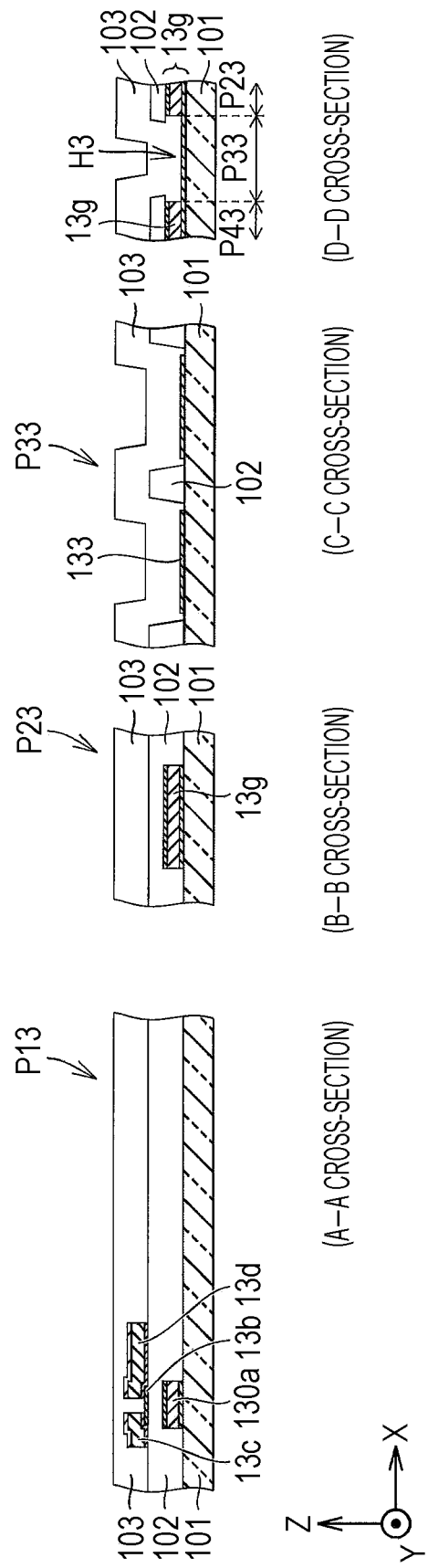
FIG. 13D illustrates cross-sectional views showing a state in which a first insulating film has been formed.
Figure 13F:
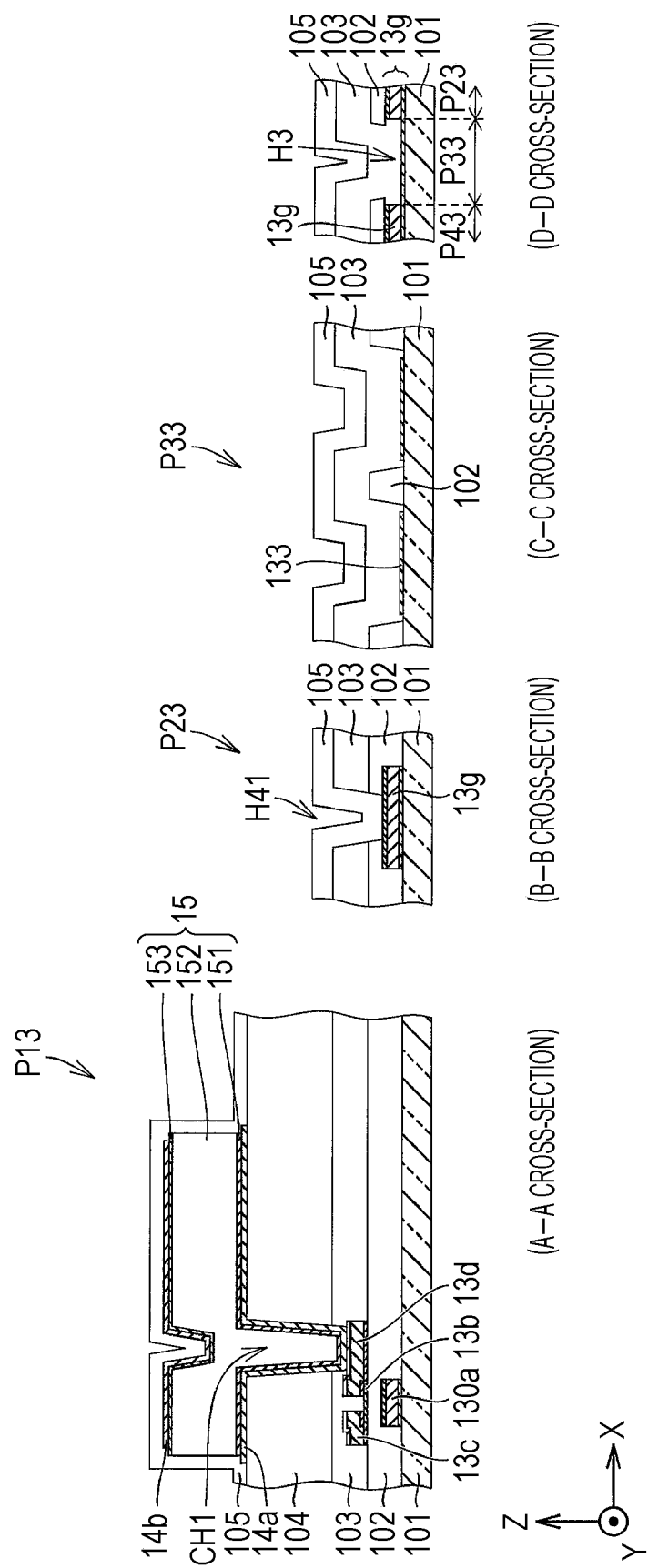
FIG. 13F illustrates cross-sectional views showing a state in which a third insulating film has been formed.

Then, the laminated film 230 is patterned by a photolithography process and etching (see FIG. 13B). This etching is wet etching that involves the use of an etchant containing acetic acid, nitric acid, and phosphoric acid.

As a result, in the pixel part P13, the metal films 232 and 233, which are not covered with a resist, are etched over the gate insulating film 102, whereby a source electrode 13c and a drain electrode 13d are formed, and the metal film 231 remains. Further, in the terminal part P23, the connection part P33, and the guard ring part P43, the metal films 232 and 233, which are not covered with a resist, are removed, and the metal film 231 remains.

Then, the metal film 231 is etched by dry etching with chlorine gas. After that, in the connection part P33, the gate layer 13g is subjected to wet etching with an etchant containing acetic acid, nitric acid, and phosphoric acid (see FIG. 13C).

As a result of the dry etching, the metal film 231 is removed from the pixel part P13, excluding a region in which the source electrode 13c and the drain electrode 13d are provided, and the metal film 231 is removed from the terminal part P23, the connection part P33, and the guard ring part P43. Further, as shown in the D-D cross-section, as a result of the wet etching, the metal films 135 and 134, which are composed of copper (Cu) and aluminum (Al), respectively, of the gate layer 13g not covered with the gate insulating film 102 are removed from the connection part P33, whereby an opening 13ga is formed in the metal films 134 and 135 over the metal film 133 composed of titanium (Ti).

Next, the first insulating film 103 is formed by a method which is similar to the step of FIG. 5F described above (see FIG. 13D), and the first insulating film 103 is patterned by a method which is similar to the step of FIG. 5G described above (see FIG. 13E). As a result, in the pixel part P13, an opening 103a is formed in the first insulating film 103 over the drain electrode 13d, and in the terminal part P23, an opening 41 bored through the gate insulating film 102 and the first insulating film 103 is formed over the gate layer 13g.

Figure 13G:
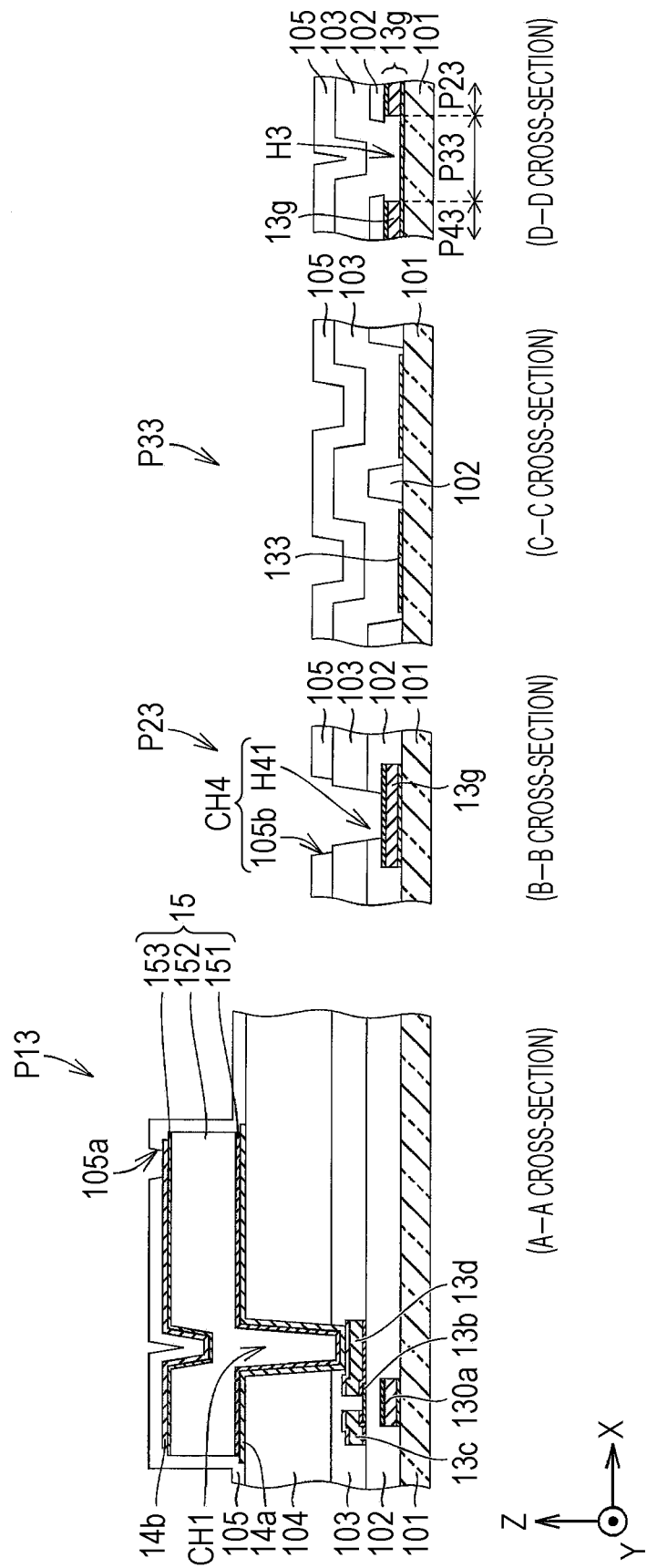
FIG. 13G illustrates cross-sectional views showing a state in which the third insulating film shown in FIG. 13F has been patterned.
Figure 13H:
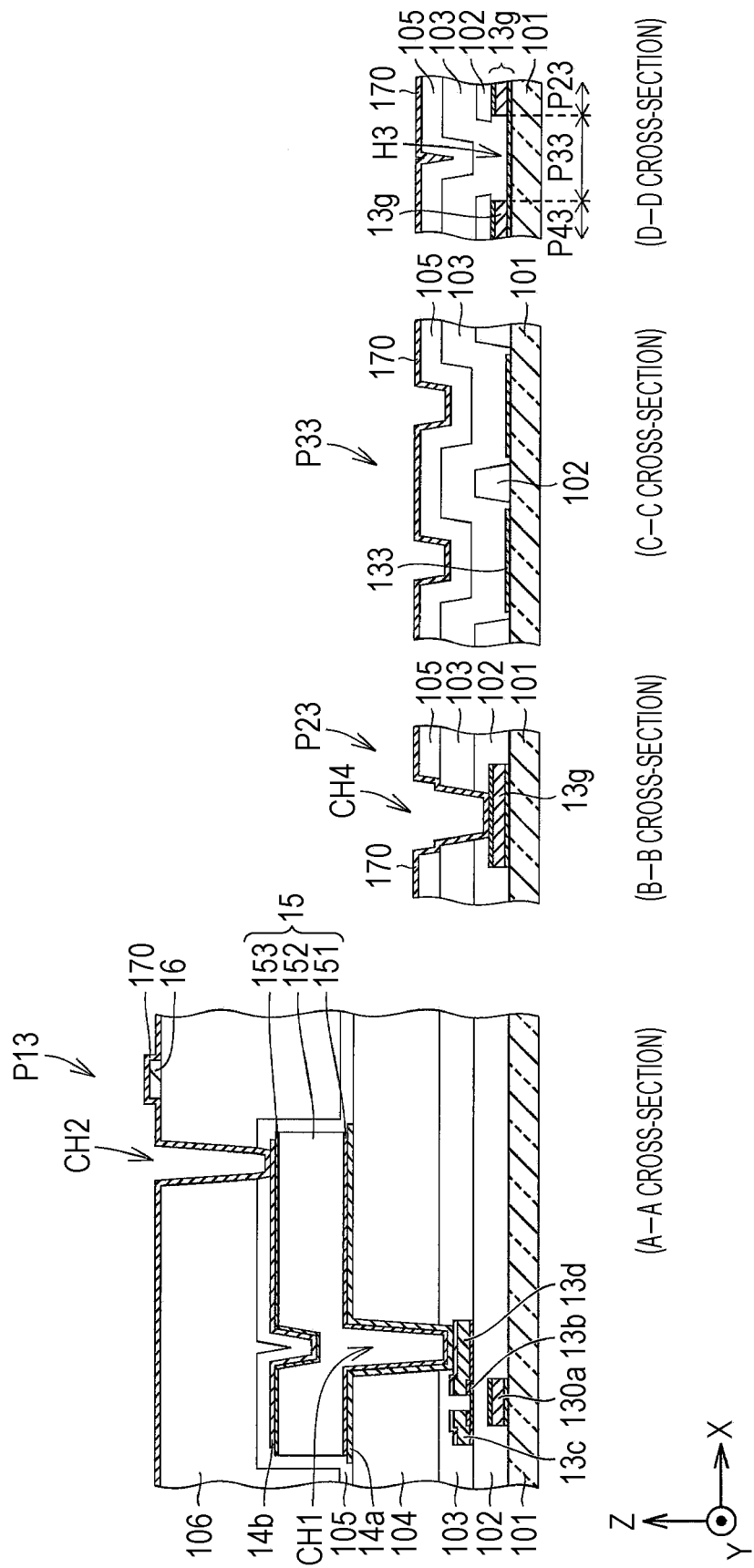
FIG. 13H illustrates cross-sectional views showing a state in which a transparent conductive film has been formed.

Then, after execution of steps which are similar to those of FIGS. 5H to 5N described above, a third insulating film 103 is formed by a method which is similar to the step of FIG. 5O (see FIG. 13F), and the third insulating film 103 is patterned by a method which is similar to the step of FIG. 5P (see FIG. 13G). As a result, in the pixel part P13, an opening 105a is formed in the third insulating film 105 over an upper electrode 14b. Further, in the terminal part P23, an opening 105b is formed in a position in the third insulating film 105 that overlaps an opening H41. As a result, a contact hole CH4 composed of the opening 41 and the opening 105b is formed.

Figure 13I:
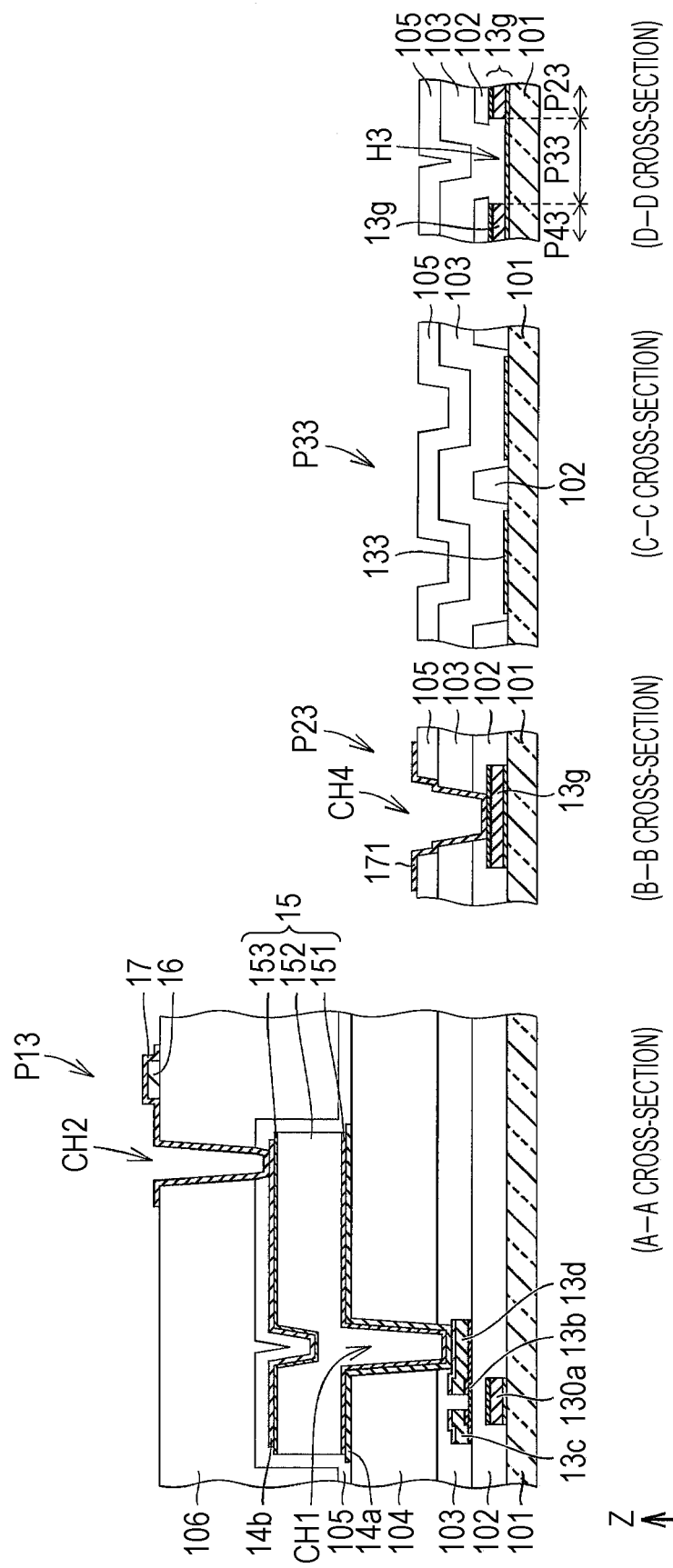
FIG. 13I illustrates cross-sectional views showing a state in which the transparent conductive film shown in FIG. 13H has been patterned.
Figure 13K:
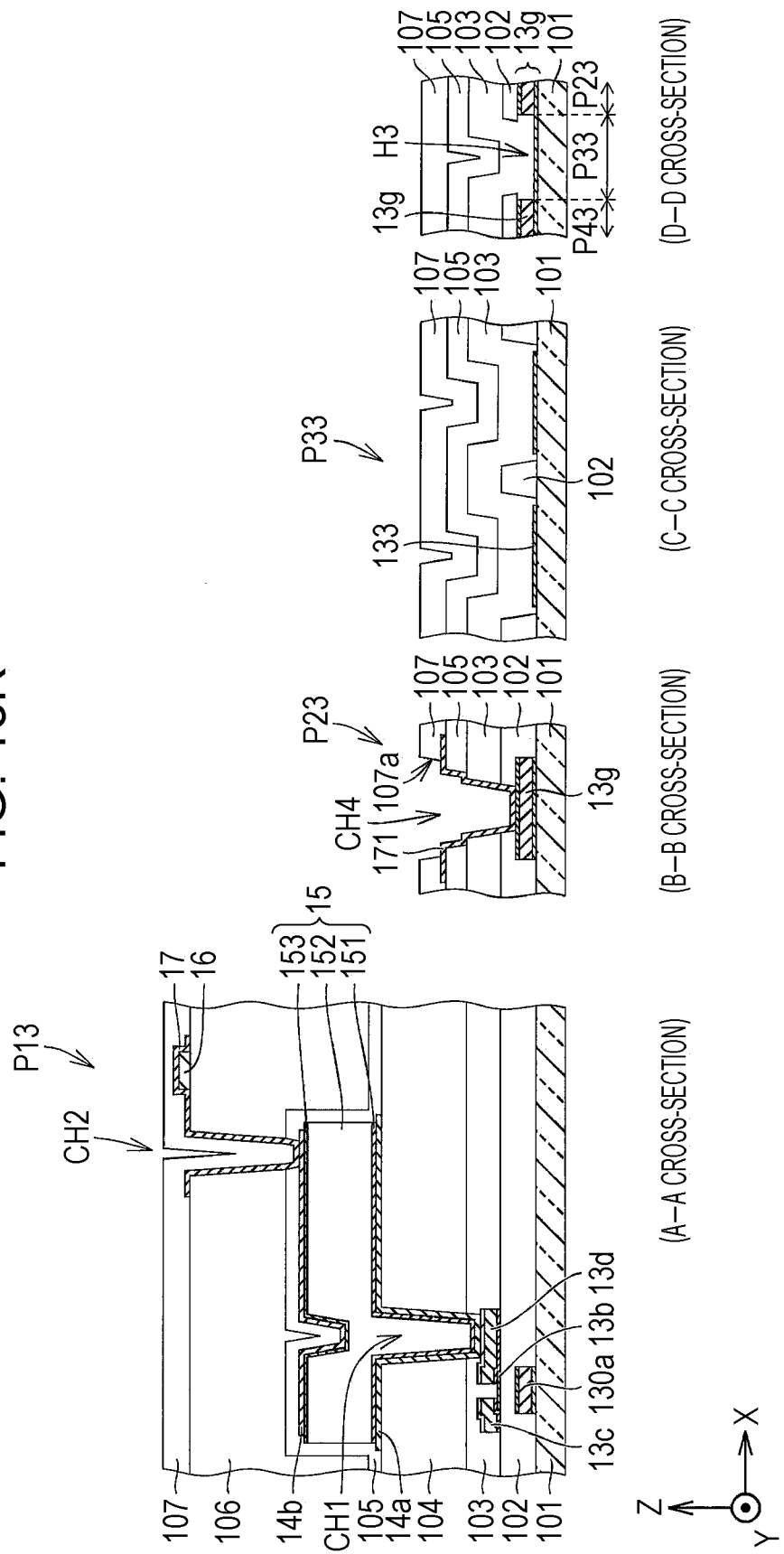
FIG. 13K illustrates cross-sectional views showing a state in which the fifth insulating film shown in FIG. 13J has been patterned.

Next, after execution of steps which are similar to those of FIGS. 5Q to 5T described above, a transparent conductive film 170 is formed by a method which is similar to the step of FIG. 5U (see FIG. 13H), and the transparent conductive film 170 is patterned by a method which is similar to the step of FIG. 5V (see FIG. 13I). As a result, in the pixel part P13, a transparent conductive film 17 connected to the upper electrode 14b and a bias wire 16 is formed. Further, in the terminal part P23, a transparent conductive layer 171 connected to the gate layer 13g via the contact hole CH4 is formed. The transparent conductive film 170 is removed from the connection part P33 and the guard ring part P43.

Then, a fifth insulating film 107 is formed by a method which is similar to the step of FIG. 5W described above (see FIG. 13J), and the fifth insulating film 107 is patterned by a method which is similar to the step of FIG. 5X described above (see FIG. 13K). As a result, in the terminal part P23, an opening 107a is formed in the fifth insulating film 107 over the contact hole CH4.

After that, steps which are similar to those of FIGS. 5Y and 5Z described above are executed, whereby the imaging panel according to Modification 1 is formed.

Modification 2

Although Modification 1 described above has illustrated an example in which the source layer has a structure in which titanium (Ti), aluminum (Al), and molybdenum nitride (MoN) are stacked in this order, the source layer is not limited to these materials.

For example, the source layer may be structured such that molybdenum nitride (MoN), aluminum (Al), and molybdenum nitride (MoN) are stacked in this order. In this case, the patterning of the laminated film 230 in the step of FIG. 13B involves the use of an etchant containing acetic acid, nitric acid, and phosphoric acid. As a result, the laminated film 230, which is not covered with a resist, is removed, and furthermore, in the connection part P33, the metal films 134 and 135 of the gate layer 13g not covered with the gate insulating film 102 are simultaneously etched, whereby the metal film 133 remains (see FIG. 13C). In this case, the number of etching steps can be made smaller than in Modification 1, as the source layer and the metal films 134 and 135, which are composed of aluminum (Al) and copper (Cu), respectively, of the gate layer are simultaneously etched.

Modification 3

Although, in the third embodiment and Modification 1 described above, the metal films 135 and 134 of the gate layer 13g in the connection part P33 are etched in patterning the source layer in the step of FIG. 11D, the step of patterning the transparent conductive film (step of FIG. 5V) may be executed.

In this case, in patterning the gate insulating film 102 and the first insulating film 103 in the steps of FIGS. 11B and 11E described above, respectively, the gate insulating film 102 and the first insulating film 103 are not etched in the connection part P33. After that, steps which are similar to those of FIGS. 5L to 5P are executed, but the third insulating film 105 is not etched in the connection part P33 in patterning the third insulating film 105 in the step of FIG. 5P. After that, after execution of the steps of FIGS. 5Q to 5T and execution of the patterning by which to form the bias wire 16 and before formation of the transparent conductive film 170 in the step of FIG. 5U, the gate insulating film 102, the first insulating film 103, and the third insulating film 105 are simultaneously subjected to dry etching with fluorine gas in the connection part P3. As a result, openings are formed in the gate insulating film 102, the first insulating film 103, and the third insulating film 105. Then, the step of FIG. 5U is executed, and in the step of FIG. 5V, the transparent conductive film 170 is subjected to wet etching with an etchant containing oxalic acid, acetic acid, nitric acid, and phosphoric acid. As a result, the transparent conductive film 170 is removed from the connection part P3, whereby the metal films 134 and 135, which are composed of aluminum (Al) and copper (Cu), respectively, of the gate layer 13g are removed from the connection part P3.

Fourth Embodiment

While the third embodiment described above has described a source layer having a two-layer structure in which molybdenum (Mo) and copper (Cu) are stacked, the present embodiment describes a case where a source layer has a three-layer structure. The following mainly describes points of difference from the third embodiment.

FIG. 14 illustrates cross-sectional views of a terminal part P24, a connection part P34, and a guard ring part P44 according to the present embodiment. Although FIG. 14 omits to illustrate a pixel part, the structure of the pixel part of the present embodiment is the same as that of the pixel part of the third embodiment, except for differences in material of a source electrode and a drain electrode.

As shown in the B-B cross-section of FIG. 14, the terminal part P24 has a source layer 33s constituted by stacking a metal film 331 composed of titanium (Ti), a metal film 332 composed of aluminum (Al) or copper (Cu), and a metal film 333 composed of titanium (Ti).

Further, in the connection part P34 and the guard ring part P44, as shown in the C-C and D-D cross-sections of FIG. 14, the first insulating film 103 is provided over the gate insulating film 102.

In this case, first, steps which are similar to those of FIGS. 11A and 11B of the third embodiment described above are executed. In the present embodiment, by patterning the gate insulating film 102 in the step of FIG. 11B, an opening 102b is formed in the gate insulating film 102 over the gate layer 13g in the terminal part P24 as shown in the B-B cross-section of FIG. 15A.

Next, a laminated film 330 in which the metal film 331 composed of titanium (Ti), the metal film 332 composed of aluminum (Al), and the metal film 333 composed of titanium (Ti) are stacked in this order is formed over the gate insulating film 102, for example, by a sputtering method (see FIG. 15B).

Figure 15A:
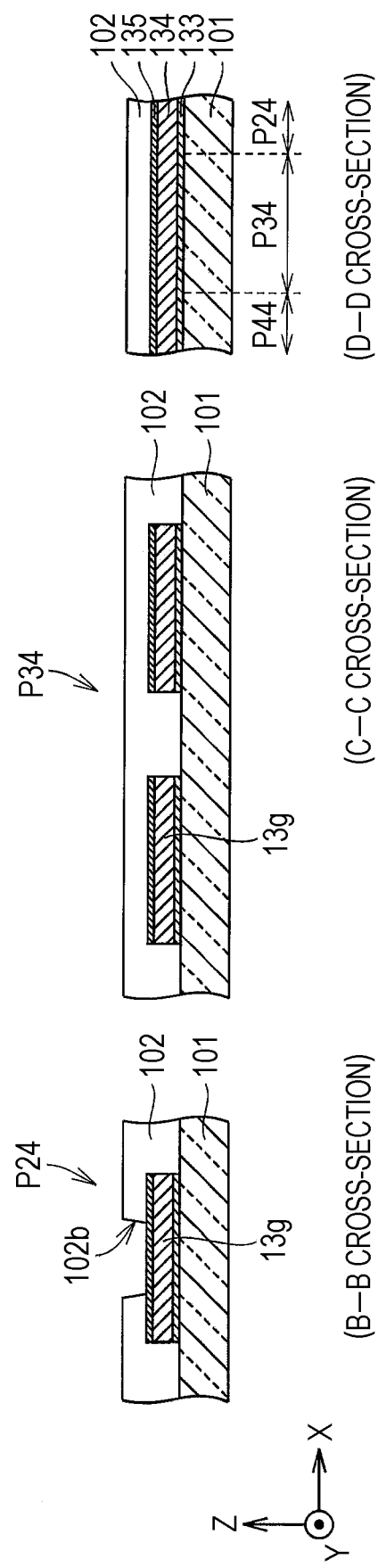
FIG. 15A are diagrams explaining a step of fabricating the terminal part, the connection part, and the guard ring part according to the fourth embodiment and cross-sectional views showing a state in which a gate insulating film has been patterned.
Figure 15C:
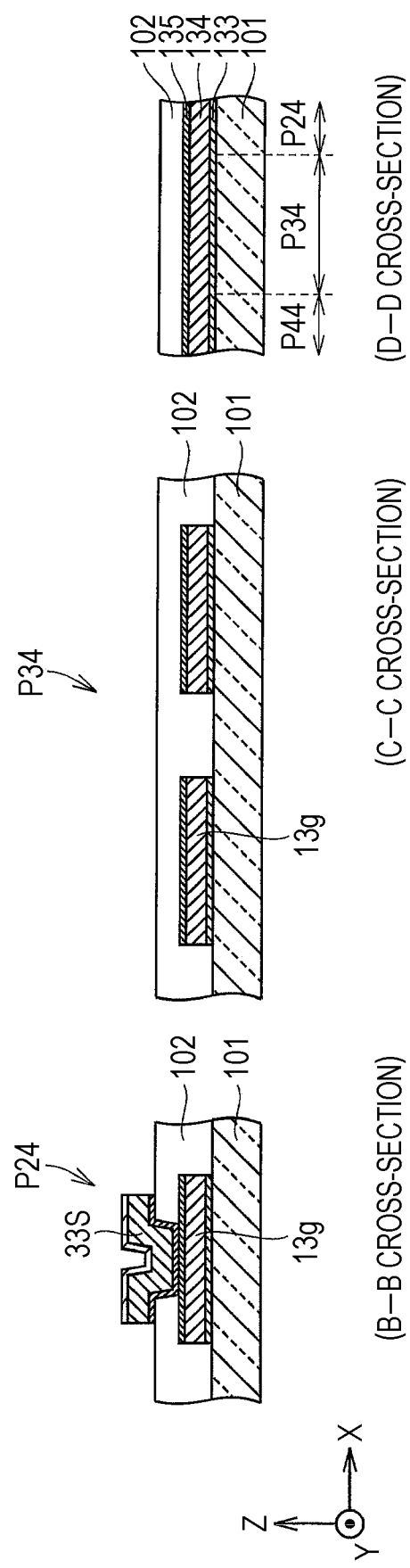
FIG. 15C illustrates cross-sectional views showing a state in which the laminated film shown in FIG. 15B has been patterned.

After that, the laminated film 330 is patterned by a photolithography process and dry etching (see FIG. 15C). This dry etching involves the use of chlorine gas. As a result, a source electrode 13c and a drain electrode 13d are formed in a pixel part P14. In the terminal part P24, the source layer 33s composed of the metal films 331 to 333 is formed over the gate layer 13g. The laminate film 330 is removed from the connection part P34 and the guard ring part P44.

Next, the first insulating film 103 is formed by a method which is similar to the step of FIG. 5F described above (see FIG. 15D), and the first insulating film 103 is patterned by a method which is similar to the step of FIG. 5G (see FIG.

15E). As a result, in the terminal part P14, an opening 103*a* is formed in the first insulating film 103 over the drain electrode 13*d*. Further, in the terminal part P24, an opening 103*b* is formed in the first insulating film 103 over the source layer 33*s*. Further, in the connection part P34, an opening H4 bored through the first insulating film 103 and the gate insulating film 102 is formed.

Then, steps which are similar to those of FIGS. 5H to 5J described above are executed. As a result, in the terminal part P14, a metal film 140 that is to serve as a lower electrode 14*a* is formed over the second insulating film 104 (see FIG. 15F). Further, in the connection part P24 and the guard ring part P44, the metal film 140 is formed over the first insulating film 103.

Figure 15G:
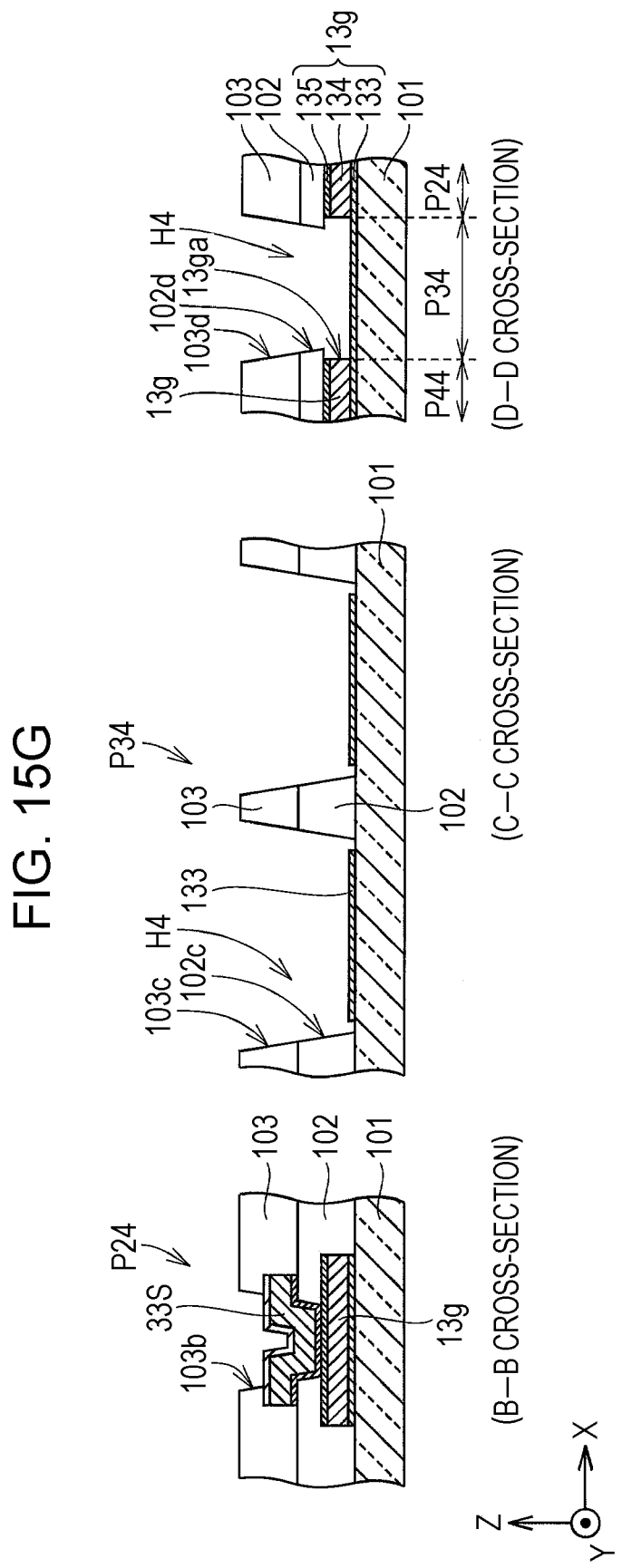
FIG. 15G illustrates cross-sectional views showing a state in which the metal film, shown in FIG. 15F, that is to serve as the lower electrode has been patterned.

After that, the metal film 140 is patterned by a method which is similar to the step of FIG. 5K (see FIG. 15G). As a result, in the terminal part P14, the lower electrode 14*a* connected to the drain electrode is formed over the second insulating film 104, and the metal film 140 is removed from the terminal part P24. Further, in the connection part P34, the metal films 135 and 134, which are composed of molybdenum nitride (MoN) and aluminum (Al), respectively, of the gate layer 13*g* are removed, whereby only the metal film 133 composed of titanium (Ti) remains. As a result, in the connection part P34, an opening 13*ga* is formed in the metal films 134 and 135 over the metal film 131.

After that, steps which are similar to those of FIGS. 5L and 5Z described above are executed, whereby an imaging panel according to the present embodiment is formed.

Modification 1

Although, in the fourth embodiment described above, the metal film 140 is removed from the terminal part P24 in patterning the metal film 140 in the step of FIG. 15G, a lower electrode layer 140 composed of the metal film 140 may be formed as in the case of the first embodiment. In this case, in the terminal part P14, the gate layer 13*g*, the source layer 33*s*, the lower electrode layer 141, and the transparent conductive layer 171 disposed to overlap one another in this order in the contact hole CH3 (see FIG. 13).

Modification 2

Although, in the fourth embodiment described above, the source layer 33*s* connected to the gate layer 13*g* is formed in the terminal part 24 in patterning the laminated film 330 in the step of FIG. 15C, the source layer 33*s* does not need to be formed in the terminal part P24. That is, the terminal part P24 may be similar in structure to the terminal part P23 (see, for example, FIG. 12) according to Modification 1 of the third embodiment described above.

In this case, the step of FIG. 15A is not executed. That is, the gate insulating film 102 is not patterned, and the in the terminal part P24, the opening 102*b* of the gate insulating film 102 is not formed. After that, the step of FIG. 15B is executed, and the laminated film 330 is removed from the terminal part P24 in executing the step of FIG. 15C. Then, after execution of the step of FIG. 15D, an opening bored through the first insulating film 103 and the gate insulating film 102 in the terminal part P24 is formed in patterning the first insulating film 103 in the step of FIG. 15E. After that, steps which are similar to FIGS. 15F and 15G and FIGS. 5L to 5Z described above are executed.

Modification 3

Although, in the fourth embodiment described above, the metal films 133 and 134 of the gate layer 13*g* in the connection part P34 are etched in forming the lower electrode 14*a* in the pixel part P14 by patterning the metal film 140 in the step of FIG. 15G, the metal films 133 and 134 may be etched in forming the bias wire 16 in the pixel part P14.

In this case, after execution of the steps of FIGS. 15A to 15D described above, the first insulating film 103 is not patterned in the connection part P34 in patterning the first insulating film 103 in the step of FIG. 15E. Then, after execution of the step of FIG. 15F, the metal film 140 is removed from the terminal part P24 in patterning the metal film 140 in the step of FIG. 15G. At this point in time, the gate layer 13*g* is covered with the first insulating film 103 and the gate insulating film 102 in the connection part P24.

After that, after the steps of FIGS. 5L to 5O, the gate insulating film 102, the first insulating film 103, and the third insulating film 105 are etched in the connection part P34 in patterning the third insulating film 105 in the step of FIG. 5P. This etching is dry etching that involves the use of fluorine gas. As a result, in the connection part P34, an opening bored through the gate insulating film 102, the first insulating film 103, and the third insulating film 105 is formed.

After that, steps which are similar to those of FIGS. 5Q to 5Z are executed, but the metal film 160 and the metal films 134 and 135 of the gate layer 13*g* are removed from the connection part P34 in patterning the metal film 160, which is to serve as the bias wire 16, in the step of FIG. 5T, whereby only the metal film 133 is left. This causes the connection part P34 to be structured to include the metal film 133 and the fifth insulating film 107 disposed over the metal film 133.

Modification 4

Although, in Modification 3 described above, the source layer 33*s* is disposed to overlap the gate layer 13*g* in the terminal part P24, the source layer 33*s* may be replaced by a lower electrode layer made of the same material as the lower electrode 14*a* or a bias wire layer made of the same material as the bias wire 16. The following describes steps of manufacturing in a case where a lower electrode layer is disposed and a case where a bias wire layer is disposed, with a focus on points of difference from Modification 3.

(1) Case Where Lower Electrode Layer is Disposed in Terminal Part P24

In this case, the laminated film 330 is removed from the terminal part P24 in patterning the laminated film 330 in the step of FIG. 15C. Then, in patterning the first insulating film 103 in the step of FIG. 15E, the first insulating film 103 and the gate insulating film 102 are simultaneously etched in the terminal part P24, whereby an opening bored through the first insulating film 103 and the gate insulating film 102 is formed.

After that, the metal film 140 that is to serve as the lower electrode 14*a* is formed in the step of FIG. 15F, and the metal film 140 is patterned in the step of FIG. 15G. At this point in time, in the opening of the first insulating film 103 and the gate insulating film 102 in the terminal part P24, a lower electrode layer connected to the gate layer 13*g* needs only be formed over the first insulating film 103.

(2) Case Where Bias Wire Layer Is Disposed in Terminal Part P24

In this case, as in the case (1) described above, the laminated film 330 is removed from the terminal part P24 in patterning the laminated film 330 in the step of FIG. 15C. Then, in patterning the first insulating film 103 in the step of FIG. 15E, the first insulating film 103 and the gate insulating film 102 are simultaneously etched in the terminal part P24, whereby an opening bored through the first insulating film 103 and the gate insulating film 102 is formed.

After that, the metal film 160 that is to serve as the bias wire 16 is formed by steps which are similar to those of FIGS. 15F, 15G, and 5L to 5S. Then, in patterning the metal film 160 in the step of FIG. 5T, a bias wire layer connected to the gate layer 13g via openings of the first insulating film 103 and the gate insulating film 102 needs only be formed over the third insulating film 105 in the terminal part P24.

Although the foregoing has described embodiments of the present invention, the aforementioned embodiments are merely illustrations for carrying out the present invention. Therefore, the present invention is not limited to the aforementioned embodiments but may be carried out in appropriate modifications of the aforementioned embodiments without departing from the scope of the invention.

[Other Examples of Application]

(1) Although the aforementioned embodiments and modifications have given a description with reference to an imaging panel as an example of application of an active matrix substrate, the active matrix substrate is applicable to a liquid crystal display, an organic EL (electroluminescence) display, a MEMS (microelectromechanical system) display, a touch panel, a 3D (dimensional) liquid crystal display, a liquid crystal temperature sensor, an optical-sensor-containing display, and the like.

(2) Although the aforementioned embodiments and modifications have taken titanium (Ti) as an example of a metal layer in a connection part, the metal layer may be tungsten (W), tantalum (Ta), or an alloy containing titanium (Ti), tungsten (W), tantalum (Ta), and the like.

REFERENCE SIGNS LIST

1 Imaging panel
1A Scintillator
2 Control unit
2A Gate control unit
2B Signal readout unit
3 X-ray source
10 Source wire
11 Gate wire
12 Photodiode
13 Thin-film transistor (TFT)
13a Gate electrode
13b Semiconductor active layer
13c Source electrode
13d Drain electrode
13g Gate layer
13s, 23s, 33s Source layer
14a Lower electrode
14b Upper electrode
15 Photoelectric conversion layer
16 Bias wire
100 X-ray imaging apparatus
101 Substrate
102 Gate insulating film
103 First insulating film
104 Second insulating film
105 Third insulating film
106 Fourth insulating film
107 Fifth insulating film
108 Sixth insulating film
151 N-type amorphous semiconductor layer
152 Intrinsic amorphous semiconductor layer
153 P-type amorphous semiconductor layer
P1, P13, P14 Pixel part
P2, P21 to P24 Terminal part
P3, P31 to P34 Connection part
P4, P41 to P44 Guard ring part

The invention claimed is:

1. An active matrix substrate having a pixel region, the active matrix substrate comprising:
   a terminal part connected to the pixel region;
   a guard ring provided around the terminal part; and
   a connection part that connect the terminal part and the guard ring to each other,
   wherein the pixel region, the terminal part, and the guard ring each include
      a first conductive layer in which at least a first metal film and a second metal film that is lower in resistance than the first metal film are stacked,
      a first protective layer disposed to overlap at least a part of the first conductive layer, and
      a second protective layer disposed over the first protective layer,
   the pixel region further includes a second conductive layer provided at a higher level than the first protective layer,
   the connection part includes
      the first metal film, and
      the second protective layer disposed over the first metal film,
   ends of the first conductive layer in the terminal part and the guard ring that face the connection part are located on an inside of ends of the first protective layer that face the connection part, and
   the second conductive layer and the second metal film contain materials that are etchable with an identical etchant.

2. The active matrix substrate according to claim 1, wherein the terminal part further includes the second conductive layer connected to the first conductive layer.

3. The active matrix substrate according to claim 1, wherein the pixel region and the terminal part further include a third conductive layer over the first conductive layer,
   the third conductive layer is disposed to overlap the first conductive layer in the terminal part, and
   the third conductive layer contains a material that is lower in etching rate than the second conductive layer with respect to the etchant.

* * * * *